United States Patent
Suzuki

(10) Patent No.: US 9,082,497 B2
(45) Date of Patent: Jul. 14, 2015

(54) MAGNETIC MEMORY USING SPIN ORBIT INTERACTION

(75) Inventor: Tetsuhiro Suzuki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 4 days.

(21) Appl. No.: 14/006,008

(22) PCT Filed: Oct. 14, 2011

(86) PCT No.: PCT/JP2011/073647
§ 371 (c)(1),
(2), (4) Date: Sep. 18, 2013

(87) PCT Pub. No.: WO2012/127722
PCT Pub. Date: Sep. 27, 2012

(65) Prior Publication Data
US 2014/0010004 A1    Jan. 9, 2014

(30) Foreign Application Priority Data

Mar. 22, 2011 (JP) ................................ 2011-061930
Mar. 22, 2011 (JP) ................................ 2011-061939
Mar. 30, 2011 (JP) ................................ 2011-076361

(51) Int. Cl.
*G11C 11/16* (2006.01)
*H01L 27/22* (2006.01)
(Continued)

(52) U.S. Cl.
CPC .......... *G11C 11/1675* (2013.01); *G11C 11/161* (2013.01); *H01L 27/228* (2013.01); *H01L 43/02* (2013.01); *H01L 43/08* (2013.01)

(58) Field of Classification Search
CPC .................................................. G11C 11/1675
USPC .......................................................... 365/158
See application file for complete search history.

(56) References Cited

U.S. PATENT DOCUMENTS 8,542,527 B2 * 9/2013 Shin ............................... 365/173
2004/0246775 A1 * 12/2004 Covington .................... 365/173
(Continued)

FOREIGN PATENT DOCUMENTS

CN    103380462 A    11/2013
CN    103392245 A    11/2013
(Continued)

OTHER PUBLICATIONS

Japanese Office Action issued Dec. 11, 2013 in corresponding Japanese Patent Application No. 2013-505771.
(Continued)

*Primary Examiner* — Hoai V Ho
(74) *Attorney, Agent, or Firm* — Sughrue Mion, PLLC

(57) ABSTRACT

A magnetic memory includes: a base layer; a magnetization free layer; a barrier layer; and a magnetization reference layer. The magnetization free layer, with which the base layer is covered, has invertible magnetization and is magnetized approximately uniformly. The barrier layer, with which the magnetization free layer is covered, is composed of material different from material of the base layer. The magnetization reference layer is arranged on the barrier layer and has a fixed magnetization. When the magnetization of the magnetization free layer is inverted, a first writing current is made to flow from one end to the other end of the magnetization free layer in an in-plane direction without through the magnetization reference layer.

14 Claims, 53 Drawing Sheets

(51) Int. Cl.
*H01L 43/08* (2006.01)
*H01L 43/02* (2006.01)

(56) References Cited

U.S. PATENT DOCUMENTS

| | | |
|---|---|---|
| 2005/0190594 A1 | 9/2005 | Nakamura et al. |
| 2006/0067116 A1 | 3/2006 | Hayakawa et al. |
| 2007/0059877 A1 | 3/2007 | Koo et al. |
| 2008/0169492 A1 | 7/2008 | Koo et al. |
| 2010/0271866 A1* | 10/2010 | Sakimura et al. ............ 365/158 |
| 2011/0045318 A1 | 2/2011 | Lee et al. |
| 2011/0064969 A1* | 3/2011 | Chen et al. .................. 428/800 |
| 2012/0018822 A1 | 1/2012 | Gaudin et al. |
| 2012/0098077 A1 | 4/2012 | Gaudin et al. |
| 2012/0155153 A1* | 6/2012 | Shukh .......................... 365/158 |

FOREIGN PATENT DOCUMENTS

| | | |
|---|---|---|
| JP | 10-4227 A | 1/1998 |
| JP | 2004-006774 A | 1/2004 |
| JP | 2006-093578 A | 4/2006 |
| JP | 2007-081359 A | 3/2007 |
| JP | 3888463 B2 | 3/2007 |
| JP | 2008-166689 A | 7/2008 |
| JP | 2008192711 A * | 8/2008 |
| JP | 2009-099625 A | 5/2009 |
| JP | 2009-239135 A | 10/2009 |
| JP | 2011-044693 A | 3/2011 |
| JP | 2013-533636 A | 8/2013 |
| JP | 2013-541219 A | 11/2013 |
| WO | 2007/111319 A1 | 10/2007 |
| WO | 2009/110530 A1 | 9/2009 |

OTHER PUBLICATIONS

International Preliminary Report on Patentability issued Sep. 24, 2013 in PCT/JP2011/073647.
Katsunori Obata et. al., "Current-induced domain wall motion in Rashba spin-obit system", Physical Review B, 2008, vol. 77, pp. 214429-1-214429-12.
Ioan Mihai Miron et.al., "Current-driven spin torque induced by the Rashba effect in a ferromagnetic metal layer", Nature Materials, Mar. 2010, vol. 9, pp. 230-234.
International Search Report of PCT/JP2011/073647 dated Dec. 13, 2011.
Communication dated Mar. 10, 2015, issued by the State Intellectual Property Office of the People's Republic of China in corresponding Chinese Application No. 201180069469.5.

* cited by examiner

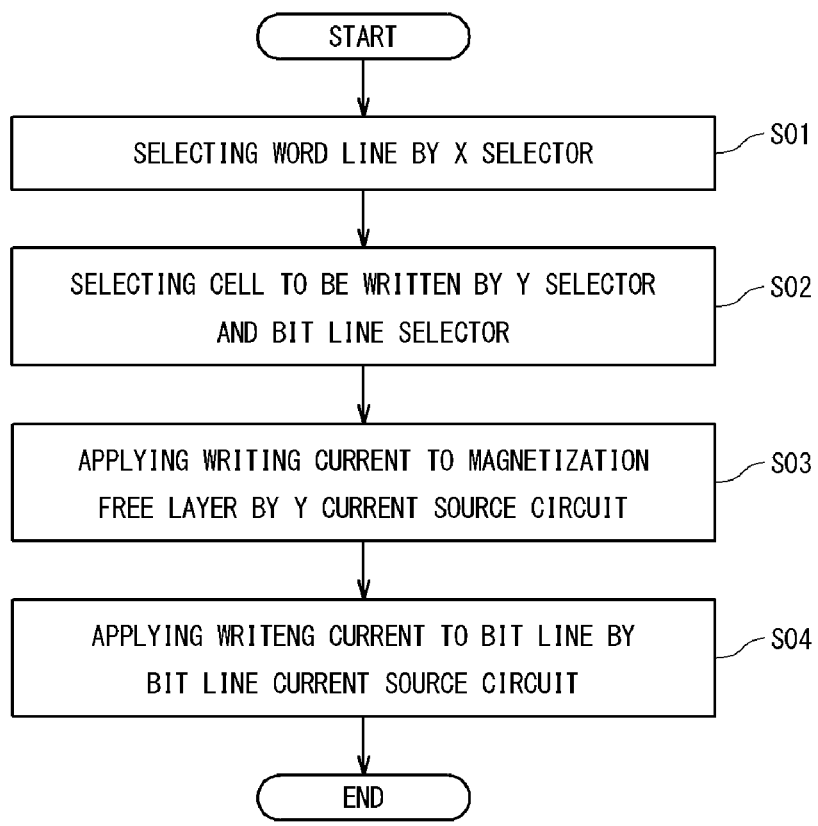

US 9,082,497 B2

MAGNETIC MEMORY USING SPIN ORBIT INTERACTION

CROSS REFERNCE TO RELATED APPLICATION

This is a National Stage of International Application No. PCT/JP2011/073647 filed Oct. 14, 2011, claiming priority based on Japanese Patent Application Nos. 2011-061930 filed Mar. 22, 2011, 2011-061939 filed Mar. 22, 2011 and 2011-076361 filed Mar. 30, 2011, the contents of all of which are incorporated herein by reference in their entirety.

TECHNICAL FIELD

The present invention relates to a magnetic memory and more particularly a magnetic memory using spin orbit interaction.

BACKGROUND ART

Research and development for a magnetic memory using a magnetic tunnel junction (a MTJ) has been actively performed. The magnetic memory has excellent characteristics such as high-speed writing, the infinite number of times of rewriting, and nonvolatility. Therefore, the magnetic memory is expected to be used not only for a monolithic memory but also for an embedded memory of a microcomputer and so on. As the magnetic memory, a magnetic random access memory (a MRAM) is exemplified.

As a typical memory cell of a MRAM, a magnetic tunnel junction (a MTJ) which can control a magnetic response is disclosed in Japanese patent publication JP-Heisei 10-4227 A (Patent literature 1: corresponding to U.S. Pat. No. 5,650, 958). This s magnetic tunnel junction includes a first electrode, a second electrode, and an insulating tunnel layer. The first electrode includes a substrate, a pinning ferromagnetic layer (a magnetization reference layer) and an anti-ferromagnetic layer. The pinning ferromagnetic layer is formed on the substrate and flat. The anti-ferromagnetic layer is adjacently contacted to the pinning ferromagnetic layer, pins a magnetization direction of the pinning ferromagnetic layer in a preferable direction and prevents the magnetization direction from rotating under the existence of an applied magnetic field. The second electrode includes a flat free ferromagnetic layer (a magnetization free layer) whose magnetization direction can rotate freely under the existence of an applied magnetic field. The insulating tunnel layer (a barrier layer) is arranged between the pinning ferromagnetic layer and the free ferromagnetic layer and allows a tunnel current in a direction perpendicular to the pinning ferromagnetic layer and the free ferromagnetic layer. The insulating tunnel layer has a side portion circumference such that the pinning ferromagnetic layer or the free ferromagnetic layer does not extend beyond the side portion circumference. The pinning ferromagnetic layer and the free ferromagnetic layer do not overlap with the insulating tunnel layer and are kept in respective planes which have an interval therebetween.

This memory cell stores one-bit data as a direction of spontaneous magnetization of the magnetization free layer. For example, a state that the direction of the spontaneous magnetization of the magnetization free layer and the direction of the magnetization of the magnetization reference layer are parallel can relate to a "0" state, and a state that they are anti-parallel can relate to a "1" state. The data reading from the memory cell is performed by detecting a variation of resistance of the memory cell based on the magnetoresistive effect. When a current flows in a direction perpendicular to a film surface of the magnetic tunnel junction to detect the resistance, for example, the resistance is low in the "0" state and the resistance is high in the "1" state. Therefore, for example, by providing reference resistance with a value intermediate between the low resistance and the high resistance and comparing it with the resistance of the data, the state of the data can be determined.

The data writing to the memory cell is performed by making a writing current flow through a wiring line arranged in a memory cell array and applying a current induced magnetic field generated by the writing current. For example, the writing current is made to flow in a word line and a bit line which are arranged perpendicularly to each other above and below the MTJ and the magnetization of the magnetization free layer is inverted by using a combination magnetic field generated by the two currents. This method is called the two-axis writing method. In this writing method, only in the memory cell at the place where the selected word line and the selected bit line intersect, the magnetization is inverted.

The data writing to the memory cell can be performed even if there is only one wiring line for writing. For example, a bit line is arranged below the MTJ and the magnetization of the magnetization free layer is inverted by a magnetic field induced by a bit line current. This method is called the one-axis writing method. Here, in this writing method, it is necessary to select the memory cell to be written by a switch in the memory cell. For example, Japanese patent No. JP 3888463 B (Patent literature 2: corresponding to U.S. Pat. No. 7,184,301 B) discloses a memory cell and a magnetic random access memory. This memory cell includes a first transistor and a magnetoresistive element. The first transistor includes a first gate, a first terminal as one terminal other than the first gate and a second terminal as the other terminal. The magnetoresistive element (MTJ) has spontaneous magnetization whose magnetization direction is inverted based on data to be stored and includes a third terminal as one terminal and a fourth terminal as the other terminal. The first terminal is connected to a first bit line. The second terminal is connected to a second bit line. The first gate is connected to a first word line. The third terminal is connected to a second word line. The fourth terminal is connected to the second terminal. Further, the memory cell may include a second transistor provided between the first transistor and the second bit line and including a second gate, a fifth terminal as one terminal other than the second gate and a sixth terminal as the other terminal. Here, the fifth terminal is connected to the second bit line. The sixth terminal is connected to the second terminal. The second gate is connected to the first word line. The third terminal is connected to the earth instead of the second word line. That is, the memory cell with the 2 Tr-1 MTJ type configuration using two transistors and one MTJ is disclosed.

As a method using a principle other than the current induced magnetic field for the data writing to the memory cell, a magnetization inverting method using the spin orbit interaction is proposed. For example, Japanese patent publication No. JP 2009-239135 A (Patent literature 3) discloses a magnetic memory cell, a magnetic memory device using the same and a magnetic memory method. This magnetic memory cell has a first magnetic layer (a magnetization reference layer) whose magnetization state is fixed as a reference layer, a second magnetic layer (a magnetization free layer) whose magnetization state is varied as a data memory layer, and a tunnel barrier layer (a barrier layer) sandwiched the first magnetic layer and the second magnetic layer. In this memory cell, when the magnetization state of the second magnetic layer is changed, the spin orbit interaction of the second magnetic layer is controlled. Spin orbit interaction control electrodes for applying a voltage to control the spin orbit interaction may be provided in the second magnetic layer. That is, the configuration of the memory cell is disclosed in which the electrodes to control the spin orbit interaction is arranged at both ends in a side direction of the magnetization free layer and a domain wall in the magnetic layer is made to move by a low current flowing in an upward/downward direction perpendicular to the side direction based on the spin orbit interaction. An effective magnetic field and a domain wall motion based on the spin orbit interaction are also described in a non-patent literature 1 (Physical Rev. B, vol. 77, 214429 (2008)) and a non-patent literature 2 (Nature Mat., vol. 9, p230 (2010)).

As a related technique, Japanese patent publication No. JP 2008-166689 A (Patent literature 4: corresponding to the U.S. Pat. No. 7,608,901 B) discloses a spin transistor using a leakage magnetic field. This spin transistor using the leakage magnetic field includes a semiconductor substrate portion, a first electrode and a second electrode, a source and drain, and a gate. The semiconductor substrate portion has a channel layer. The first and second electrodes are separately arranged on the substrate portion with a predetermined interval along a longitudinal direction of the channel. The source and drain is composed of ferromagnetic bodies separately arranged with a predetermined interval and magnetized along a longitudinal direction of the channel between the first and second electrodes. The gate is formed on the substrate portion between the source and drain and adjusts spin directions of electrons passing through the channel. The spins of electrons passing through the channel layer are uniformed by the leakage magnetic field of the source at a lower portion of the source and filtered by the leakage magnetic field of the drain at a lower portion of the drain.

Further, Japanese patent publication No. JP 2007-81359 A (Patent literature 5: corresponding to the U.S. Pat. No. 7,307, 299 B) discloses a spin transistor using a spin-orbit coupling induced magnetic field. This spin transistor includes a substrate portion, a source and drain, and a gate. A channel is formed in the substrate portion. The source and drain are separately arranged on the substrate portion and are composed of ferromagnetic materials whose magnetization directions are the same. The gate is formed on the substrate portion and adjusts spin directions of electrons passing through the channel. The magnetization directions of the source and drain are perpendicular to a longitudinal direction of the channel.

Furthermore, International publication No. WO 2007/111319 A (Patent literature 6) discloses a MRAM using a spin injection writing method. This MRAM includes a first magnetoresistive element and a reading circuit. The first magnetoresistive element includes a first fixed ferromagnetic layer (a magnetization reference layer), a first non-magnetic layer (a barrier layer) and a first free ferromagnetic layer (a magnetization free layer) laminated in this order. In the first magnetoresistive element, data can be written as a magnetization direction of the first free ferromagnetic layer which is changed by using the spin injection. In the reading operation, the reading circuit reads the data of the first magnetoresistive element based on a resistance value of the first magnetoresistive element. The resistance value can be acquired by making a reading current flow between the first fixed ferromagnetic layer and the first free ferromagnetic layer. By applying the reading current and reading the data a plurality of times, the reading circuit determines one reading data and determines an applying direction of the reading current at the second and subsequent times of the plurality of times based on the previously read data such that the magnetization of the free ferromagnetic layer is not inverted.

CITATION LIST

Patent Literature

[PTL 1] JP-Heisei 10-4227 A
[PTL 2] JP 3888463 B
[PTL 3] JP 2009-239135 A
[PTL 4] JP 2008-166689 A
[PTL 5] JP 2007-81359 A
[PTL 6] WO 2007/111319 A Non Patent Literature

[NPL 1] K. Obata et.al., "Current-induced domain wall motion in Rashba spin-orbit system", Physical Rev. B, vol. 77, 214429 (2008).
[NPL 2] I. M. Miron et.al., "Current-driven spin torque induced by the Rashba effect in a ferromagnetic metal layer", Nature Mat., vol. 9, p230 (2010).

SUMMARY OF INVENTION

In the above-mentioned two-axis writing method (Patent literature 1) and the one-axis writing method (Patent literature 2) using the current induced magnetic field of the wiring line, there is a problem that the required current for data wiring is large. A magnetic field H generated by a current I flowing in a wiring line with a width W and a thickness T just below the wiring line is represented by $H=I/(2(W+T))$ based on the Ampere's rule. For example, in the case of the wiring line with the width W=100 nm and the thickness T=100 nm, this corresponds to generating the magnetic field H of 31 Oe per mA. In light of retention capability against thermal disturbance, a magnetic field required to invert the magnetization free layer tends to increase depending on miniaturization of the element. Therefore, the writing current with a several mA order is required. The large writing current causes an increase of electric power consumption. In addition, in the case of the two-axis writing method, it causes a decrease of a cell occupancy ratio due to an increase of an area of a cell selection transistor formed outside the cell array. In the case of the one-axis writing method, it causes an increase of an area of the cell array due to an increase of an area of a cell selection transistor formed inside the cell array. In this way, the large writing current causes degradation of device specifications.

On the other hand, in the magnetization inverting method (Patent literature 3) using the domain wall motion generated by the spin orbit interaction, there is a problem how the domain wall is introduced.

A magnetic memory of the present invention includes: a base layer; a magnetization free layer; a barrier layer; and a magnetization reference layer. The magnetization free layer, with which the base layer is covered, has invertible magnetization and is magnetized approximately uniformly. The barrier layer, with which the magnetization free layer is covered, is composed of material different from material of the base layer. The magnetization reference layer is arranged on the barrier layer and has fixed magnetization. When the magnetization of the magnetization free layer is inverted, a first writing current is made to flow from one end to the other end of the magnetization free layer in an in-plane direction without through the magnetization reference layer.

The magnetic memory of the present invention has a configuration that the upper side boundary and the lower side boundary of the magnetization free layer are different from each other. That is, in the magnetization free layer, the space symmetry is broken. In this case, when the first writing current is made to flow in the in-plane direction in the magnetization free layer, based on the spin orbit interaction, an effective magnetic field is applied to localized electrons in a direction of a cross product of the direction of the first writing current and the direction where the space symmetry is broken. The localized electrons are electrons assuming magnetization of the magnetization free layer. Therefore, by using at least a Rashba magnetic field, the magnetization of the magnetization free layer magnetized approximately uniformly can be inverted. Therefore, data can be written in the magnetization free layer. The first writing current generating the Rashba magnetic field is remarkably small as compared with the conventional writing current. That is, the writing current can be small. In addition, the magnetization free layer is magnetized approximately uniformly and thus it is unnecessary to introduce a domain wall. Therefore, an initializing step is not required.

According to the present invention, the magnetic memory in which the introduction of the domain wall is not required and the writing current is small can be provided.

BRIEF DESCRIPTION OF DRAWINGS

The above and other objects, advantages and features of the present invention will be more apparent from the following description of embodiments (examples) taken in conjunction with the accompanying drawings, in which:

FIG. 6 is a flowchart showing a writing operation of the magnetic memory according to the first embodiment of the present invention;

DESCRIPTION OF EMBODIMENTS

A magnetic memory of embodiments of the present invention will be described below referring to the accompanying drawings.

(First Embodiment)

A magnetic memory according to the first embodiment of the present invention will be described referring to the accompanying drawings.

In the present embodiment, in the two-axis writing method, a writing current is decreased by not using a current induced magnetic field using two wiring lines but using a current induced magnetic field using a single wiring line and using an effective magnetic field (a Rashba magnetic field: described later) based on a spin orbit interaction.

Figure 1A:
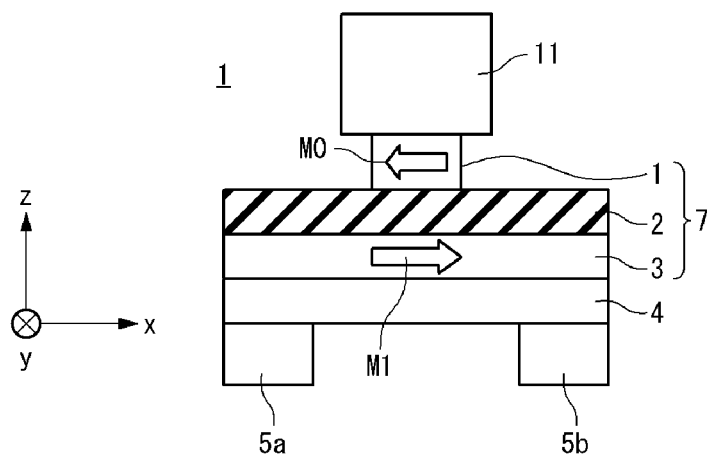
FIG. 1A is an elevation view showing a configuration of the magnetic memory element according to a first embodiment of the present invention.
Figure 1B:
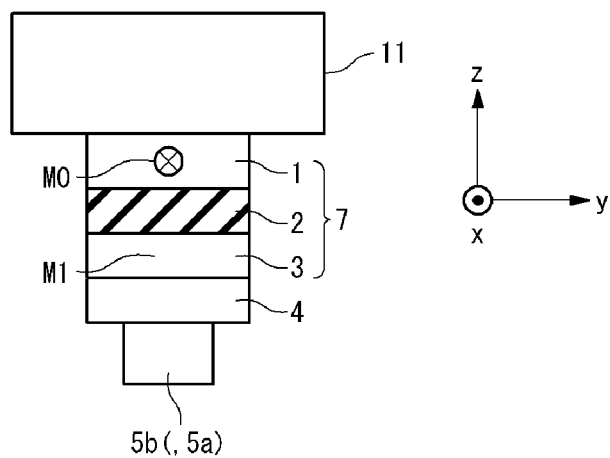
FIG. 1B is a side view showing the configuration of the magnetic memory element according to the first embodiment of the present invention.
Figure 1C:
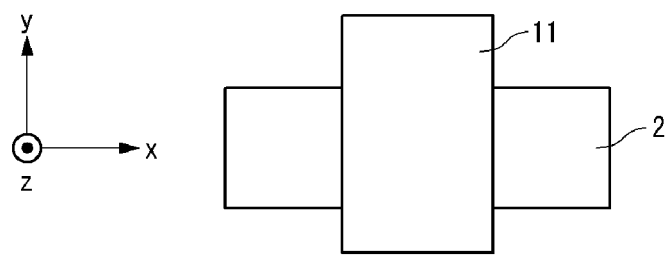
FIG. 1C is a plane view showing the configuration of the magnetic memory element according to the first embodiment of the present invention.

First, a configuration of a magnetic memory element of the magnetic memory according to the first embodiment of the present invention will be described. FIGS. 1A to 1C are an elevation view, a side view and a plane view showing the configuration of the magnetic memory element according to the first embodiment of the present invention. The magnetic memory element 9 includes a base layer 4, a magnetization free layer 3, a barrier layer 2, a magnetization reference layer 1, an upper electrode 11 and lower electrodes 5a and 5b.

The base layer 4 is arranged in parallel with a surface (a xy plane) of a substrate (not shown). The magnetization free layer 3 is arranged on the upper side (the +z side) of the base layer 4 such that the base layer 4 is covered with the magnetization free layer 3. The barrier layer 2 is arranged on the upper side (the +z side) of the magnetization free layer 3 such that the magnetization free layer 3 is covered with the barrier layer 2. The magnetization reference layer 1 is arranged on the upper side (the +z side) of the barrier layer 2. It is not necessary that all upper surface of the barrier layer 2 is covered with the magnetization reference layer 1. The magnetization free layer 3, the barrier layer 2 and the magnetization reference layer 1 constitute a MTJ (a magnetic tunnel junction) 7. The magnetic memory element 9 stores data by using a magnetization direction of the magnetization free layer 3 of the MTJ 7.

The upper electrode 11 is connected to the magnetization reference layer 1. The upper electrode 11 is a wiring line for a writing current which generates the current induced magnetic field near the magnetization free layer 3, and is exemplified by a bit line. The lower electrode 5a is connected to a lower side (the −z side) of one side (the −x side) end, and the lower electrode 5b is connected to the lower side (the −z side) of the other side (the +x side) end. The lower electrodes 5a and 5b are connected to selection transistors Tr (described later), respectively, and can apply a current to the magnetization free layer 3 through the base layer 4 from one of the lower electrodes 5a and 5b to the other.

The base layer 4 is composed of material different from material of the barrier layer 2 such that the Rashba magnetic field (described later) is made to be generated in the magnetization free layer 3. In addition, since the base layer 4 is arranged between the magnetization free layer 3 and the lower electrodes 5a and 5b, the base layer 4 is preferably a conductive film such that a current easily passes through the base layer 4. However, the base layer 4 is preferably composed of material which can avoid a writing current from flowing selectively through the base layer 4 not through the magnetization free layer 3. The base layer 4 is exemplified by a Ta film, a Pt film, and a lamination film thereof.

The magnetization free layer 3 is a ferromagnetic film with in-plane magnetic anisotropy. The magnetization free layer 3 has invertible magnetization M1. In the example of this figure, the magnetization free layer 3 can take a magnetization state of a +x direction and a magnetization state of a −x direction. The magnetization free layer 3 is magnetized approximately uniformly. That is, there is substantially no domain wall in the magnetization free layer 3. The magnetization free layer 3 is exemplified by a NiFe film, a CoFe film, a CoFeB film, and a lamination film thereof. The magnetization free layer 3 is preferably very thin such that the Rashba magnetic field (described later) is made to be generated. For example, the magnetization free layer 3 has preferably the film thickness from about 0.5 nm to about 1.5 nm. In the film thickness of less than 0.5 nm, it is hard to control a film formation. This film thickness is, as compared with a several nm (e.g. about 5 nm) of a magnetization free layer (or a free layer) in a usual MTJ, thin and a fraction of the several nm.

The barrier layer 2 is composed of material different from material of the base layer 4 such that the Rashba magnetic field (described later) is made to be generated in the magnetization free layer 3. In addition, the barrier layer 2 is formed of non-magnetic film because the barrier layer 2 is provided as a tunnel barrier layer in the MTJ 7. The barrier layer 2 is exemplified by an insulating film such as an $Al_2O_3$ film and an MgO film. The barrier layer 2 has preferably the film thickness, for example, from about 1.0 nm to about 2.0 nm with respect to the above-mentioned exemplified film thickness of the magnetization free layer 3. That is, the film thickness is similar to the film thickness of the magnetization free layer 3.

The magnetization reference layer 1 is a ferromagnetic film with in-plane magnetic anisotropy. In the magnetization reference layer 1, magnetization M0 is fixed. In the example of this figure, the magnetization M0 is fixed in the −x direction. The magnetization reference layer 1 is exemplified by a NiFe film, a CoFe film, a CoFeB film, and a lamination film thereof.

The magnetic memory element 9 has a configuration that the upper side boundary and the lower side boundary of the magnetization free layer 3 are different from each other. In the example of this figure, the base layer 4 is joined to the boundary of the lower side (the −z side) of the magnetization free layer 3, and the barrier layer 2 composed of material different from material of the base layer 4 is joined to the boundary of the upper side (the +z side) of the magnetization free layer 3. That is, in the magnetization free layer 3, the space symmetry is broken with respect to the z direction. In this case, when a current is made to flow in the in-plane direction (e.g. the x direction) in the magnetization free layer 3, based on the spin orbit interaction, an effective magnetic field is applied to localized electrons in the direction (the y direction) of a cross product of the direction (the x direction) of the current and the direction (the z direction) where the space symmetry is broken. The localized electrons are electrons assuming magnetization of the magnetization free layer 3. This effective magnetic field is called the Rashba magnetic field. In the present embodiment, by using this Rashba magnetic field and using the current induced magnetic field based on the upper electrode 11, writing data to the MTJ 7, that is, inverting the magnetization of the magnetization free layer 3 is performed.

Data reading and data writing of the magnetic memory element of the magnetic memory according to the present embodiment will be described below. Here, for descriptive purposes, it is supposed that the magnetization M0 of the magnetization reference layer 1 is fixed in the −x direction. In addition, it is supposed that when the magnetization M1 of the magnetization free layer 3 of the MTJ 7 is in the −x direction, that is the magnetization M0 of the magnetization reference layer 1 and the magnetization M1 of the magnetization free layer 3 are parallel (low resistance), the data "0" is stored. Furthermore, it is supposed that when the magnetization M1 of the magnetization free layer 3 of the MTJ 7 is in the +x direction, that is the magnetization M0 of the magnetization reference layer 1 and the magnetization M1 of the magnetization free layer 3 are anti-parallel (high resistance), the data "1" is stored.

The data writing to the magnetic memory element 9 will be described.

Figure 2A:
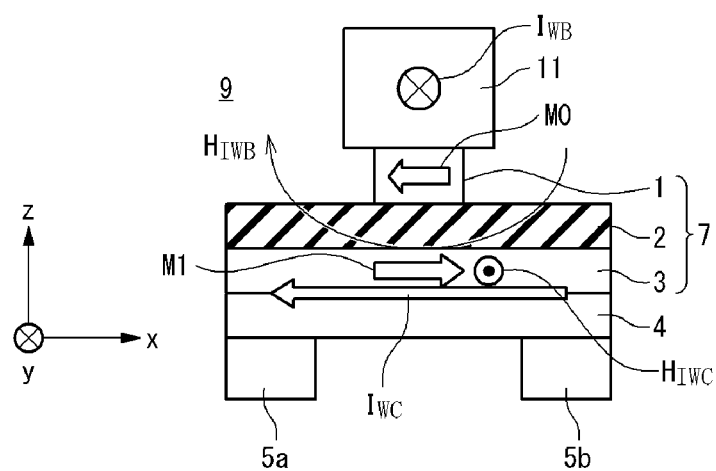
FIG. 2A is an elevation view showing a data writing method of the magnetic memory element according to the first embodiment of the present invention.
Figure 2B:
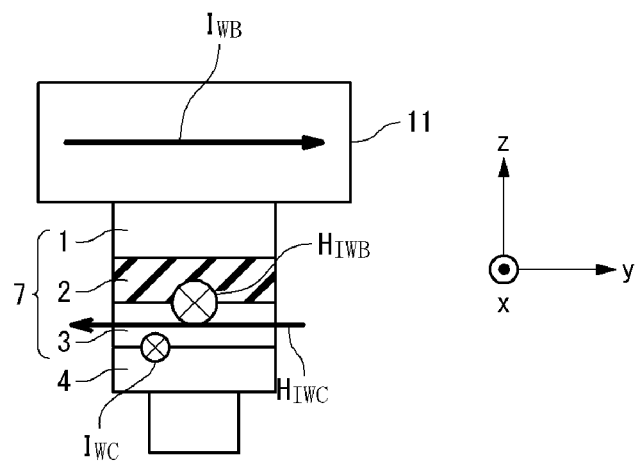
FIG. 2B is a side view showing the data writing method of the magnetic memory element according to the first embodiment of the present invention.
Figure 2C:
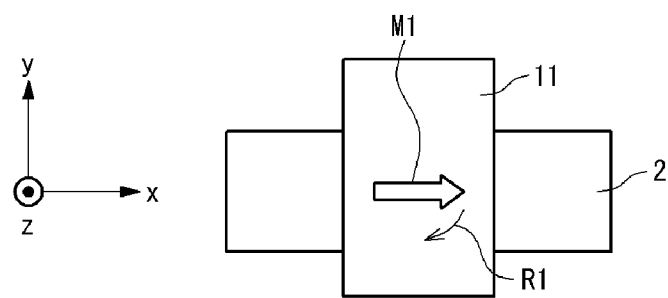
FIG. 2C is a plane view showing the data writing method of the magnetic memory element according to the first embodiment of the present invention.

First, the case that the data "0" is going to be written when the data "1" is stored in the magnetic memory element 9 will be described. FIGS. 2A to 2C are an elevation view, a side view and a plane view showing a data writing method of the magnetic memory element according to the first embodiment of the present invention. FIGS. 2A to 2C show a situation that the operation of writing the data "0" is being performed when the data "1" is stored in the magnetic memory element 9.

For writing the data "0" to the magnetic memory element 9, first, a writing current $I_{WC}$ is made to flow from the lower electrode 5b to the lower electrode 5a through the magnetization free layer 3 in the −x direction. Concurrently, a writing current $I_{WB}$ is made to flow in the upper electrode 11 in the +y direction. At this time, as described above, the boundary at the lower side (the −z side) of the magnetization free layer 3 is joined to the base layer 4 and the boundary at the upper side (the +z direction) is joined to the barrier layer 2. Therefore, the boundaries at the both sides of the magnetization free layer 3 have the different structures. That is, in the magnetization free layer 3, the space symmetry is broken with respect to the z direction. Accordingly, when the writing current $I_{WC}$ is made to flow in the −x direction in the plane of the magnetization free layer 3, due to the spin orbit interaction, a magnetic field $H_{IWC}$ (the Rashba magnetic field) is applied to localized electrons in the direction (the y direction) of a cross product of the direction (the x direction) of the writing current $I_{WC}$ and the direction (the z direction) where the space symmetry is broken. The localized electrons are electrons assuming magnetization of the magnetization free layer 3. For example, in the case that the base layer 4, the magnetization free layer 3 and the barrier layer 2 are Ta, CoFeB and MgO and the writing current $I_{WC}$ is made to flow in the −x direction, the magnetic field $H_{IWC}$ (the Rashba magnetic field) is generated in the −y direction (hereinafter referred to as the first example). In the case that the base layer 4, the magnetization free layer 3 and the barrier layer 2 are Pt, Co and AlOx and the writing current $I_{WC}$ is made to flow in the −x direction, the magnetic field $H_{IWC}$ (the Rashba magnetic field) is generated in the +y direction (hereinafter referred to as the second example). In this way, whether the direction is the −y direction or the +y direction depends on material. The example of this figure shows that the magnetic field $H_{IWC}$ (the Rashba magnetic field) is generated in the −y direction. The magnetic field $H_{IWC}$ acts on the magnetization M1 of the magnetization free layer 3 in the +x direction so as to turn the magnetization M1 to the −y direction. In addition, a magnetic field $H_{IWB}$ is induced near the magnetization free layer 3 by the writing current $I_{WB}$ in the upper electrode 11. The magnetic field $H_{IWB}$ acts on the magnetization M1 of the magnetization free layer 3 in the +x direction so as to turn the magnetization M1 to the −x direction. By the actions of these two magnetic fields, the magnetization M1 of the magnetization free layer 3 in the +x direction turns to the −x direction, as shown in an arrow R1. That is, the data writing is performed from the state of the data "1" shown in FIGS. 2A to 2C to the state of the data "0" shown in FIGS. 3A to 3C as described later.

Figure 3A:
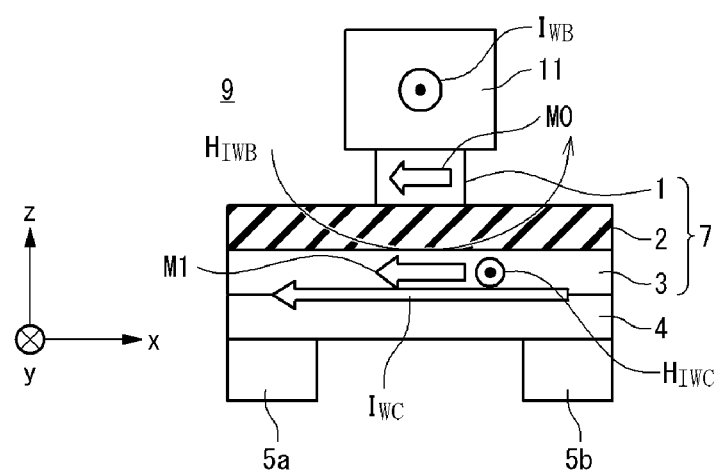
FIG. 3A is an elevation view showing a data writing method of the magnetic memory element according to the first embodiment of the present invention.
Figure 3B:
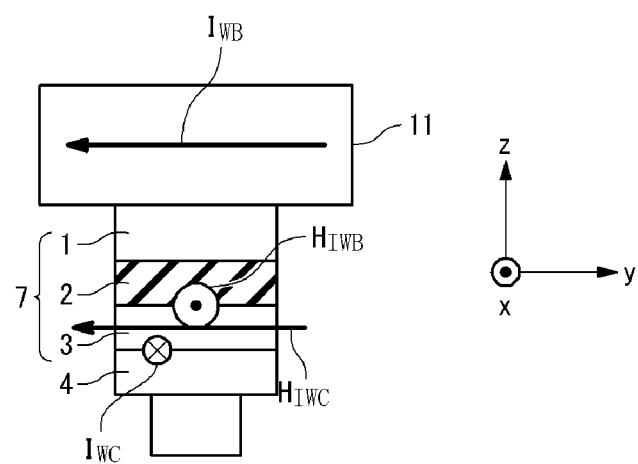
FIG. 3B is a side view showing the data writing method of the magnetic memory element according to the first embodiment of the present invention.
Figure 3C:
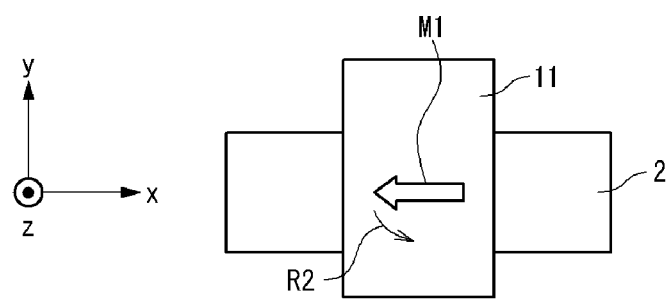
FIG. 3C is a plane view showing the data writing method of the magnetic memory element according to the first embodiment of the present invention.

Next, the case that the data "1" is going to be written when the data "0" is stored in the magnetic memory element 9 will be described. FIGS. 3A to 3C are an elevation view, a side view and a plane view showing a data writing method of the magnetic memory element according to the first embodiment of the present invention. FIGS. 3A to 3C show a situation that the operation of writing the data "1" is being performed when the data "0" is stored in the magnetic memory element 9.

For writing the data "1" to the magnetic memory element 9, first, the writing current $I_{WC}$ is made to flow from the lower electrode 5b to the lower electrode 5a through the magnetization free layer 3 in the −x direction. Concurrently, the writing current $I_{WB}$ is made to flow in the upper electrode 11 in the −y direction. At this time, as described above (this figure shows the first example), when the writing current $I_{WC}$ is made to flow in the −x direction in the plane of the magnetization free layer 3, due to the spin orbit interaction, the magnetic field $H_{IWC}$ (the Rashba magnetic field) is applied to localized electrons in the −y direction. The localized electrons are electrons assuming magnetization of the magnetization free layer 3. The magnetic field $H_{IWC}$ acts on the magnetization M1 of the magnetization free layer 3 in the −x direction so as to turn the magnetization M1 to the −y direction. In addition, the magnetic field $H_{IWB}$ is induced near the magnetization free layer 3 by the writing current $I_{WB}$ in the upper electrode 11. The magnetic field $H_{IWB}$ acts on the magnetization M1 of the magnetization free layer 3 in the −x direction so as to turn the magnetization M1 to the +x direction. By the actions of these two magnetic fields, the magnetization M1 of the magnetization free layer 3 in the −x direction turns to the +x direction, as shown in an arrow R2. That is, the data writing is performed from the state of the data "0" shown in FIGS. 3A to 3C to the state of the data "1" shown in FIGS. 2A to 2C.

Incidentally, as easily understood from the above-mentioned data writing method, an overwriting operation can be performed, the overwriting operation being that the data "0" is going to be written when the data "0" is stored in the magnetic memory element 9 and the data "1" is going to be written when the data "1" is stored in the magnetic memory element 9. In addition, as easily understood from the above-mentioned data writing method, the both of the −x direction and the +x direction may be available as the direction for making the writing current $I_{WC}$ flow.

Next, the data reading from the magnetic memory element 9 will be described. The data reading method is the same as the usual reading method for the MTJ 7 including the magnetization free layer 3, the barrier layer 2 and the magnetization reference layer 1. For example, a reading current with a constant current value is made to flow between the upper electrode 11 and the lower electrode 5a, that is, in the MTJ 7. Then, by comparing a reference voltage with a voltage between the upper electrode 11 and the lower electrode 5a generated by the reading current, the magnetoresistance value of the MTJ 7, that is, the data as the direction of the magnetization of the magnetization free layer 3 is read.

Figure 4:
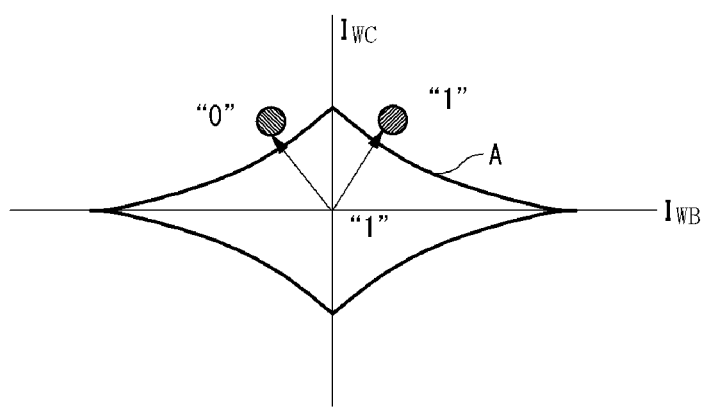
FIG. 4 is a graph showing an outline of an inversion threshold in the data writing.

Here, an inversion threshold (a current necessary to inversion) in the data writing to the magnetic memory element 9 will be described. FIG. 4 is a graph (an asteroid curve) showing an outline of an inversion threshold in the data writing. The vertical axis indicates the writing current $I_{WC}$ (the current flowing in the magnetic memory element 9), and the horizontal axis indicates the writing current $I_{WB}$ (the current flowing in the upper electrode 11). This figure shows the data writing arises on and outside the asteroid curve A. Here, in this figure, the vertical axis is extended approximately $10^2$ times more than the original. That is, the writing current $I_{WC}$ is approximately $10^2$ times smaller than the writing current $I_{WB}$. This is because the effective magnetic field (the Rashba magnetic field) based on the spin orbit interaction is as large as kOe order per the writing current $I_{WC}$=1.0×$10^{12}$ A/m$^2$.

For example, when a current corresponding to one of the first and fourth quadrants is applied from the state of the data "1", the state becomes the data "1" (the overwriting is performed). When a current corresponding to one of the second and third quadrants is applied from the state of the data "1", the state becomes the data "0" (the rewriting is performed). The both of the positive and negative directions may be available as the direction of the current (the writing current $I_{WC}$) applied to the magnetization free layer 3. At this time, it is supposed that the current is close to the Y axis, that is, the writing current $I_{WC}$ is increased and the writing current $I_{WB}$ is remarkably decreased. As described above, the writing current $I_{WC}$ is approximately $10^2$ times smaller than the writing current $I_{WB}$. Therefore, it is considered that effect of the increase of the writing current $I_{WC}$ is much smaller than effect of the decrease of the writing current $I_{WB}$. That is, since the effect of the decrease of the writing current $I_{WB}$ is extremely large, as a result, the total amount of the writing current can be remarkably small. Therefore, it is preferable that the writing currents $I_{WC}$ and $I_{WB}$ have values on or outside the asteroid curve A close to the vertical axis as much as possible.

Incidentally, a plane shape of the magnetization free layer 3 may be not only a rectangle as shown in FIG. 1C but also an ellipse, an oval and a shape that a part of each of the rectangle, the ellipse and the oval is concaved in their longitudinal direction. In this regard, the magnetization direction of the magnetization free layer 3 does not completely point to one direction homogeneously. However, since there is no clear domain wall in the magnetization free layer 3, the present embodiment is described that the magnetization free layer 3 is homogeneously magnetized.

In addition, in the above description, it is supposed that the direction of the magnetic anisotropy of the magnetization free layer 3 is parallel to the direction (the x direction) of the current induced magnetic field $H_{IWB}$ of the upper electrode 11. However, the present embodiment is not limited to the example. It may be supposed that the direction of the magnetic anisotropy of the magnetization free layer 3 is parallel to the direction (the y direction) of the Rashba magnetic field $H_{IWC}$. In this case, by using the polar character of the writing current $I_{WC}$ flowing in the magnetization free layer 3, the writing the data "0" and "1" can be controlled.

Figure 5:
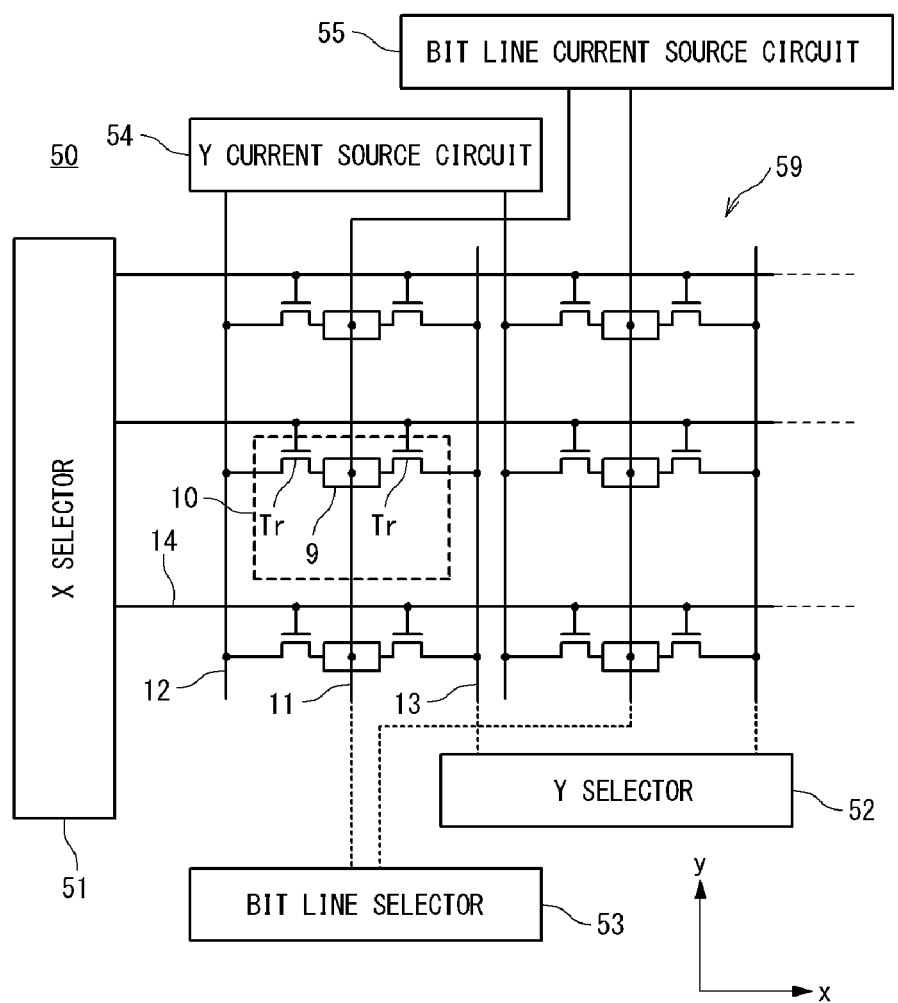
FIG. 5 is a block diagram showing an example of a configuration of a magnetic memory according to the first embodiment of the present invention.

FIG. 5 is a block diagram showing an example of a configuration of a magnetic memory according to the first embodiment of the present invention. The magnetic memory 50 includes a memory cell array 59, an X selector 51, a Y selector 52, a bit line selector 53, a Y current source circuit 54 and a bit line current source circuit 55. These elements are not limited to the above elements if these elements have functions similar to functions described later.

The memory cell array 59 includes a plurality of memory cells 10, a plurality of bit lines 11, a plurality of first writing lines 12, a plurality of second writing lines 13 and a plurality of word lines 14. The word line 14 is connected to the X selector 51 at one end, and is extended to the x direction. The bit line 11 is connected to the bit line selector 53 at one end, is connected to the bit line current source circuit 55 at the other end, and is extended to the y direction. The first writing line 12 is connected to the Y current source circuit 54 at one end, and is extended to the y direction. The second writing line 13 is connected to the Y selector 52 at one end, and is extended to the y direction. The plurality of memory cells 10 is arranged in a matrix shape correspondingly to intersections between the plurality of word lines 14 and the plurality of bit lines 11. The memory cell 10 includes two selection transistors Tr and the magnetic memory element 9. One of the selection transistors Tr is connected to the first writing line 12 at one of the source and drain, is connected to the lower electrode 5a of the magnetic memory element 9 at the other of the source and drain, and is connected to the word line 14 at the gate. The other of the selection transistors Tr is connected to the second writing line 13 at one of the source and drain, is connected to the lower electrode 5b of the magnetic memory element 9 at the other of the source and drain, and is connected to the word line 14 at the gate. The magnetization reference layer 1 of the magnetic memory element 9 is connected to the bit line 11 as the upper electrode.

The X selector 51 selects a selection word line 14 from the plurality of word lines 14 when the writing operation and reading operation are performed. The Y selector 52 selects a selection second writing line 13 from the plurality of second writing lines 13 when the writing operation and reading operation are performed. The bit line selector 53 selects a selection bit line 11 from the plurality of bit lines 11 when the writing operation is performed. The Y current source circuit 54 selects a selection first writing line 12 from the plurality of first writing lines 12 and supplies or draws the writing current $I_{WC}$ when the writing operation is performed. The bit line current source circuit 55 selects a selection bit line 11 from the plurality of bit lines 11 (same as the selection bit line 11 of the bit line selector 53), supplies or draws the writing current $I_{WB}$ and supplies or draws the reading current $I_R$ when the writing operation and reading operation are performed. The magnetic field generated by the writing current $I_{WB}$ flowing in the selection bit line 11 is applied to memory cells 10 connected to the selection bit line 11 and the memory cells 10 except a writing target memory cell 10 are in a half selected state (the half selection cells). The X selector 51, the Y selector 52, the bit line selector 53, the Y current source circuit 54 and the bit line current source circuit 55 are supposed to be a writing current control circuit which applies the writing current to the writing target memory cell 10.

This magnetic memory may be used for a single memory (a MRAM), or may be used for a memory section in a memory embedded microcomputer (a semiconductor device including the memory section and a logic section (not shown)).

Next, an operation of the magnetic memory according to the first embodiment of the present invention will be described. FIG. 6 is a flowchart showing a writing operation of the magnetic memory according to the first embodiment of the present invention. In the writing operation, first, the X selector 51 selects a selection word line 14 (S01). Accordingly, selection transistors Tr connected to the selection word line 14 at the gate are turned on. Next, the Y selector 52 selects a selection second writing line 13. Further, the bit line selector 53 selects a selection bit line 11. As a result, a writing cell 10 as a target memory cell 10 to which data is written is selected (S02). Next, the Y current source circuit 54 selects a selection first writing line 12, and performs supplying or drawing a writing current $I_{WC}$ on the writing cell 10 (S03). At this time, a current path is the Y current source circuit 54—the selection first writing line 12—the writing cell 10—the selection second writing line 13—the Y selector 52. Accordingly, the writing current $I_{WC}$ is applied to a magnetization free layer 3 of the writing cell 10 and an effective magnetic field $H_{IWC}$ is applied to the magnetization free layer 3. Concurrently, the bit line current source circuit 55 performs supplying or drawing a writing current $I_{WB}$ on the selection bit line 11 (S04). At this time, a current path is the bit line current source circuit 55—the selection bit line 11—the bit line selector 53. Accordingly, a current induced magnetic field $H_{IWB}$ is applied to the magnetization free layer 3 of the writing cell 10. Consequently, the magnetization of the magnetization free layer 3 of the selected writing cell 10 can be inverted. Here, the steps S03 and S04 are performed such that they overlap with each other in terms of time. In this case, the order of performing the steps S03 and S04 is not limited to the above order.

In the present embodiment, the writing operation point is set to the point close to the vertical axis (close to the writing current $I_{WC}$ axis) indicated in FIG. 4 by using the fact that the electric current magnetic field conversion efficiency based on the spin orbit interaction is high. Therefore, the writing current $I_{WB}$ made to flow in the bit line 11 can be reduced. As a result, the risk that the half selection cell arranged to the same bit line 11 as the writing cell 10 is accidentally inverted (the half selection disturbance) can be decreased. In the present circuit configuration, there is no half selection problem on the memory cells 10 in the X direction.

Next, a reading operation of the magnetic memory cell will be described. In the reading operation, the X selector 51 selects a selection word line 14. Accordingly, a selection transistor Tr connected to the selection word line 14 at the gate is turned on. Next, the Y selector 52 selects a selection second writing line 13. Further, the bit line current source circuit 55 selects a selection bit line 11. According to the above, a reading cell 10 as a target memory cell 10 from which data is read is selected. The bit line current source circuit 55 performs supplying or drawing a reading current $I_R$. At this time, the current path is the bit line current source circuit 55—the selection bit line 11—the reading cell 10—the selection second writing line 13—the Y selector 52. Accordingly, the reading current flows in the MTJ 7 of the reading cell 10. Consequently, for example, by using a sense amplifier (not shown here) connected to the Y selector 52 or the like, the resistance of the MTJ 7 is detected and the data is read.

Figure 7A:
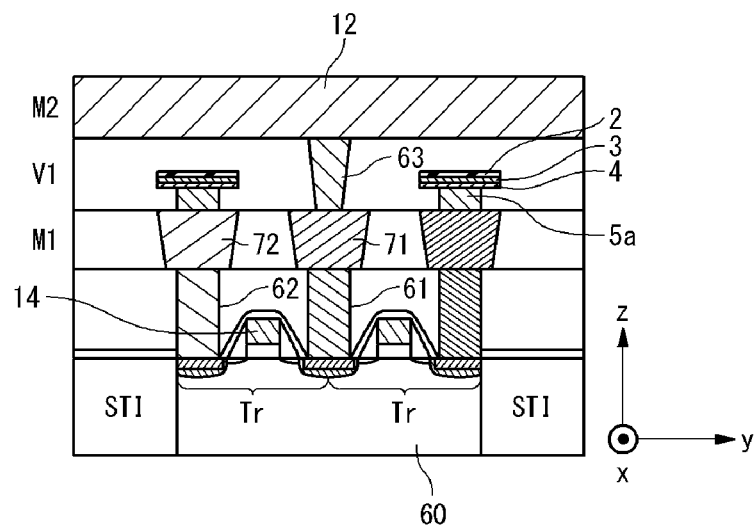
FIG. 7A is a partial sectional view showing a layout configuration of the magnetic memory according to the first embodiment of the present invention.
Figure 7B:
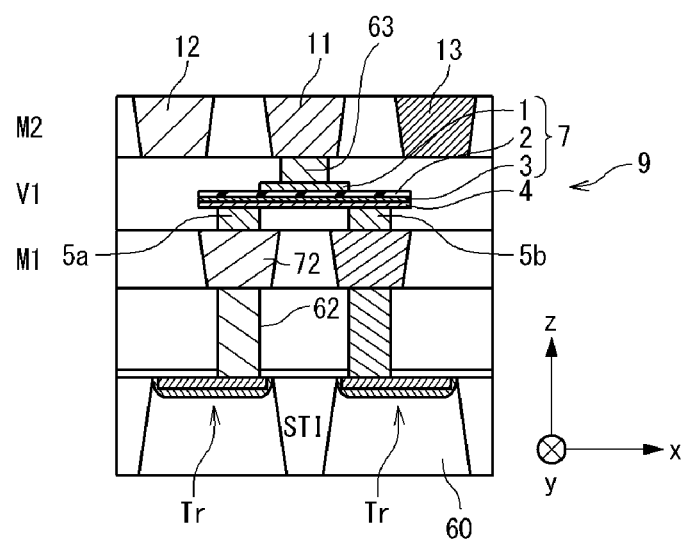
FIG. 7B is a partial sectional view showing the layout configuration of the magnetic memory according to the first embodiment of the present invention.

FIGS. 7A to 7B are a partial sectional view showing a layout configuration of the magnetic memory according to the first embodiment of the present invention. The magnetic memory element 9 (including the MTJ 7) is formed on a V1 layer. The lower electrodes 5a and 5b of the magnetic memory element 9 are respectively connected to ones of the source and drain of the selection transistors Tr formed on a surface region through wiring lines 72 of a M1 layer and contacts 62. The gates of the selection transistors Tr are connected to the word line 14. Further, the others of the source and drain of the selection transistors Tr are respectively connected to the first writing line 12 or the second writing line 13 through contacts 61, wiring lines 71 of the M1 layer and vias 63 of the V1 layer. In the case of this figure, the magnetization reference layer 1 of the magnetic memory element 9 is connected to the bit line 11 as the upper electrode through a contact 64.

As described above, the magnetic memory of the present invention has a configuration (one side is the barrier layer 2 and the other side is the base layer 4) that the upper side boundary and the lower side boundary of the magnetization free layer 3 are different from each other. That is, in the magnetization free layer 3, the space symmetry is broken. In this case, when the writing current $I_{WC}$ is made to flow in the in-plane direction in the magnetization free layer 3, based on the spin orbit interaction, the effective magnetic field (the Rashba magnetic field) $H_{IWC}$ is applied to localized electrons in the direction (the y direction) of the cross product of the direction (the x direction) of the writing current $I_{WC}$ and the direction (the z direction) where the space symmetry is broken. The localized electrons are electrons assuming magnetization of the magnetization free layer 3. Therefore, by using the Rashba magnetic field $H_{IWC}$ and the magnetic field $H_{IWB}$ induced by the writing current $I_{WB}$ of the upper electrode (the bit line) 11, the magnetization of the magnetization free layer 3 magnetized approximately uniformly (a substantial domain wall does not exist) can be inverted. That is, data can be written in the magnetization free layer 3. At this time, by concurrently using the writing current $I_{WC}$ and the writing current $I_{WB}$, the writing current $I_{WB}$ can be small. Here, since the electric current magnetic field conversion efficiency based on the spin orbit interaction is high, the writing current $I_{WC}$ is remarkably small as compared with the conventional writing current. That is, the total amount of the writing currents can be small. In addition, the magnetization free layer 3 is magnetized approximately uniformly and thus it is unnecessary to introduce a domain wall. Therefore, an initializing step is not required.

(Second Embodiment)

The magnetic memory according to the second embodiment of the present invention will be described referring to the attached drawings.

The present embodiment is different from the first embodiment in the point that the magnetization reference layer 1 and the magnetization free layer 3 have perpendicular magnetic anisotropy in the present invention while they have in-plane magnetic anisotropy in the first embodiment. The different point from the first embodiment will be mainly described below.

Figure 8A:
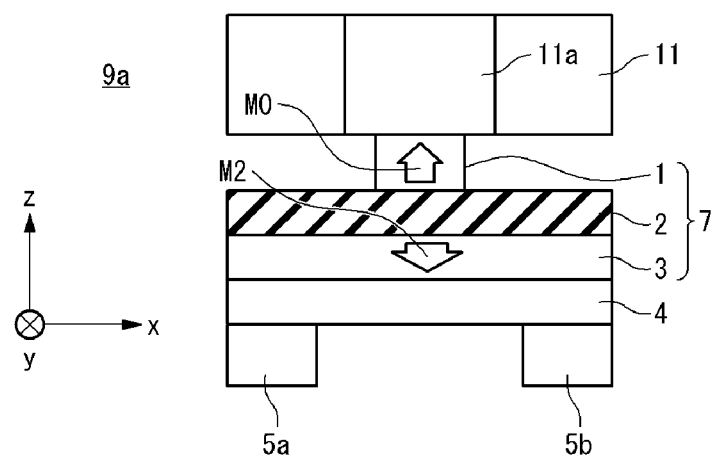
FIG. 8A is an elevation view showing a configuration of the magnetic memory element according to a second embodiment of the present invention.
Figure 8B:
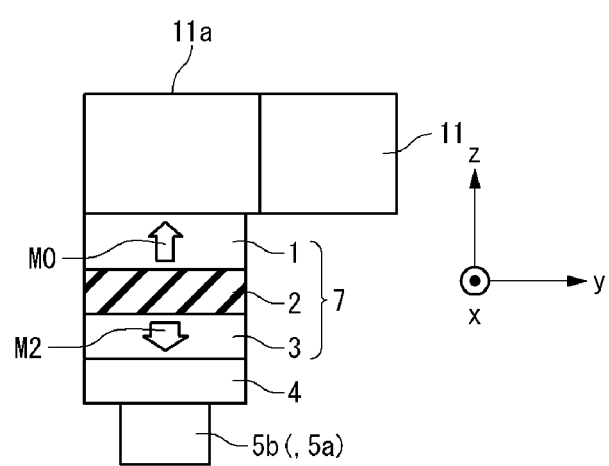
FIG. 8B is a side view showing the configuration of the magnetic memory element according to the second embodiment of the present invention.
Figure 8C:
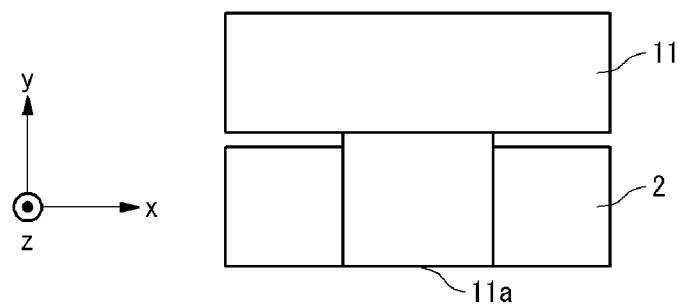
FIG. 8C is a plane view showing the configuration of the magnetic memory element according to the second embodiment of the present invention.

First, the magnetic memory element of the magnetic memory according to the second embodiment of the present invention will be described. FIGS. 8A to 8C are an elevation view, a side view and a plane view showing a configuration of the magnetic memory element according to the second embodiment of the present invention. The magnetic memory element 9a includes a base layer 4, a magnetization free layer 3, a barrier layer 2, a magnetization reference layer 1, an upper electrode 11, lower electrodes 5a and 5b.

As described above, differently from the first embodiment, the magnetization reference layer 1 and the magnetization free layer 3 have perpendicular magnetic anisotropy. That is, the magnetization free layer 3 is composed of a ferromagnetic film with perpendicular anisotropy. The magnetization free layer 3 has invertible magnetization M2. In the example of this figure, the magnetization free layer 3 can take the magnetization state with the −z direction and the magnetization state with the +z direction. The magnetization free layer 3 is exemplified by a Co film, a Co/Ni lamination film, a Co/Pt lamination film and a CoFeB film. Meanwhile, the magnetization reference layer 1 is also composed of a ferromagnetic layer with perpendicular magnetic anisotropy. In the magnetic reference layer 1, magnetization M0 is fixed. In the example of this figure, the magnetization M0 is fixed in the +z direction. The magnetization reference layer 1 is exemplified by a Co film, a Co/Ni lamination film, a Co/Pt lamination film and a CoFeB film.

The upper electrode 11 is connected to the magnetization reference layer 1 through a wiring line 11a. The upper electrode 11 is a wiring line for a writing current which generates a current induced magnetic field near the magnetization free layer 3 and is exemplified by a bit line. In the present embodiment, since the magnetization free layer 3 has the perpendicular magnetic anisotropy, the magnetic field by the writing current flowing the upper electrode 11 requires a Z direction component. Therefore, the upper electrode 11 is arranged so as to be shifted to the y direction or the x direction with respect to the magnetization free layer 3. In the configuration of this figure, the upper electrode 11 is arranged so as to be shifted to the +y direction and be extended to the x direction. The upper electrode 11 may be arranged so as to be shifted to the x direction and be extended to the y direction.

Other constitutive parts of the magnetization reference layer 1, the magnetization free layer 3 and the upper electrode 11, configurations other than the above, and effects of them are similar to the first embodiment.

The data writing of the magnetic memory element of the magnetic memory according to the present embodiment will be described. Here, for purposes of description, it is supposed that the magnetization M0 of the magnetic reference layer 1 is fixed in the +z direction. In addition, it is supposed that the data "0" is stored when the magnetization M2 of the magnetization free layer 3 of the MTJ is in the +z direction, that is, the magnetization M0 of the magnetization reference layer 1 and the magnetization M2 of the magnetization free layer 3 are parallel (the low resistance). It is supposed that the data "1" is stored when the magnetization M2 of the magnetization free layer 3 of the MTJ is in the −z direction, that is, the magnetization M0 of the magnetization reference layer 1 and the magnetization M2 of the magnetization free layer 3 are anti-parallel (the high resistance).

The data writing to the magnetic memory element 9a will be described.

Figure 9A:
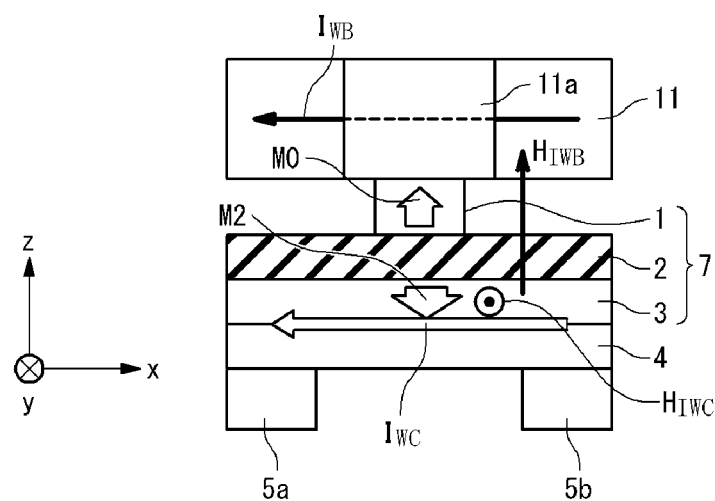
FIG. 9A is an elevation view showing a data writing method of the magnetic memory element according to the second embodiment of the present invention.
Figure 9B:
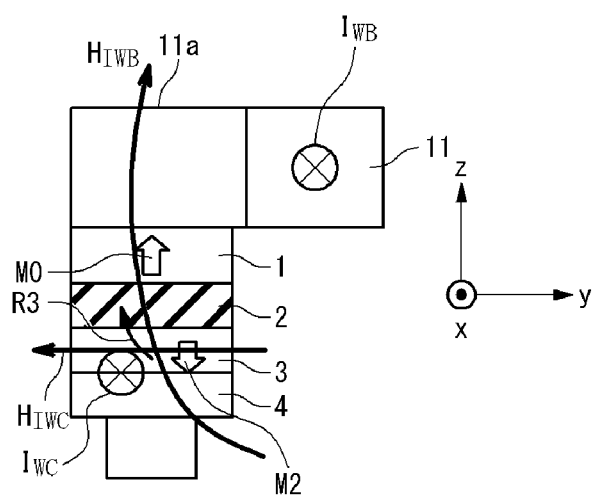
FIG. 9B is a side view showing the data writing method of the magnetic memory element according to the second embodiment of the present invention.

First, the case that the data "0" is going to be written when the data "1" is stored in the magnetic memory element 9a will be described. FIGS. 9A and 9B are an elevation view and a side view showing the data writing method of the magnetic memory element according to the second embodiment of the present invention. FIGS. 9A and 9B show a situation that the operation of writing the data "0" is being performed when the data "1" is stored in the magnetic memory element 9a.

For writing the data "0" to the magnetic memory element 9a, first, a writing current $I_{WC}$ is made to flow from the lower electrode 5b to the lower electrode 5a through the magnetization free layer 3 in the −x direction. Concurrently, a writing current $I_{WB}$, is made to flow in the upper electrode 11 in the −x direction. At this time, as described in the first embodiment (this figure shows the first example), when the writing current $I_{WC}$ is made to flow in the −x direction in the plane of the magnetization free layer 3, due to the spin orbit interaction, a magnetic field $H_{IWC}$ (the Rashba magnetic field) is applied to localized electrons in the −y direction. The localized electrons are electrons assuming magnetization of the magnetization free layer 3. The magnetic field $H_{IWC}$ acts on the magnetization M2 of the magnetization free layer 3 in the −z direction so as to turn the magnetization M2 to the −y direction. In addition, a magnetic field $H_{IWB}$ is induced near the magnetization free layer 3 by the writing current $I_{WB}$ in the upper electrode 11. The magnetic field $H_{IWB}$ acts on the magnetization M2 of the magnetization free layer 3 in the −z direction so as to turn the magnetization M1 to the +z direction. By the actions of these two magnetic fields, the magnetization M2 of the magnetization free layer 3 in the −z direction turns to the +z direction, as shown in an arrow R3. That is, the data writing is performed from the state of the data "1" shown in FIGS. 9A and 9B to the state of the data "0" shown in FIGS. 10A and 10B as described later.

Figure 10A:
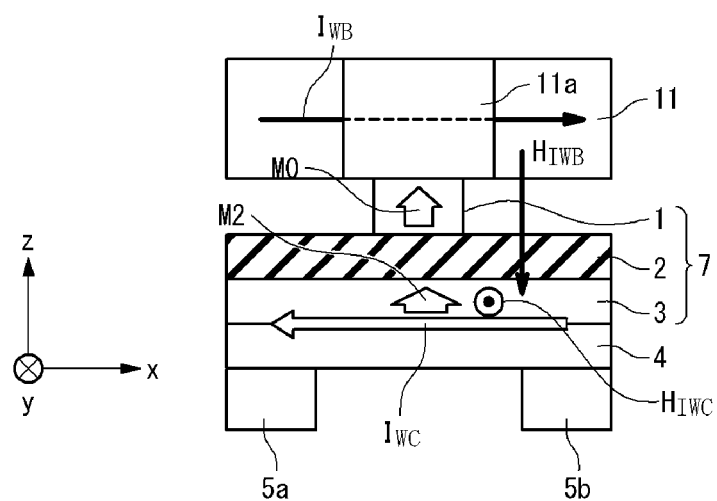
FIG. 10A is an elevation view showing the data writing method of the magnetic memory element according to the second embodiment of the present invention.
Figure 10B:
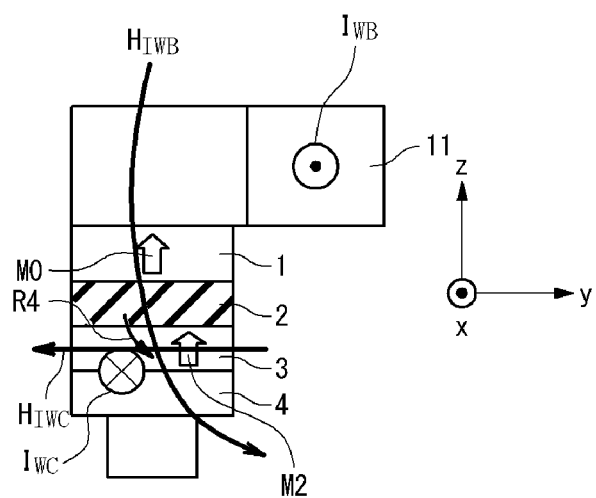
FIG. 10B is a side view showing the data writing method of the magnetic memory element according to the second embodiment of the present invention.

Next, the case that the data "1" is going to be written when the data "0" is stored in the magnetic memory element 9a will be described. FIGS. 10A and 10B are an elevation view and a side view showing the data writing method of the magnetic memory element according to the first embodiment of the present invention. FIGS. 10A and 10B show a situation that the operation of writing the data "1" is being performed when the data "0" is stored in the magnetic memory element 9a.

For writing the data "1" to the magnetic memory element 9a, first, the writing current $I_{WC}$ is made to flow from the lower electrode 5b to the lower electrode 5a through the magnetization free layer 3 in the −x direction. Concurrently, the writing current $I_{WB}$, is made to flow in the upper electrode 11 in the +x direction. At this time, as described in the first embodiment (this figure shows the first example), when the writing current $I_{WC}$ is made to flow in the −x direction in the plane of the magnetization free layer 3, due to the spin orbit interaction, the magnetic field $H_{IWC}$ (the Rashba magnetic field) is applied to localized electrons in the −y direction. The localized electrons are electrons assuming magnetization of the magnetization free layer 3. The magnetic field $H_{IWC}$ acts on the magnetization M2 of the magnetization free layer 3 in the +z direction so as to turn the magnetization M2 to the −y direction. In addition, the magnetic field $H_{IWB}$ is induced near the magnetization free layer 3 by the writing current $I_{WB}$ in the upper electrode 11. The magnetic field $H_{IWB}$ acts on the magnetization M2 of the magnetization free layer 3 in the +z direction so as to turn the magnetization M1 to the −z direction. By the actions of these two magnetic fields, the magnetization M2 of the magnetization free layer 3 in the +z direction turns to the −z direction, as shown in an arrow R4. That is, the data writing is performed from the state of the data "0" shown in FIGS. 10A and 10B to the state of the data "1" shown in FIGS. 9A and 9B.

Incidentally, as easily understood from the above-mentioned data writing method, an overwriting operation can be performed, the overwriting operation being that the data "0" is going to be written when the data "0" is stored in the magnetic memory element 9a and the data "1" is going to be written when the data "1" is stored in the magnetic memory element 9a. In addition, as easily understood from the above-mentioned data writing method, the both of the −x direction and the +x direction may be available as the direction for making the writing current $I_{WC}$ flow.

The data reading from the magnetic memory element 9a is the same as the first embodiment. In addition, the inversion threshold in the data writing (FIG. 4), the configuration of the magnetic memory (FIG. 5), the flowchart showing the writing operation of the magnetic memory (FIG. 6), and the layout of the magnetic memory (FIGS. 7A to 7B) and their effects are the same as the first embodiment.

In the present embodiment, the effects same as the first embodiment can be obtained. In addition, by using the material with perpendicular magnetic anisotropy, the writing current required to invert the magnetization can be smaller.

(Third Embodiment)

The magnetic memory cell according to the third embodiment of the present invention will be described referring to the attached drawings.

In the present embodiment, in the one-axis writing method, a writing current is reduced by not using a current induced magnetic field by a single wiring line but mainly using an effective magnetic field (the Rashba magnetic field: described later) based on the spin orbit interaction. That is, the present embodiment is different from the first embodiment in the point that the current induced magnetic field generated by the current flowing in the upper electrode (the bit line) is not used for the data writing. The different point from the first embodiment will be mainly described below.

Figure 11A:
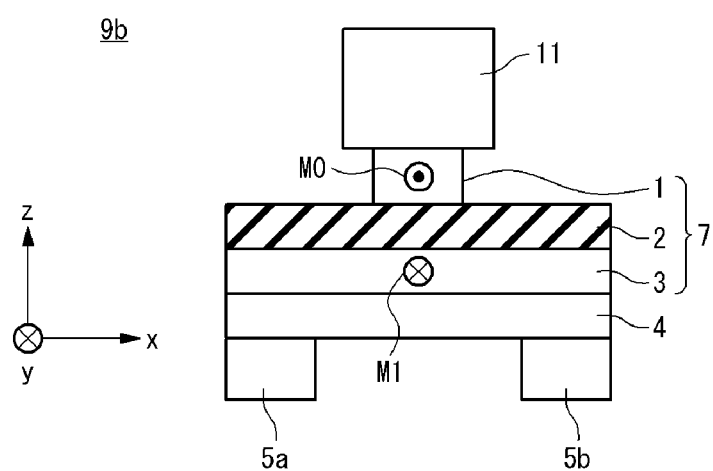
FIG. 11A is an elevation view showing a configuration of the magnetic memory element according to a third embodiment of the present invention.
Figure 11B:
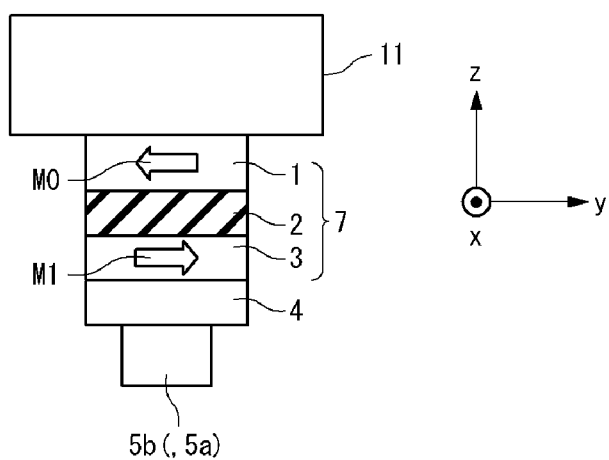
FIG. 11B is a side view showing the configuration of the magnetic memory element according to the third embodiment of the present invention.
Figure 11C:
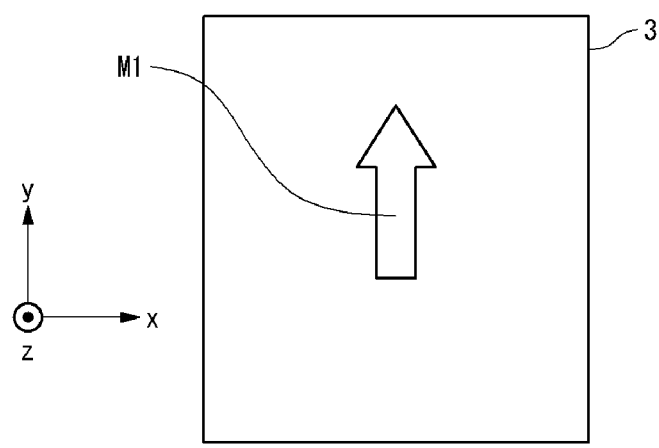
FIG. 11C is a plane view showing the configuration of the magnetic memory element according to the third embodiment of the present invention.

First, a configuration of the magnetic memory element of the magnetic memory according to the third embodiment of the present invention will be described. FIGS. 11A to 11C are an elevation view, a side view and a plane view showing the configuration of the magnetic memory element according to the third embodiment of the present invention. The magnetic memory element 9b includes a base layer 4, a magnetization free layer 3, a barrier layer 2, a magnetization reference layer 1, an upper electrode 11 and lower electrodes 5a and 5b.

The magnetization free layer 3 is composed of a ferromagnetic film with in-plane magnetic anisotropy. The magnetization free layer 3 has invertible magnetization M1. In the example of this figure, the magnetization free layer 3 can take the magnetization state with the +y direction and the magnetization state with the −y direction. The magnetization easy axis is in the −y direction. Methods that the magnetization easy axis is made to be in the y direction are a method using shape anisotropy, which is a method that a longitudinal axis of the magnetization free layer 3 is made to be in the y direction, a method using a crystal magnetic anisotropy, and a method using strain induced magnetic anisotropy. Here, it is not necessary that the direction of the magnetization easy axis is correctly the y direction. For example, the direction of the magnetization easy axis may have an angle of 45 degree with respect to the y axis in the in-plane direction. The magnetization reference layer 1 is composed of a ferromagnetic film with in-plane magnetic anisotropy. In the magnetization reference layer 1, the magnetization M0 is fixed. In the example of this figure, the magnetization M0 is fixed in the −y direction. The upper electrode 11 is formed and arranged near the magnetization free layer 3 so as not to generate a current induced magnetic field affecting the magnetization of the magnetization free layer 3.

Other constitutive parts of the magnetization reference layer 1, the magnetization free layer 3 and the upper electrode 11, configurations other than the above, and effects of them are similar to the first embodiment.

The data writing of the magnetic memory element of the magnetic memory according to the present embodiment will be described. Here, for purposes of description, it is supposed that the magnetization M0 of the magnetic reference layer 1 is fixed in the −y direction. In addition, it is supposed that the data "0" is stored when the magnetization M1 of the magnetization free layer 3 of the MTJ is in the −y direction, that is, the magnetization M0 of the magnetization reference layer 1 and the magnetization M1 of the magnetization free layer 3 are parallel (the low resistance). It is supposed that the data "1" is stored when the magnetization M1 of the magnetization free layer 3 of the MTJ is in the +y direction, that is, the magnetization M0 of the magnetization reference layer 1 and the magnetization M1 of the magnetization free layer 3 are anti-parallel (the high resistance).

The data writing to the magnetic memory element 9b will be described.

Figure 12A:
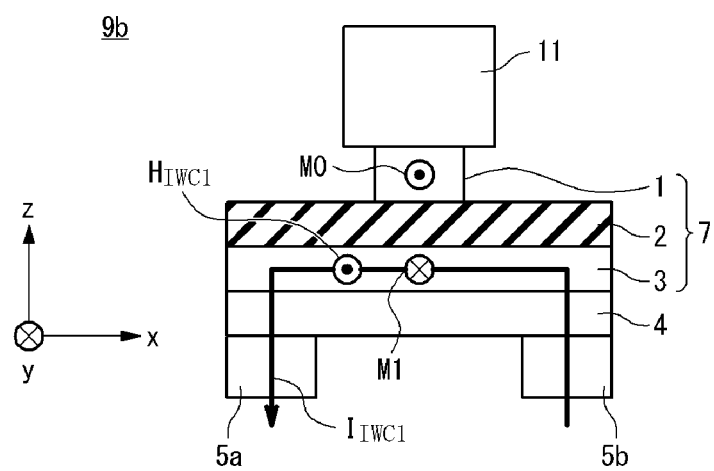
FIG. 12A is an elevation view showing a data writing method of the magnetic memory element according to the third embodiment of the present invention.
Figure 12B:
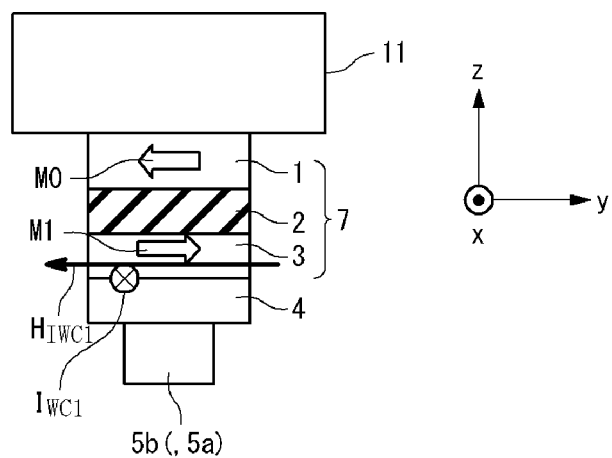
FIG. 12B is a side view showing the data writing method of the magnetic memory element according to the third embodiment of the present invention.
Figure 12C:
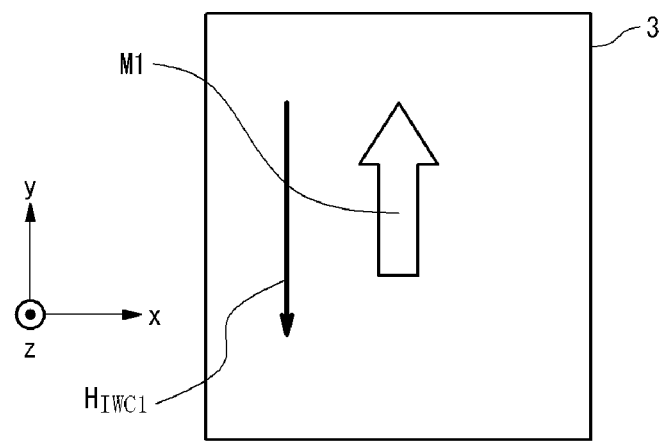
FIG. 12C is a plane view showing the data writing method of the magnetic memory element according to the third embodiment of the present invention.

First, the case that the data "0" is going to be written when the data "1" is stored in the magnetic memory element 9b will be described. FIGS. 12A to 12C are an elevation view, a side view and a plane view showing the data writing method of the magnetic memory element according to the third embodiment of the present invention. FIGS. 12A to 12C show a situation that the operation of writing the data "0" is being performed when the data "1" is stored in the magnetic memory element 9b.

For writing the data "0" to the magnetic memory element 9b, first, a writing current $I_{IWC1}$ is made to flow from the lower electrode 5b to the lower electrode 5a through the magnetization free layer 3 in the −x direction. At this time, as described in the first embodiment (this figure shows the first example), due to the spin orbit interaction, a magnetic field $H_{IWC1}$ (the Rashba magnetic field) is applied to localized electrons in the −y direction. The localized electrons are electrons assuming magnetization of the magnetization free layer 3. The magnetic field $H_{IWC1}$ acts on the magnetization M1 of the magnetization free layer 3 in the +y direction so as to turn the magnetization M1 to the −y direction. By the action of this magnetic field $H_{IWC1}$ the magnetization M1 of the magnetization free layer 3 in the +y direction turns to the −y direction. That is, the data writing is performed from the state of the data "1" shown in FIGS. 12A to 12C to the state of the data "0" shown in FIGS. 13A to 13C as described later.

Figure 13A:
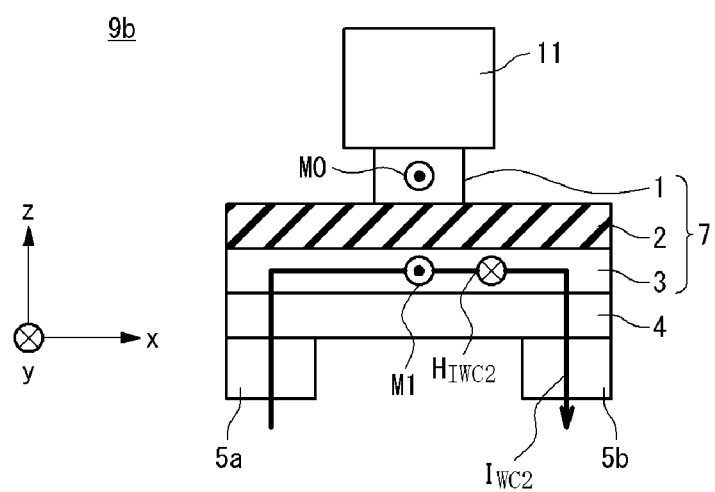
FIG. 13A is an elevation view showing the data writing method of the magnetic memory element according to the third embodiment of the present invention.
Figure 13B:
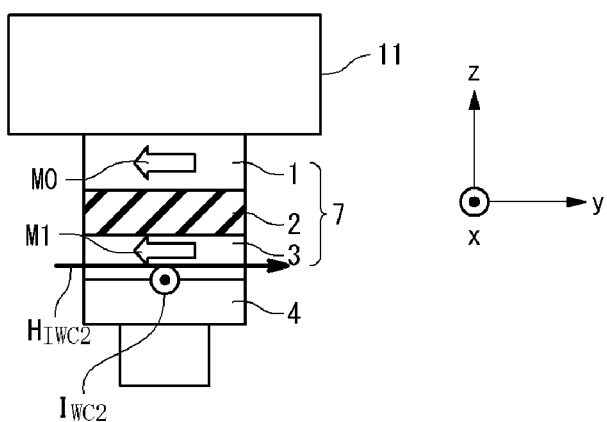
FIG. 13B is a side view showing the data writing method of the magnetic memory element according to the third embodiment of the present invention.
Figure 13C:
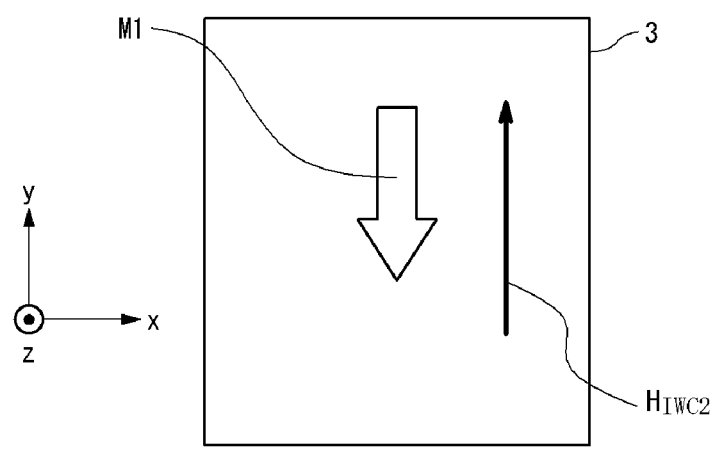
FIG. 13C is a plane view showing the data writing method of the magnetic memory element according to the third embodiment of the present invention.

Next, the case that the data "1" is going to be written when the data "0" is stored in the magnetic memory element 9b will be described. FIGS. 13A to 13C are an elevation view, a side view and a plane view showing the data writing method of the magnetic memory element according to the third embodiment of the present invention. FIGS. 13A to 13C show a situation that the operation of writing the data "1" is being performed when the data "0" is stored in the magnetic memory element 9a.

For writing the data "1" to the magnetic memory element 9b, first, the writing current $I_{IWC2}$ is made to flow from the lower electrode 5a to the lower electrode 5b through the magnetization free layer 3 in the +x direction. At this time, as described in the first embodiment (this figure shows the first example), due to the spin orbit interaction, the magnetic field $H_{IWC2}$ (the Rashba magnetic field) is applied to localized electrons in the +y direction. The localized electrons are electrons assuming magnetization of the magnetization free layer 3. The magnetic field $H_{IWC2}$ acts on the magnetization M1 of the magnetization free layer 3 in the −y direction so as to turn the magnetization M1 to the +y direction. By the action of this magnetic field $H_{IWC2}$ the magnetization M1 of the magnetization free layer 3 in the −y direction turns to the +y direction. That is, the data writing is performed from the state of the data "0" shown in FIGS. 13A to 13C to the state of the data "1" shown in FIGS. 12A to 12C.

In the above writing, a cross product of a vector of the direction (the z direction) of the film thickness of the magnetization free layer 3 and a vector of the direction (the x direction) of the writing currents $I_{WC1}$ and $I_{WC2}$ has a component parallel to the direction (the y direction) of the magnetization M1 of the magnetization free layer 3. Incidentally, as easily understood from the above-mentioned data writing method, an overwriting operation can be performed, the overwriting operation being that the data "0" is going to be written when the data "0" is stored in the magnetic memory element 9b and the data "1" is going to be written when the data "1" is stored in the magnetic memory element 9b.

The data reading from the magnetic memory element 9b is the same as the first embodiment. In addition, the inversion threshold in the data writing (FIG. 4) and their effects are the same as the first embodiment.

Figure 14:
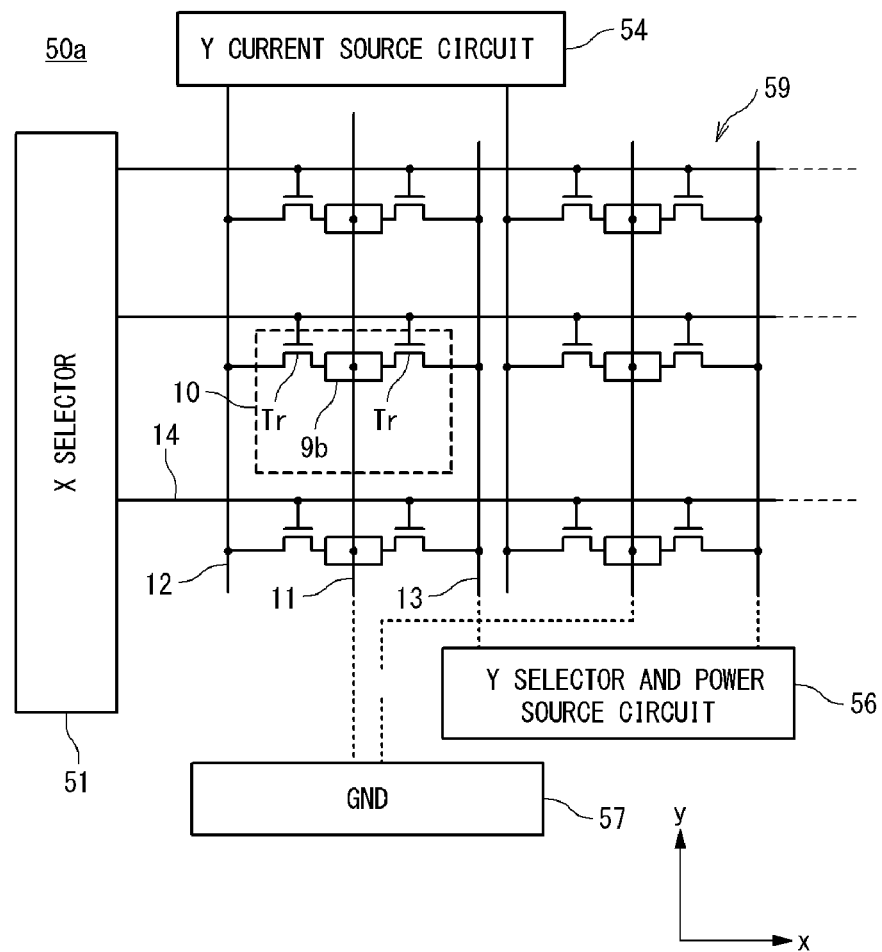
FIG. 14 is a block diagram showing an example of a configuration of a magnetic memory according to the third embodiment of the present invention.

FIG. 14 is a block diagram showing an example of a configuration of the magnetic memory according to the third embodiment of the present invention. The magnetic memory 50a includes a memory cell array 59, an X selector 51, a Y current source circuit 54, a Y selector and power source circuit 56 and a GND (ground) 57. These elements are not limited to the above elements if these elements have functions similar to functions described later.

The memory cell array 59 includes a plurality of memory cells 10, a plurality of bit line 11, a plurality of first writing lines 12, a plurality of second writing lines 13 and a plurality of word lines 14. The word line 14 is connected to the X selector 51 at one end, and is extended to the x direction. The bit line 11 is connected to the GND (ground) 57 at one end, and is extended to the y direction. The first writing line 12 is connected to the Y current source circuit 54 at one end, and is extended to the y direction. The second writing line 13 is connected to the Y selector and power source circuit 56 at one end, and is extended to the y direction. The plurality of memory cells 10 is arranged in a matrix shape correspondingly to intersections between the plurality of word lines 14 and the plurality of bit lines 11. The memory cell 10 includes two selection transistors Tr and the magnetic memory element 9b. One of the selection transistors Tr is connected to the first writing line 12 at one of the source and drain, is connected to the lower electrode 5a of the magnetic memory element 9b at the other of the source and drain, and is connected to the word line 14 at the gate. The other of the selection transistors Tr is connected to the second writing line 13 at one of the source and drain, is connected to the lower electrode 5b of the magnetic memory element 9b at the other of the source and drain, and is connected to the word line 14 at the gate. The magnetization reference layer 1 of the magnetic memory element 9b is connected to the bit line 11 as the upper electrode.

The X selector 51 selects a selection word line 14 from the plurality of word lines 14 when the writing operation and reading operation are performed. The Y selector and power source circuit 56 selects a selection second writing line 13 from the plurality of second writing lines 13, supplies the writing current $I_{WC1}$, and supplies or draws the reading current $I_R$, when the writing operation and reading operation are performed. The Y current source circuit 54 selects a selection first writing line 12 from the plurality of first writing lines 12 and supplies the writing current $I_{WC2}$ when the writing operation is performed. The X selector 51, the Y current source circuit 54 and the Y selector and power source circuit 56 (and the GND (ground) 57) are supposed to be a writing current control circuit which applies the writing current to the writing target memory cell 10.

This magnetic memory may be used for a single memory (a MRAM), or may be used for a memory section in a memory embedded microcomputer (a semiconductor device including the memory section and a logic section (not shown)).

Next, an operation of the magnetic memory according to the third embodiment of the present invention will be described. In the writing operation, first, the X selector 51 selects a selection word line 14. Accordingly, selection transistors Tr connected to the selection word line 14 at the gate are turned on. Next, the Y selector and power source circuit 56 selects a selection second writing line 13. Further, the Y current source circuit 54 selects a selection first writing line 12. As a result, a writing cell 10 as a target memory cell 10 to which data is written is selected. Next, the Y selector and power source circuit 56 performs supplying a writing current $I_{WC1}$ on the writing cell 10, or the Y current source circuit 54 performs supplying a writing current $I_{WC2}$ on the writing cell 10. In these cases, a current path is the Y selector and power source circuit 56—the selection second writing line 13—the writing cell 10—the selection first writing line 12—the Y current source circuit 54. Accordingly, the writing current $I_{WC1}$ or the writing current $I_{WC2}$ is applied to t magnetization free layer 3 of the writing cell 10, and an effective magnetic field $H_{IWC1}$ or an effective magnetic field $H_{IWC2}$ is applied to the magnetization free layer 3. Consequently, the magnetization of the magnetization free layer 3 of the selected writing cell 10 can be inverted.

In the present embodiment, the writing operation point is set to the point on the vertical axis (on the writing current $I_{WC}$ axis) indicated in FIG. 4 by using the fact that the electric current magnetic field conversion efficiency based on the spin orbit interaction is high. Therefore, the writing current $I_{WB}$ made to flow in the bit line 11 can be eliminated. As a result, since there is no half selection cell, the risk of the half selection disturbance can be eliminated. In the present circuit configuration, there is no half selection problem on the memory cells 10 in the X direction.

Next, a reading operation of the magnetic memory cell will be described. In the reading operation, the X selector 51 selects a selection word line 14. Accordingly, a selection transistor Tr connected to the selection word line 14 at the gate is turned on. Next, the Y selector and power source circuit 56 selects a selection second writing line 13. According to the above, a reading cell 10 as a target memory cell 10 from which data is read is selected. The Y selector and power source circuit 56 performs supplying or drawing a reading current $I_R$. At this time, the current path is the Y selector and power source circuit 56—the selection second writing line 13—the reading cell 10—the selection bit line 11—the GND (ground) 57. Accordingly, the reading current flows in the MTJ 7 of the reading cell 10. Consequently, for example, by using a sense amplifier (not shown here) connected to the Y selector and power source circuit 56 or the like, the resistance of the MTJ 7 is detected and the data is read.

The layout (FIGS. 7A and 7B) of the magnetic memory is the same as the first embodiment.

In the present embodiment, the effects similar to the first embodiment can be obtained. In addition, since the magnetic field induced by the current flowing in the bit line is not used, the writing current can be reduced further for the amount of the current flowing in the bit line.

(Fourth Embodiment)

The magnetic memory cell according to the fourth embodiment of the present invention will be described referring to the attached drawings.

The present embodiment is different from the third embodiment in the point that the magnetization reference layer 1 and the magnetization free layer 3 have perpendicular magnetic anisotropy in the present invention while they have in-plane magnetic anisotropy in the third embodiment. The different point from the third embodiment will be mainly described below.

Figure 15A:
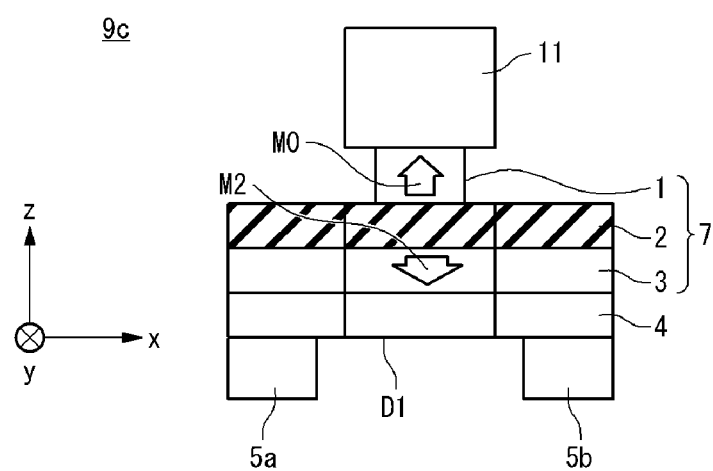
FIG. 15A is an elevation view showing a configuration of the magnetic memory element according to a fourth embodiment of the present invention.
Figure 15B:
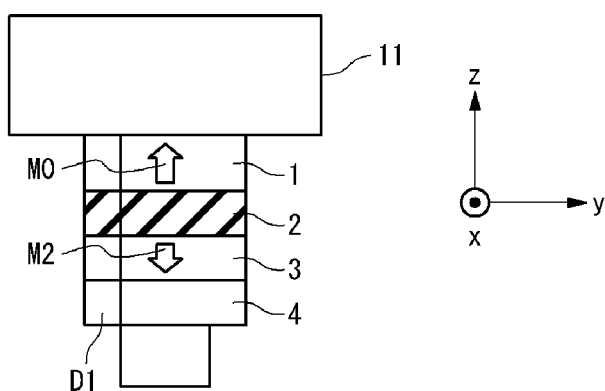
FIG. 15B is a side view showing the configuration of the magnetic memory element according to the fourth embodiment of the present invention.
Figure 15C:
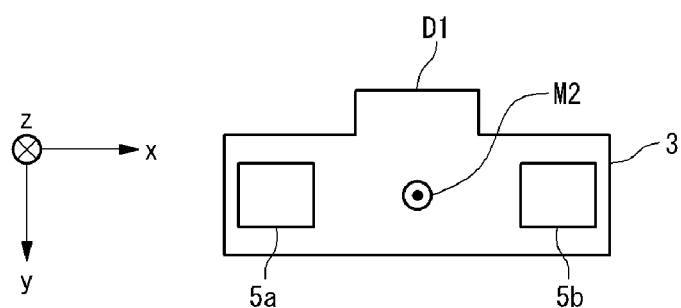
FIG. 15C is a plane view showing the configuration of the magnetic memory element according to the fourth embodiment of the present invention.

First, a configuration of the magnetic memory element of the magnetic memory according to the fourth embodiment of the present invention will be described. FIGS. 15A to 15C are an elevation view, a side view and a plane view showing the configuration of the magnetic memory element according to the fourth embodiment of the present invention. The magnetic memory element 9c includes a base layer 4, a magnetization free layer 3, a barrier layer 2, a magnetization reference layer 1, an upper electrode 11 and lower electrodes 5a and 5b.

As described above, differently from the third embodiment, the magnetization reference layer 1 and the magnetization free layer 3 has perpendicular magnetic anisotropy. That is, the magnetization free layer 3 is a ferromagnetic film with perpendicular magnetic anisotropy. The magnetization free layer 3 has invertible magnetization M2. In the example of this figure, the magnetization free layer 3 can take the magnetization with the −z direction and the magnetization with the +z direction. The magnetization free layer 3 is exemplified by a Co film, a Co/Ni lamination film, a Co/Pt lamination film and a CoFeB film.

In the magnetization free layer 3, the effective magnetic field (the Rashba magnetic field) based on the spin orbit interaction is in an in-plane direction (the x direction or the y direction). Therefore, it is impossible to invert the magnetization M2 of the magnetization free layer 3 directed in the perpendicular direction (the z direction) only by the effective magnetic field. Consequently, in the present embodiment, with regard to the writing current ($I_{WC}$) flowing in the magnetization free layer 3, the current distribution in the cross section perpendicular to the flowing direction is made to non-uniform. This leads to generation of a current induced magnetic field ($H_{10}$: described later) in the perpendicular direction (the z direction). Then, the writing is performed by the combination of this magnetic field and the effective magnetic field ($H_{IWC}$). Thus, the magnetization free layer 3 has an asymmetric protrusion portion D1 in the xy plane view (FIG. 15C).

The magnetization reference layer 1 is a ferromagnetic film with perpendicular magnetic anisotropy. In the magnetization reference layer 1, the magnetization M0 is fixed. In the example of this figure, the magnetization M0 is fixed in the +z direction. The magnetization reference layer 1 is exemplified by a Co film, a Co/Ni lamination film, a Co/Pt lamination film and a CoFeB film.

Other constitutive parts of the magnetization reference layer 1 and the magnetization free layer 3, configurations other than the above, and effects of them are similar to the third embodiment.

Next, the data writing of the magnetic memory element of the magnetic memory according to the present embodiment will be described. Here, for purposes of description, it is supposed that the magnetization M0 of the magnetic reference layer 1 is fixed in the +z direction. In addition, it is supposed that the data "0" is stored when the magnetization M2 of the magnetization free layer 3 of the MTJ is in the +z direction, that is, the magnetization M0 of the magnetization reference layer 1 and the magnetization M2 of the magnetization free layer 3 are parallel (the low resistance). It is supposed that the data "1" is stored when the magnetization M2 of the magnetization free layer 3 of the MTJ is in the −z direction, that is, the magnetization M0 of the magnetization reference layer 1 and the magnetization M2 of the magnetization free layer 3 are anti-parallel (the high resistance).

The data writing to the magnetic memory element 9c will be described.

Figure 16A:
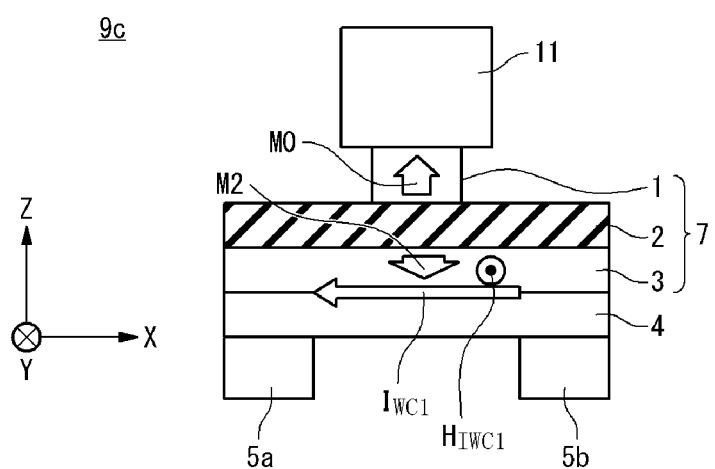
FIG. 16A is an elevation view showing a data writing method of the magnetic memory element according to the fourth embodiment of the present invention.
Figure 16B:
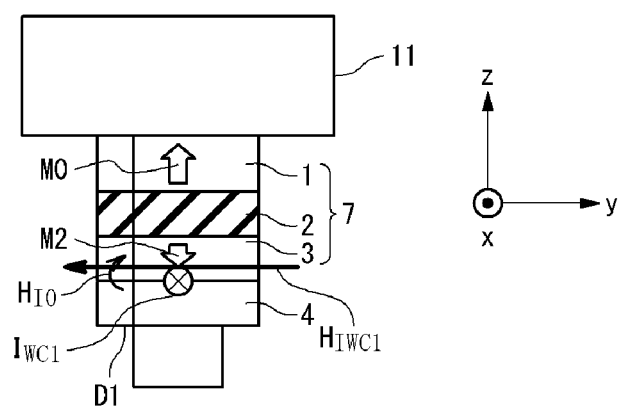
FIG. 16B is a side view showing the data writing method of the magnetic memory element according to the fourth embodiment of the present invention.
Figure 16C:
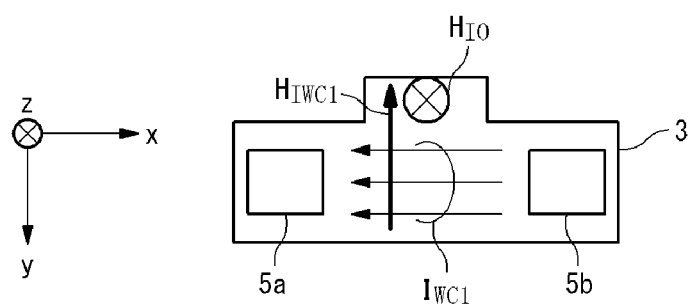
FIG. 16C is a plane view showing the data writing method of the magnetic memory element according to the fourth embodiment of the present invention.

First, the case that the data "0" is going to be written when the data "1" is stored in the magnetic memory element 9c will be described. FIGS. 16A to 16C are an elevation view, a side view and a plane view showing the data writing method of the magnetic memory element according to the fourth embodiment of the present invention. FIGS. 16A to 16C show a situation that the operation of writing the data "0" is being performed when the data "1" is stored in the magnetic memory element 9c.

For writing the data "0" to the magnetic memory element 9c, first, a writing current $I_{IWC1}$ is made to flow from the lower electrode 5b to the lower electrode 5a through the magnetization free layer 3 in the −x direction. At this time, as described in the first embodiment (this figure shows the first example), due to the spin orbit interaction, a magnetic field $H_{IWC1}$ (the Rashba magnetic field) is applied to localized electrons in the −y direction. The localized electrons are electrons assuming magnetization of the magnetization free layer 3. The magnetic field $H_{IWC1}$ acts on the magnetization M2 of the magnetization free layer 3 in the −z direction so as to turn the magnetization M2 to the −y direction. In addition, because of the protrusion portion D1 of the magnetization free layer 3, the writing current $I_{WC1}$ flowing in the magnetization free layer 3 is non-uniform, and therefore, the current density at the protrusion portion D1 is decreased. That is, the current induced magnetic field $H_{10}$ in the +z direction applied to the protrusion portion D1 is stronger than that applied to the other regions. Therefore, the protrusion portion D1 becomes the origin of inversion nucleation due to the current induced magnetic field $H_{10}$. By the combination of the inversion nucleation due to the current induced magnetic field $H_{10}$ at the protrusion portion D1 and the effective magnetic field $H_{IWC1}$, the magnetization M2 of the magnetization free layer 3 in the −z direction turns to the +z direction. That is, the data writing is performed from the state of the data "1" shown in FIGS. 16A to 16C to the state of the data "0" shown in FIGS. 17A to 17C as described later.

Figure 17A:
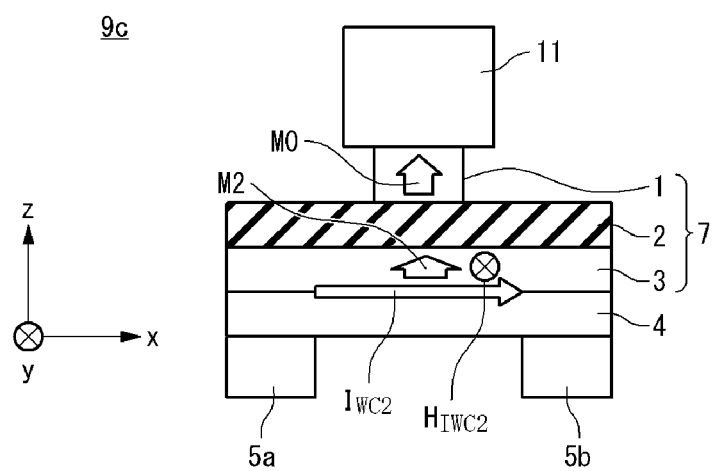
FIG. 17A is an elevation view showing the data writing method of the magnetic memory element according to the fourth embodiment of the present invention.
Figure 17B:
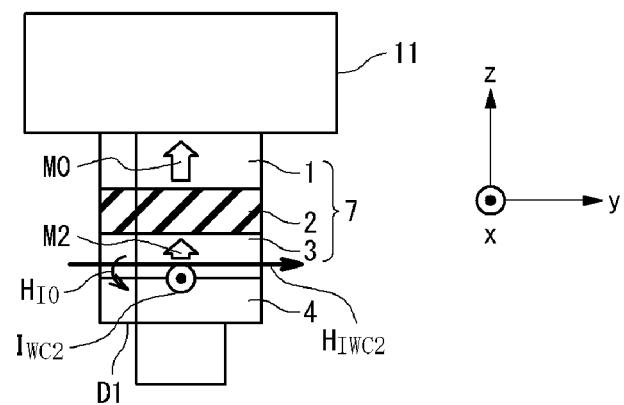
FIG. 17B is a side view showing the data writing method of the magnetic memory element according to the fourth embodiment of the present invention.
Figure 17C:
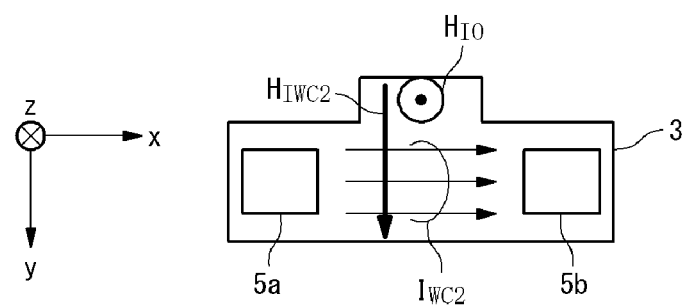
FIG. 17C is a plane view showing the data writing method of the magnetic memory element according to the fourth embodiment of the present invention.

Next, the case that the data "1" is going to be written when the data "0" is stored in the magnetic memory element 9c will be described. FIGS. 17A to 17C are an elevation view, a side view and a plane view showing the data writing method of the magnetic memory element according to the fourth embodiment of the present invention. FIGS. 17A to 17C show a situation that the operation of writing the data "1" is being performed when the data "0" is stored in the magnetic memory element 9c.

For writing the data "1" to the magnetic memory element 9c, first, the writing current $I_{WC2}$ is made to flow from the lower electrode 5a to the lower electrode 5b through the magnetization free layer 3 in the +x direction. At this time, as described in the first embodiment (this figure shows the first example), the magnetic field $H_{IWC2}$ (the Rashba magnetic field) is applied to localized electrons in the +y direction. The localized electrons are electrons assuming magnetization of the magnetization free layer 3. The magnetic field $H_{IWC2}$ acts on the magnetization M2 of the magnetization free layer 3 in the +z direction so as to turn the magnetization M2 to the +y direction. In addition, because of the protrusion portion D1 of the magnetization free layer 3, the writing current $I_{WC2}$ flowing in the magnetization free layer 3 is non-uniform, and therefore, the current density at the protrusion portion D1 is decreased. That is, the current induced magnetic field $H_{10}$ in the −z direction applied to the protrusion portion D1 is stronger than that applied to the other regions. Therefore, the protrusion portion D1 becomes the origin of inversion nucleation due to the current induced magnetic field $H_{10}$. By the combination of the inversion nucleation due to the current induced magnetic field $H_{10}$ at the protrusion portion D1 and the effective magnetic field $H_{IWC2}$, the magnetization M2 of the magnetization free layer 3 in the +z direction turns to the −z direction. That is, the data writing is performed from the state of the data "0" shown in FIGS. 17A to 17C to the state of the data "1" shown in FIGS. 16A to 16C.

Incidentally, as easily understood from the above-mentioned data writing method, an overwriting operation can be performed, the overwriting operation being that the data "0" is going to be written when the data "0" is stored in the magnetic memory element 9c and the data "1" is going to be written when the data "1" is stored in the magnetic memory element 9c.

Figure 18A:
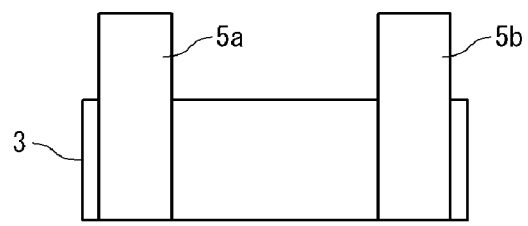
FIG. 18A is a plane view showing a configuration example of the magnetization free layer according to the fourth embodiment of the present invention.
Figure 18B:
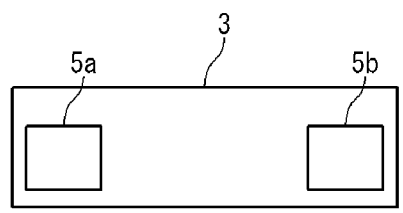
FIG. 18B is a plane view showing the configuration example of the magnetization free layer according to the fourth embodiment of the present invention.
Figure 18C:
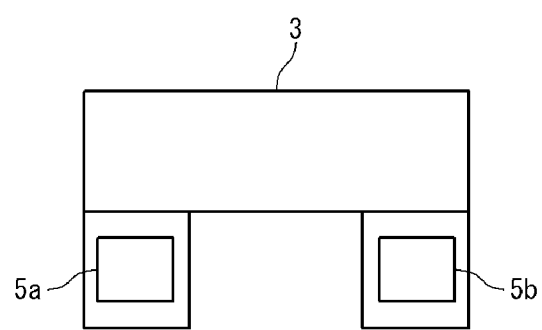
FIG. 18C is a plane view showing the configuration example of the magnetization free layer according to the fourth embodiment of the present invention.
Figure 18D:
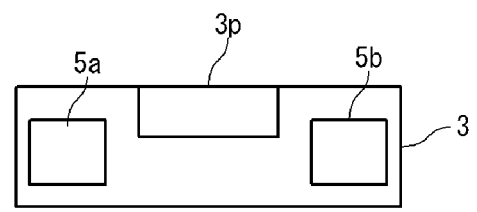
FIG. 18D is a plane view showing the configuration example of the magnetization free layer according to the fourth embodiment of the present invention.

In the present embodiment, as another configuration of the magnetization free layer 3 for acquiring non-uniform current distribution, a configuration shown in FIGS. 18A to 18D may be employed. FIGS. 18A to 18B show methods in which the lower electrodes 5a and 5b are asymmetrically arranged with respect to the longitudinal direction (the current flowing direction) of the magnetization free layer 3. For example, in FIG. 18A, the lower electrodes 5a and 5b are extended in one direction outside the magnetization free layer 3. In FIG. 18B, the lower electrodes 5a and 5b are arranged in deflected positions in the magnetization free layer 3. In FIG. 18C, the magnetization free layer 3 has a configuration having a concave shape. In FIG. 18D, a configuration that a region 3p where inversion nuclear is easily generated is provided in a part of the magnetization free layer 3 can be expected to have the same effect. The region 3p is, for example, a region where etching is performed, ion implantation is performed and a step is placed. In addition, by extending the upper electrode 11 and the lower electrode 5a and 5b around the cell and inducing magnetic fields by the current flowing therein, the perpendicular magnetic field can be applied to the magnetization free layer 3.

The data reading from the magnetic memory element 9c is the same as the third embodiment. In addition, the inversion threshold in the data writing (FIG. 4), the configuration of the magnetic memory (FIG. 14), the layout of the magnetic memory (FIGS. 7A and 7B) and their effects are the same as the third embodiment.

In the present embodiment, the effects similar to the third embodiment can be obtained. In addition, by using material with perpendicular magnetic anisotropy, the writing current necessary for inverting the magnetization can be smaller.

(Fifth Embodiment)

The magnetic memory cell according to the fifth embodiment of the present invention will be described referring to the attached drawings.

The present embodiment is different from the third embodiment in the point that the magnetization reference layer 1 and the magnetization free layer 3 have magnetic anisotropy in a direction inclined with respect to the xy plane in the present invention while they have in-plane magnetic anisotropy in the third embodiment. The different point from the third embodiment will be mainly described below.

Figure 19A:
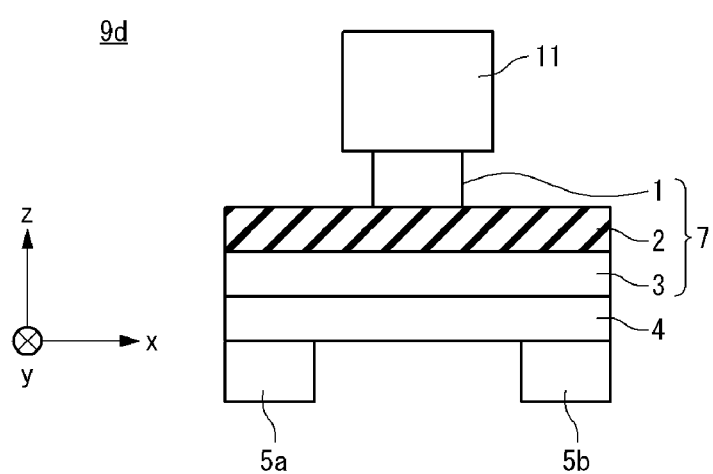
FIG. 19A is an elevation view showing a configuration of the magnetic memory element according to a fifth embodiment of the present invention.
Figure 19B:
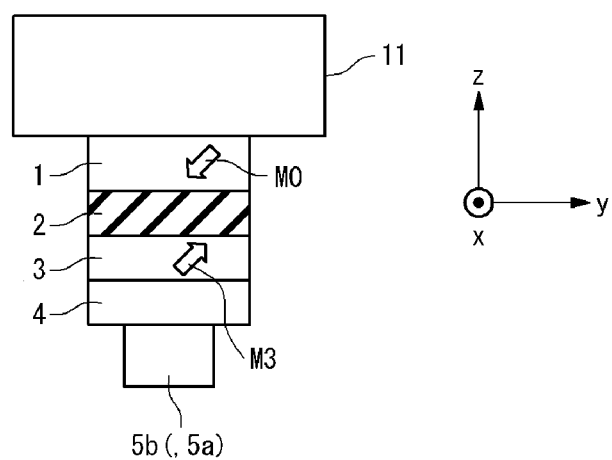
FIG. 19B is a side view showing the configuration of the magnetic memory element according to the fifth embodiment of the present invention.

First, a configuration of the magnetic memory element of the magnetic memory according to the fifth embodiment of the present invention will be described. FIGS. 19A to 19C are an elevation view, a side view and a plane view showing the configuration of the magnetic memory element according to the fifth embodiment of the present invention. The magnetic memory element 9d includes a base layer 4, a magnetization free layer 3, a barrier layer 2, a magnetization reference layer 1, an upper electrode 11 and lower electrodes 5a and 5b.

As described above, differently from the third embodiment, the magnetization reference layer 1 and the magnetization free layer 3 have the magnetic anisotropy in the direction inclined with respect to the xy plane. That is, the magnetization free layer 3 is a ferromagnetic film with magnetic anisotropy in the intermediate direction between in-plane and perpendicular. The magnetization free layer 3 has invertible magnetization M3. In the example of this figure, the magnetization easy axis of the magnetization free layer 3 is inclined in the yz plane and the magnetization free layer 3 can takes a magnetization state in the combination of −z and −y directions and a magnetization state in the combination of +z and +y directions. As a method of inclining the magnetization easy axis of the magnetization free layer 3 in the yz plane, a method of using crystal magnetic anisotropy or strain magnetic anisotropy can be used. In addition, another method of alternately laminating material with perpendicular magnetic anisotropy and material with in-plane magnetic anisotropy can be used.

The material with perpendicular magnetic anisotropy is exemplified by Co/Pt, Co/Ni, CoPt, CoCrPt, CoTa and FePt. The material with in-plane magnetic anisotropy is exemplified by NiFeB, CoFeB and CoFe.

The magnetization reference layer 1 is also a ferromagnetic film with magnetic anisotropy in the intermediate direction between in-plane and perpendicular. In the magnetization reference layer 1, magnetization M0 is fixed. In the example of this figure, the magnetization M0 is fixed in the combination of −z and −y directions inclined in the yz plane. The magnetization reference layer 1 is also formed by using the same method and material as the magnetization free layer 3.

Other constitutive parts of the magnetization reference layer 1 and the magnetization free layer 3, configurations other than the above, and effects of them are similar to the third embodiment.

Next, the data writing of the magnetic memory element of the magnetic memory according to the present embodiment will be described. Here, for purposes of description, it is supposed that the magnetization M0 of the magnetic reference layer 1 is fixed in the combination of −z and −y directions. In addition, it is supposed that the data "0" is stored when the magnetization M2 of the magnetization free layer 3 of the MTJ is in the combination of −z and −y directions, that is, the magnetization M0 of the magnetization reference layer 1 and the magnetization M2 of the magnetization free layer 3 are parallel (the low resistance). It is supposed that the data "1" is stored when the magnetization M2 of the magnetization free layer 3 of the MTJ is in the combination of +z and +y directions, that is, the magnetization M0 of the magnetization reference layer 1 and the magnetization M2 of the magnetization free layer 3 are anti-parallel (the high resistance).

The data writing to the magnetic memory element 9d will be described.

Figure 20A:
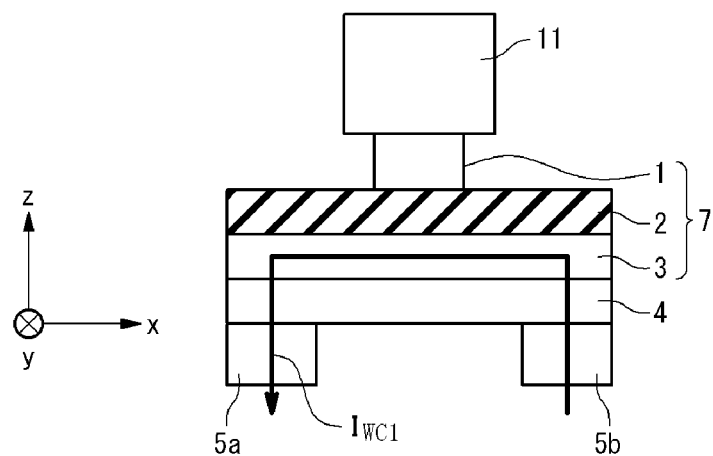
FIG. 20A is an elevation view showing a data writing method of the magnetic memory element according to the fifth embodiment of the present invention.
Figure 20B:
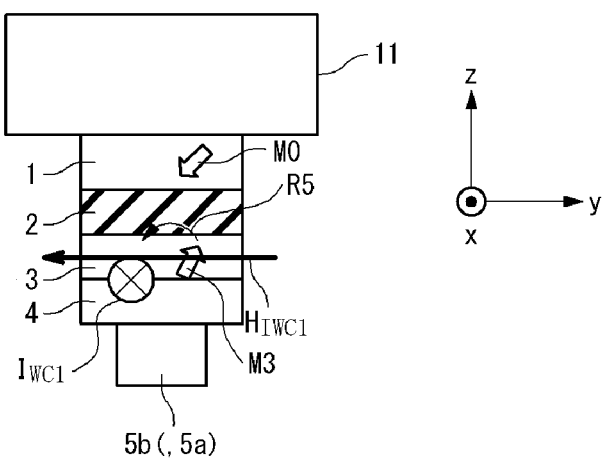
FIG. 20B is a side view showing the data writing method of the magnetic memory element according to the fifth embodiment of the present invention.

First, the case that the data "0" is going to be written when the data "1" is stored in the magnetic memory element 9d will be described. FIGS. 20A to 20B are an elevation view and a side view showing the data writing method of the magnetic memory element according to the fourth embodiment of the present invention. FIGS. 20A to 20B show a situation that the operation of writing the data "0" is being performed when the data "1" is stored in the magnetic memory element 9c.

For writing the data "0" to the magnetic memory element 9d, first, a writing current $I_{IWC1}$ is made to flow from the lower electrode 5b to the lower electrode 5a through the magnetization free layer 3 in the −x direction. At this time, as described in the first embodiment (this figure shows the first example), due to the spin orbit interaction, a magnetic field $H_{IWC1}$ (the Rashba magnetic field) is applied to localized electrons in the −y direction. The localized electrons are electrons assuming magnetization of the magnetization free layer 3. The magnetic field $H_{IWC1}$ acts on the magnetization M2 of the magnetization free layer 3 in the combination of +z and +y directions so as to turn the magnetization M2 to the −y direction. As a result, the magnetization M2 of the magnetization free layer 3 in the combination of +z and +y directions turns to the combination of −z and −y directions as shown in an arrow R5. That is, the data writing is performed from the state of the data "1" shown in FIGS. 20A to 20B to the state of the data "0" shown in FIGS. 21A to 21B as described later.

Figure 21A:
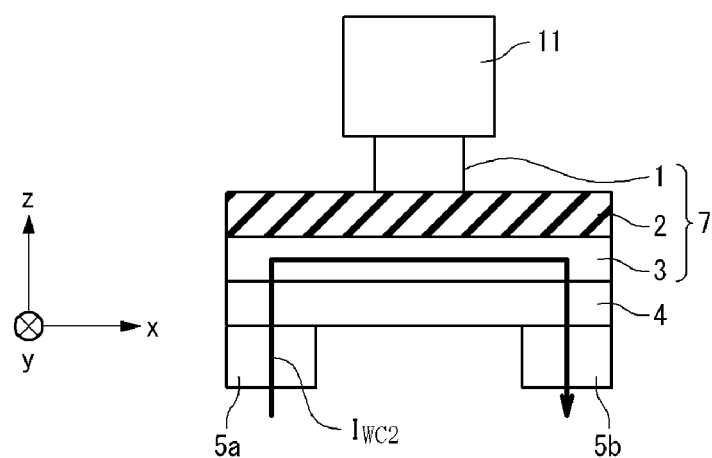
FIG. 21A is an elevation view showing the data writing method of the magnetic memory element according to the fifth embodiment of the present invention.
Figure 21B:
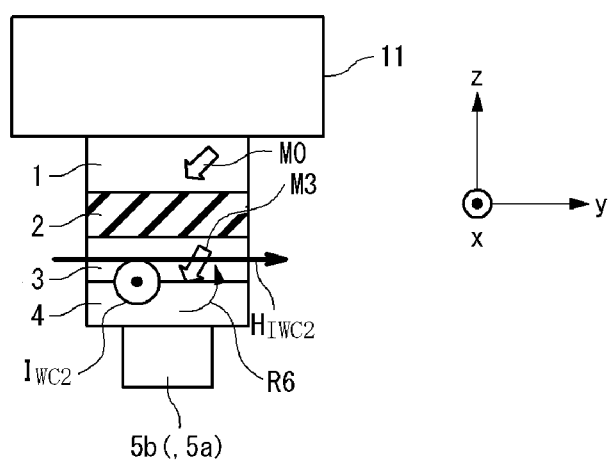
FIG. 21B is a side view showing the data writing method of the magnetic memory element according to the fifth embodiment of the present invention.

Next, the case that the data "1" is going to be written when the data "0" is stored in the magnetic memory element 9d will be described. FIGS. 21A to 21B are an elevation view and a side view showing the data writing method of the magnetic memory element according to the fifth embodiment of the present invention. FIGS. 21A to 21B show a situation that the operation of writing the data "1" is being performed when the data "0" is stored in the magnetic memory element 9d.

For writing the data "1" to the magnetic memory element 9d, first, the writing current $I_{IWC2}$ is made to flow from the lower electrode 5a to the lower electrode 5b through the magnetization free layer 3 in the +x direction. At this time, as described in the first embodiment (this figure shows the first example), due to the spin orbit interaction, the magnetic field $H_{IWC2}$ (the Rashba magnetic field) is applied to localized electrons in the +y direction. The localized electrons are electrons assuming magnetization of the magnetization free layer 3. The magnetic field $H_{IWC2}$ acts on the magnetization M2 of the magnetization free layer 3 in the combination of −z and −y directions so as to turn the magnetization M2 to the +y direction. As a result, the magnetization M2 of the magnetization free layer 3 in the combination of −z and −y directions turns to the combination of +z and +y directions. That is, the data writing is performed from the state of the data "0" shown in FIGS. 21A to 21B to the state of the data "1" shown in FIGS. 20A to 20B.

Incidentally, as easily understood from the above-mentioned data writing method, an overwriting operation can be performed, the overwriting operation being that the data "0" is going to be written when the data "0" is stored in the magnetic memory element 9c and the data "1" is going to be written when the data "1" is stored in the magnetic memory element 9d.

The data reading from the magnetic memory element 9d is the same as the third embodiment.

Figure 22:
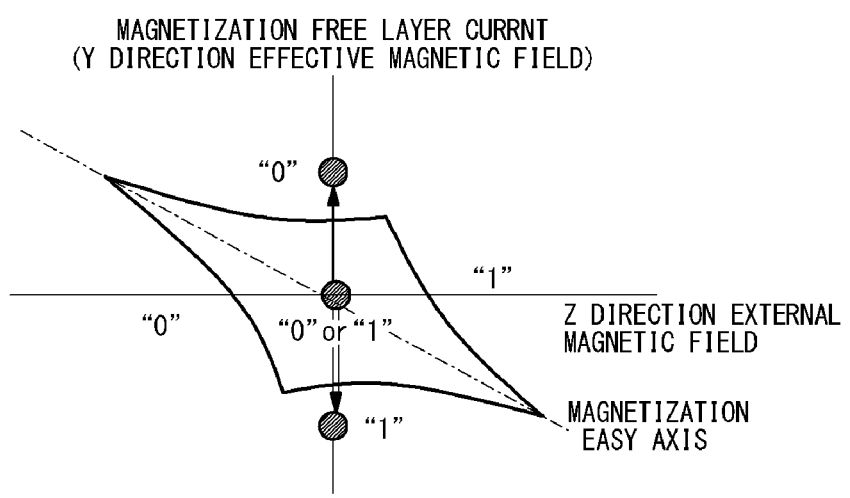
FIG. 22 is a graph showing an outline of an inversion threshold in the data writing.

Here, an inversion threshold (a current necessary to inversion) in the data writing to the magnetic memory element 9d will be described. FIG. 22 is a graph (an asteroid curve) showing an outline of an inversion threshold in the data writing. The vertical axis indicates the current flowing in the magnetization free layer 3, and the horizontal axis indicates the external magnetic field in the z direction. Here, the current flowing in the magnetization free layer 3 of the vertical axis is each of the writing currents $I_{WC1}$ and $I_{WC2}$, which can be seen as the (y direction) effective magnetic fields $H_{IWC1}$ and $H_{IWC2}$. In addition, the external magnetic field in the z direction of horizontal axis is not used in the present invention and therefore is substantially zero (0). This figure shows the data writing arises on and outside the asteroid curve. Here, as shown in this figure, if the magnetization easy axis of the magnetization free layer 3 and the direction of the effective magnetic field ($H_{IWC1}$ and $H_{IWC2}$) generated by the current ($I_{WC2}$ and $I_{WC2}$) flowing in the magnetization free layer 3 are not parallel, the magnetization of the magnetization free layer 3 can be inverted by the positive and negative current flowing in the magnetization free layer 3.

The configuration of the magnetic memory (FIG. 14), the layout of the magnetic memory (FIGS. 7A and 7B) and their effects are the same as the third embodiment.

In the present embodiment, the effects similar to the third embodiment can be obtained.

(Sixth Embodiment)

The magnetic memory cell according to the sixth embodiment of the present invention will be described referring to the attached drawings.

In the present embodiment, in the spin torque writing method using material with perpendicular magnetic anisotropy as the magnetization free layer, the writing current is reduced by using the effective magnetic field (the Rashba magnetic field: described later) based on the spin orbit interaction as an auxiliary magnetic field.

Figure 23A:
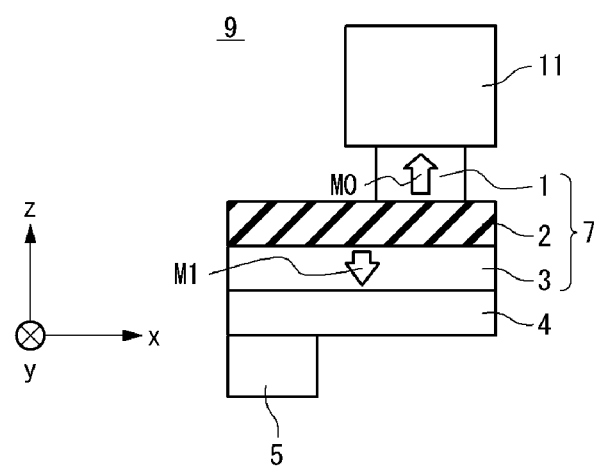
FIG. 23A is an elevation view showing a configuration of the magnetic memory element according to a sixth embodiment of the present invention.
Figure 23B:
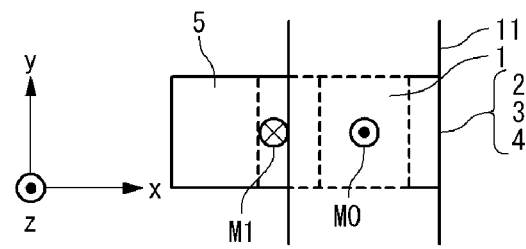
FIG. 23B is a plane view showing the configuration of the magnetic memory element according to the sixth embodiment of the present invention.

First, a configuration of the magnetic memory element of the magnetic memory according to the sixth embodiment of the present invention will be described. FIGS. 23A to 23B are an elevation view and a plane view showing the configuration of the magnetic memory element according to the sixth embodiment of the present invention. The magnetic memory element 9 includes a base layer 4, a magnetization free layer 3, a barrier layer 2, a magnetization reference layer 1, an upper electrode 11 and a lower electrode 5.

The base layer 4 is arranged in parallel with a surface (a xy plane) of a substrate (not shown). The magnetization free layer 3 is arranged on the upper side (the +z side) of the base layer 4 such that the base layer 4 is covered with the magnetization free layer 3. The barrier layer 2 is arranged on the upper side (the +z side) of the magnetization free layer 3 such that the magnetization free layer 3 is covered with the barrier layer 2. The magnetization reference layer 1 is arranged on the upper side (the +z side) of an end portion in the +x side of the barrier layer 2. Each of the base layer 4, the magnetization free layer 3 and the barrier layer 2 has a shape extended along the x direction beyond the magnetization reference layer 1. The magnetization free layer 3, the barrier layer 2 and the magnetization reference layer 1 constitute a MTJ (a magnetic tunnel junction) 7. The magnetic memory element 9 stores data by using a magnetization direction of the magnetization free layer 3 of the MTJ 7.

The upper electrode 11 is connected to the upper side (the +z side) of an end portion in the +x side of the magnetization reference layer 1. The upper electrode 11 is exemplified by a bit line. The lower electrode 5 is connected to a lower side (the −z side) of an end portion in the −x side of the base layer 4.

That is, the lower electrode 5 is not connected to the directly below the magnetization reference layer 1, but connected to the extended portion of the base layer 4 (, the magnetization free layer 3 and the barrier layer 2). This makes a writing current (described later) flow through the magnetization free layer 3 not only in the z direction but also in the in-plane direction of the xy plane certainly to surely generate the Rashba magnetic field. Here, the end portion may be near the end as a whole, and is not required to be strictly at the end. In addition, the lower electrode 5 is connected to a selection transistor (described later). A current can be applied from one of the upper electrode 11 and the lower electrode 5 to the other in the magnetization free layer 3.

The base layer 4 is composed of material different from material of the barrier layer 2 such that the Rashba magnetic field (described later) is made to be generated in the magnetization free layer 3. In addition, since the base layer 4 is arranged between the lower electrode 5 and the magnetization free layer 3, the base layer 4 is preferably a conductive film such that a current easily passes through in the base layer 4. However, the base layer 4 is preferably composed of material which can avoid a writing current from flowing selectively through the base layer 4 not through the magnetization free layer 3. The base layer 4 is exemplified by a Ta film, a Pt film, and a lamination film thereof.

The magnetization free layer 3 is a ferromagnetic film with perpendicular magnetic anisotropy. The magnetization free layer 3 has invertible magnetization M1. In the example of this figure, the magnetization free layer 3 can take the magnetization state of a +z direction and the magnetization state of a −z direction. The magnetization free layer 3 is magnetized approximately uniformly. That is, there is substantially no domain wall in the magnetization free layer 3. The magnetization free layer 3 is exemplified by a CoCrPt film, a Co/Pt film, a Co/Ni film, a Fe/Pt film, a CoFeB film and a lamination film thereof. The magnetization free layer 3 is preferably very thin such that the Rashba magnetic field is made to be generated. For example, the magnetization free layer 3 has preferably the film thickness from about 0.5 nm to about 1.5 nm. In the film thickness of less than 0.5 nm, it is hard to control a film formation. This film thickness is, as compared with a several nm (e.g. about 5 nm) of a magnetization free layer (or a free layer) in a usual MTJ, thin and a fraction of the several nm. In addition, the xy plane shape of the magnetization free layer 3 is larger than the xy plane shape of the magnetization reference layer 1 (for the extended portion of the magnetization free layer 3, the base layer 4 and the barrier layer 2). Therefore, a writing current (described later) supplied from or drawn into the magnetization reference layer 1 is not only pass through the magnetization free layer 3 but also certainly move in the in-plane direction inside the xy plane of the magnetization free layer 3 and the Rashba magnetic field is surely generated.

The barrier layer 2 is composed of material different from material of the base layer 4 such that the Rashba magnetic field (described later) is made to be generated in the magnetization free layer 3. In addition, the barrier layer 2 is formed of non-magnetic film because the barrier layer 2 is provided as a tunnel barrier layer in the MTJ 7. The barrier layer 2 is exemplified by an insulating film such as an $Al_2O_3$ film and an MgO film. The barrier layer 2 has preferably the film thickness, for example, from about 1.0 nm to about 2.0 nm with respect to the above-mentioned exemplified film thickness of the magnetization free layer 3. That is, the film thickness is similar to the film thickness of the magnetization free layer 3.

The magnetization reference layer 1 is a ferromagnetic film with perpendicular magnetic anisotropy. In the magnetization reference layer 1, magnetization M0 is fixed. In the example of this figure, the magnetization M0 is fixed in the +z direction. The magnetization reference layer 1 is exemplified by a CoCrPt film, a Co/Pt film, a Co/Ni film, a Fe/Pt film, a CoFeB film, and a lamination film thereof. The magnetization reference layer 1 may be also said that it is formed at the upper side (the +z side) of an end portion (a+x side end portion) of the barrier layer 2 corresponding to an end portion at one side (the +x side) of the magnetization free layer 3.

The magnetic memory element 9 has a configuration that the upper side boundary and the lower side boundary of the magnetization free layer 3 are different from each other. In the example of this figure, the base layer 4 is joined to the boundary of the lower side (the −z side) of the magnetization free layer 3, and the barrier layer 2 composed of material different from material of the base layer 4 is joined to the boundary of the upper side (the +z side) of the magnetization free layer 3. That is, in the magnetization free layer 3, the space symmetry is broken with respect to the z direction. In this case, when a current is made to flow in the in-plane direction (e.g. the x direction) in the magnetization free layer 3, based on the spin orbit interaction, an effective magnetic field is applied to localized electrons in the direction (the y direction) of a cross product of the direction (the x direction) of the current and the direction (the z direction) where the space symmetry is broken. The localized electrons are electrons assuming magnetization of the magnetization free layer 3. This effective magnetic field is called the Rashba magnetic field and is known that it is as large as kOe order per current of $1.0 \times 10^{12}$ A/m$^2$. In the present embodiment, by using this Rashba magnetic field for assisting the spin injection magnetization inversion which uses the magnetization reference layer 1, writing data to the MTJ 7, that is, inverting the magnetization of the magnetization free layer 3 is performed.

Data reading and data writing of the magnetic memory element of the magnetic memory according to the present embodiment will be described below. Here, for descriptive purposes, it is supposed that the magnetization M0 of the magnetization reference layer 1 is fixed in the +z direction. In addition, it is supposed that when the magnetization M1 of the magnetization free layer 3 of the MTJ 7 is in the +z direction, that is the magnetization M0 of the magnetization reference layer 1 and the magnetization M1 of the magnetization free layer 3 are parallel (low resistance), the data "0" is stored. Furthermore, it is supposed that when the magnetization M1 of the magnetization free layer 3 of the MTJ 7 is in the −z direction, that is the magnetization M0 of the magnetization reference layer 1 and the magnetization M1 of the magnetization free layer 3 are anti-parallel (high resistance), the data "1" is stored.

The data writing to the magnetic memory element 9 will be described.

Figure 24:
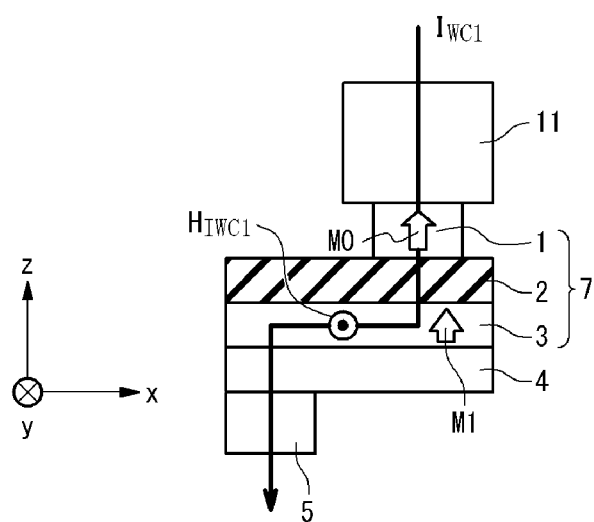
FIG. 24 is an elevation view showing a data writing method of the magnetic memory element according to the sixth embodiment of the present invention.

First, the case that the data "1" is going to be written when the data "0" is stored in the magnetic memory element 9 will be described. FIG. 24 is an elevation view showing a data writing method of the magnetic memory element according to the sixth embodiment of the present invention. FIG. 24 shows a situation that the operation of writing the data "1" is being performed when the data "0" is stored in the magnetic memory element 9.

For writing the data "1" to the magnetic memory element 9, first, a writing current $I_{WC1}$ is made to flow from the upper electrode 11 to the lower electrode 5 through the magnetization reference layer 1 and the magnetization free layer 3. At this time, as described above, the boundary at the lower side (the −z side) of the magnetization free layer 3 is joined to the base layer 4 and the boundary at the upper side (the +z direction) is joined to the barrier layer 2. Therefore, the boundaries at the both sides of the magnetization free layer 3 have the different structures. That is, in the magnetization free layer 3, the space symmetry is broken with respect to the z direction. Accordingly, when the writing current $I_{WC1}$ is made to flow in the −x direction in the plane of the magnetization free layer 3, due to the spin orbit interaction, a magnetic field $H_{WC1}$ (the Rashba magnetic field) is applied to localized electrons in the direction (the y direction) of a cross product of the direction (the x direction) of the writing current $I_{WC1}$ and the direction (the z direction) where the space symmetry is broken. The localized electrons are electrons assuming magnetization of the magnetization free layer 3. For example, in the case that the base layer 4, the magnetization free layer 3 and the barrier layer 2 are Ta, CoFeB and MgO and the writing current $I_{WC1}$ is made to flow in the −x direction, the magnetic field $H_{IWC1}$ (the Rashba magnetic field) is generated in the −y direction (hereinafter referred to as the first example). In the case that the base layer 4, the magnetization free layer 3 and the barrier layer 2 are Pt, Co and AlOx and the writing current $I_{WC1}$ is made to flow in the −x direction, the magnetic field $H_{IWC1}$ (the Rashba magnetic field) is generated in the +y direction (hereinafter referred to as the second example). In this way, whether the −y direction or the +y direction depends on material. The example of this figure shows that the magnetic field $H_{IWC1}$ (the Rashba magnetic field) is generated in the −y direction. The magnetic field $H_{IWC1}$ acts on the magnetization M1 of the magnetization free layer 3 in the +z direction so as to turn the magnetization M1 to the −y direction. In addition, when the writing current $I_{WC1}$ flows from the magnetization reference layer 1 to the magnetization free layer 3, conduction electrons flow from the magnetization free layer 3 to the magnetization reference layer 1. As a result, due to the spin torque, the magnetization M1 of the magnetization free layer 3 is transferred from parallel to anti-parallel with respect to the magnetization M0 of the magnetization reference layer 1. That is, the transition from the +z direction to the −z direction arises. At this time, since the Rashba magnetic field $I_{IWC1}$ assists the transition, the writing current $I_{WC1}$ lower than the conventional writing current makes the magnetization M1 of the magnetization free layer 3 in the +z direction inverted to the −z direction. That is, the data writing is performed from the state of the data "0" shown in FIG. 24 to the state of the data "1" shown in FIG. 25 as described later.

Figure 25:
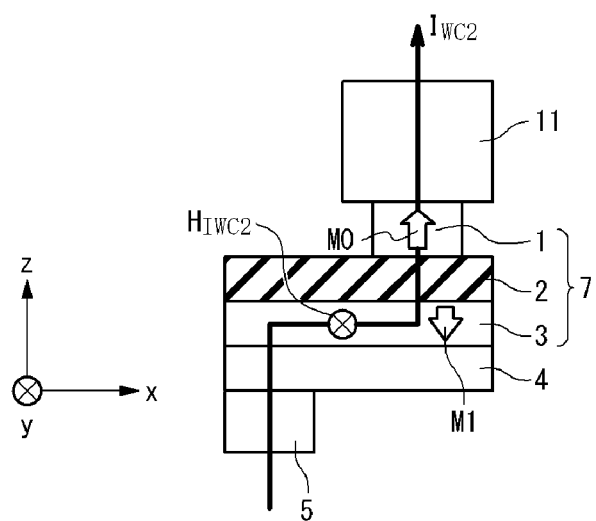
FIG. 25 is an elevation view showing the data writing method of the magnetic memory element according to the sixth embodiment of the present invention.

Next, the case that the data "0" is going to be written when the data "1" is stored in the magnetic memory element 9 will be described. FIG. 25 is an elevation view showing a data writing method of the magnetic memory element according to the sixth embodiment of the present invention. FIG. 25 show a situation that the operation of writing the data "0" is being performed when the data "1" is stored in the magnetic memory element 9.

For writing the data "0" to the magnetic memory element 9, first, the writing current $I_{WC2}$ is made to flow from the lower electrode 5 to the upper electrode 11 through the magnetization free layer 3 and the magnetization reference layer 1. At this time, as described above (this figure shows the first example), when the writing current $I_{WC2}$ is made to flow in the +x direction in the plane of the magnetization free layer 3, due to the spin orbit interaction, the magnetic field $H_{IWC2}$ (the Rashba magnetic field) is applied to localized electrons in the +y direction. The localized electrons are electrons assuming magnetization of the magnetization free layer 3. The magnetic field $H_{IWC2}$ acts on the magnetization M1 of the magnetization free layer 3 in the −z direction so as to turn the magnetization M1 to the +y direction. In addition, when the writing current $I_{WC2}$ flows from the magnetization free layer 3 to the magnetization reference layer 1, conduction electrons flow from the magnetization reference layer 1 to the magnetization free layer 3. As a result, due to the spin torque, the magnetization M1 of the magnetization free layer 3 is transferred from anti-parallel to parallel with respect to the magnetization M0 of the magnetization reference layer 1. That is, the transition from the −z direction to the +z direction arises. At this time, since the Rashba magnetic field $H_{I_{WC2}}$ assists the transition, the writing current $I_{WC2}$ lower than the conventional writing current makes the magnetization M1 of the magnetization free layer 3 in the −z direction inverted to the +z direction. That is, the data writing is performed from the state of the data "1" shown in FIG. 25 to the state of the data "0" shown in FIG. 24.

Incidentally, as easily understood from the above-mentioned data writing method, an overwriting operation can be performed, the overwriting operation being that the data "0" is going to be written when the data "0" is stored in the magnetic memory element 9 and the data "1" is going to be written when the data "1" is stored in the magnetic memory element 9.

Next, the data reading from the magnetic memory element 9 will be described. The data reading method is the same as the usual reading method for the MTJ 7 including the magnetization free layer 3, the barrier layer 2 and the magnetization reference layer 1. For example, a reading current with a constant current value is made to flow between the upper electrode 11 and the lower electrode 5, that is, in the MTJ 7. Then, by comparing a reference voltage with a voltage between the upper electrode 11 and the lower electrode 5 generated by the reading current, the magnetoresistance value of the MTJ 7, that is, the data as the direction of the magnetization of the magnetization free layer 3 is read.

Incidentally, a plane shape of the magnetization free layer 3 may be not only a rectangle as shown in FIG. 23B, but also an ellipse, an oval and a shape that a part of each of the rectangle, the ellipse and the oval in their longitudinal direction is concaved. In this regard, the magnetization direction of the magnetization free layer 3 does not completely point to one direction homogeneously. However, since there is no clear domain wall in the magnetization free layer 3, the present embodiment is described that the magnetization free layer 3 is homogeneously magnetized.

Figure 26:
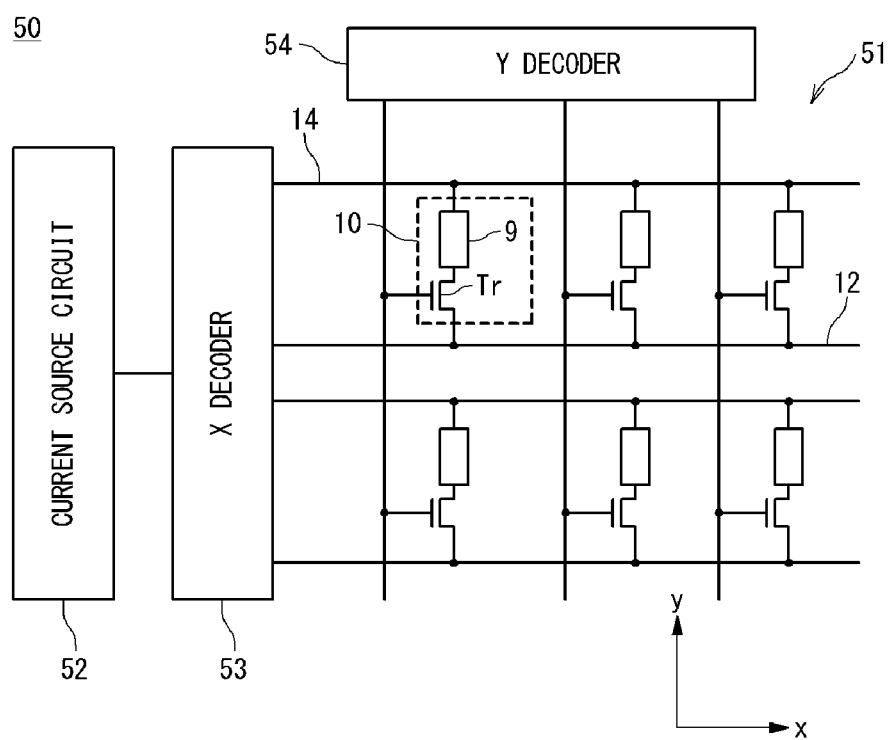
FIG. 26 is a block diagram showing an example of a configuration of a magnetic memory according to the sixth embodiment of the present invention.

FIG. 26 is a block diagram showing an example of a configuration of a magnetic memory according to the sixth embodiment of the present invention. The magnetic memory 50 includes a memory cell array 51, a current source circuit 52, a X decoder 53, and a Y decoder 54. These elements are not limited to the above elements if these elements have functions similar to functions described later.

The memory cell array 51 includes a plurality of memory cells 10, a plurality of bit lines 11, a plurality of writing lines 12, and a plurality of word lines 14. The word line 14 is connected to the Y decoder 54 at one end, and is extended to the y direction. The bit line 11 is connected to the X decoder 53 at one end, is extended to the x direction. The writing line 12 is connected to the X decoder 53 at one end, and is extended to the x direction. The memory cell 10 includes a selection transistor Tr and the magnetic memory element 9. The selection transistor Tr is connected to the writing line 12 at one of the source and drain, is connected to the lower electrode 5 of the magnetic memory element 9 at the other of the source and drain, and is connected to the word line 14 at the gate. The magnetization reference layer 1 of the magnetic memory element 9 is connected to the bit line 11 as the upper electrode.

The X decoder 53 selects a combination of a selection bit line 11 and a selection writing line 12 from the plurality of bit lines 11 and the plurality of writing lines 12 when the writing operation and reading operation are performed. The Y decoder 54 selects a selection word line 14 from the plurality of word lines 14 when the writing operation and reading operation are performed. The current source circuit 52 supplies or draws the writing current $I_{WB}$ when the writing operation is performed, and supplies or draws the reading current $I_R$ when the reading operation is performed. The X decoder 53, the Y decoder 54, and the current source circuit 52 are supposed to be a writing current control circuit which applies the writing current to the writing target memory cell 10.

This magnetic memory may be used for a single memory (a MRAM), or may be used for a memory section in a memory embedded microcomputer (a semiconductor device including the memory section and a logic section (not shown)).

Next, an operation of the magnetic memory according to the sixth embodiment of the present invention will be described. In the writing operation, first, the Y decoder 54 selects a selection word line 14. Accordingly, a selection transistor Tr connected to the selection word line 14 at the gate is turned on. Next, the X decoder 53 selects a combination of a selection bit line 11 and a selection writing line 12. As a result, a writing cell 10 as a target memory cell 10 to which data is written is selected. Next, the current source circuit 52 performs supplying or drawing a writing current $I_{WC1}$ or $I_{WC2}$ on the writing cell 10. At this time, a current path is (the current source circuit 52—) the X decoder 53—the selection bit line 11—the writing cell 10—the selection writing line 12—the X decoder 53. Accordingly, by the action of the magnetization inversion due to the spin torque of the magnetization reference layer 1 of the writing cell 10 and the action of the effective magnetic field $I_{IWC1}$ or $H_{IWC2}$ due to applying the writing current $I_{WC1}$ or $I_{WC2}$ to the magnetization free layer 3, the magnetization of the magnetization free layer 3 of the selected writing cell 10 can be inverted.

In the present embodiment, the writing current ($I_{WC1}$ or $I_{WC2}$) flows not only in the direction perpendicular to the MTJ 7 but also in the in-plane direction of the xy plane of the magnetization free layer 3. Therefore, the writing current can be applied for not only the magnetization inversion action based on the spin torque but also the electric current magnetic field conversion based on the spin orbit interaction. As a result, the spin orbit interaction can be used for assisting the magnetization inversion, and therefore, the writing current can be reduced. Incidentally, in the above circuit configuration, there is no half selection problem on the memory cells in the X direction.

Next, a reading operation of the magnetic memory cell will be described. In the reading operation, the Y decoder 54 selects a selection word line 14. Accordingly, a selection transistor Tr connected to the selection word line 14 at the gate is turned on. Next, the X decoder 53 selects a selection bit line 11 and a selection writing line 12. According to the above, a reading cell 10 as a target memory cell 10 from which data is read is selected. The current source circuit 52 performs supplying or drawing a reading current $I_R$ on the reading cell 10. At this time, the current path is (the current source circuit 52—) the X decoder 53—the selection bit line 11—the reading cell 10—the selection writing line 12—the X decoder 53. Accordingly, the reading current flows in the MTJ 7 of the reading cell 10. Consequently, for example, by using a sense amplifier (not shown here) connected to the X decoder 53 or the like, the resistance of the MTJ 7 is detected and the data is read.

As described above, the magnetic memory of the present invention has a configuration (one side is the barrier layer 2 and the other side is the base layer 4) that the upper side boundary and the lower side boundary of the magnetization free layer 3 are different from each other. That is, in the magnetization free layer 3, the space symmetry is broken. In this case, when the writing current $I_{WC}$ is made to flow in the in-plane direction in the magnetization free layer 3, based on the spin orbit interaction, the effective magnetic field (the Rashba magnetic field) $H_{IWC}$ is applied to localized electrons in the direction (the y direction) of the cross product of the direction (the x direction) of the writing current $I_{WC}$ and the direction (the z direction) where the space symmetry is broken. The localized electrons are electrons assuming magnetization of the magnetization free layer 3. Therefore, by using the Rashba magnetic field $H_{IWC}$ and the spin torque magnetization inversion action due to conduction electrons flowing from one of the magnetization reference layer 1 and the magnetization free layer 3 to the other, the magnetization of the magnetization free layer 3 magnetized approximately uniformly (a substantial domain wall does not exist) can be inverted. That is, data can be written in the magnetization free layer 3. At this time, by concurrently using the Rashba magnetic field $H_{IWC}$ and the spin torque magnetization inversion action, the writing current $I_{WB}$ can be small. In addition, the magnetization free layer 3 is magnetized approximately uniformly and thus it is unnecessary to introduce a domain wall. Therefore, an initializing step is not required.

(Seventh Embodiment)

The magnetic memory cell according to the seventh embodiment of the present invention will be described referring to the attached drawings.

The present embodiment is different from the sixth embodiment in the point that the magnetization reference layer 1 and the magnetization free layer 3 have in-plane magnetic anisotropy in the present invention while they have perpendicular magnetic anisotropy in the sixth embodiment. The different point from the sixth embodiment will be mainly described below.

Figure 27A:
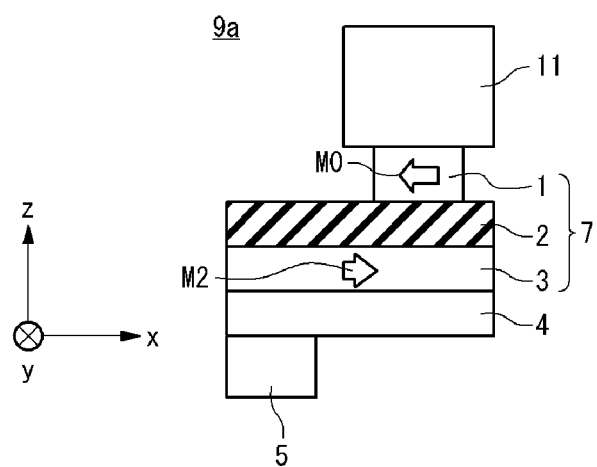
FIG. 27A is an elevation view showing a configuration of the magnetic memory element according to a seventh embodiment of the present invention.
Figure 27B:
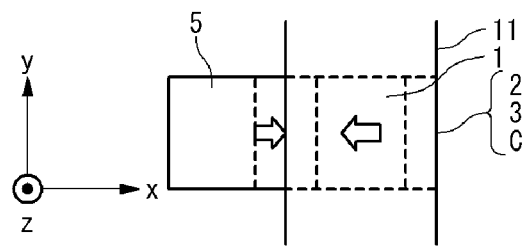
FIG. 27B is a plane view showing the configuration of the magnetic memory element according to the seventh embodiment of the present invention.

First, a configuration of the magnetic memory element of the magnetic memory according to the seventh embodiment of the present invention will be described. FIGS. 27A to 27B are an elevation view and a plane view showing the configuration of the magnetic memory element according to the seventh embodiment of the present invention. The magnetic memory element 9a includes a base layer 4, a magnetization free layer 3, a barrier layer 2, a magnetization reference layer 1, an upper electrode 11 and a lower electrode 5.

As described above, differently from the sixth embodiment, the magnetization reference layer 1 and the magnetization free layer 3 have in-plane magnetic anisotropy. That is, the magnetization free layer 3 is a ferromagnetic film with in-plane magnetic anisotropy. The magnetization free layer 3 has invertible magnetization M2. In the example of this figure, the magnetization free layer 3 can take the magnetization state of a −x direction and the magnetization state of a +x direction. The magnetization free layer 3 is exemplified by a NiFe film, a CoFe film, a CoFeB film and a lamination film thereof. On the other hand, the magnetization reference layer 1 is a ferromagnetic film with in-plane magnetic anisotropy. In the magnetization reference layer 1, magnetization M0 is fixed. In the example of this figure, the magnetization M0 is fixed in the −x direction. The magnetization reference layer 1 is exemplified by a NiFe film, a CoFe film, a CoFeB film and a lamination film thereof.

Other constitutive parts of the magnetization reference layer 1 and the magnetization free layer 3, configurations other than the above, and effects of them are similar to the sixth embodiment.

Data reading and data writing of the magnetic memory element of the magnetic memory according to the present embodiment will be described below. Here, for descriptive purposes, it is supposed that the magnetization M0 of the magnetization reference layer 1 is fixed in the −x direction. In addition, it is supposed that when the magnetization M2 of the magnetization free layer 3 of the MTJ 7 is in the −x direction, that is the magnetization M0 of the magnetization reference layer 1 and the magnetization M2 of the magnetization free layer 3 are parallel (low resistance), the data "0" is stored. Furthermore, it is supposed that when the magnetization M2 of the magnetization free layer 3 of the MTJ 7 is in the +x direction, that is the magnetization M0 of the magnetization reference layer 1 and the magnetization M2 of the magnetization free layer 3 are anti-parallel (high resistance), the data "1" is stored.

The data writing to the magnetic memory element 9a will be described.

Figure 28:
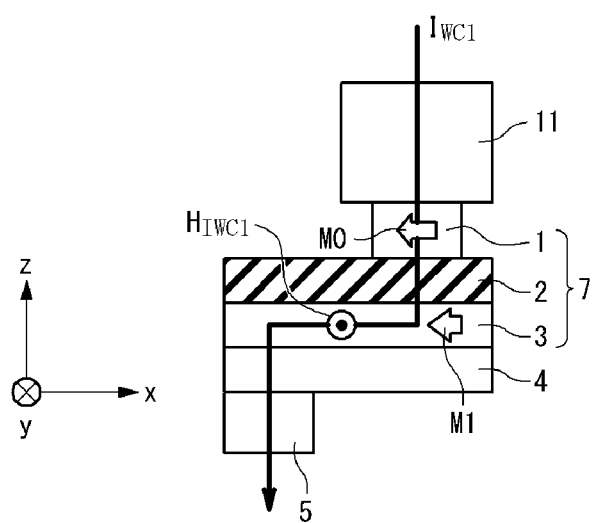
FIG. 28 is an elevation view showing a data writing method of the magnetic memory element according to the seventh embodiment of the present invention.

First, the case that the data "1" is going to be written when the data "0" is stored in the magnetic memory element 9a will be described. FIG. 28 is an elevation view showing a data writing method of the magnetic memory element according to the seventh embodiment of the present invention. FIG. 28 shows a situation that the operation of writing the data "1" is being performed when the data "0" is stored in the magnetic memory element 9a.

For writing the data "1" to the magnetic memory element 9a, first, a writing current $I_{WC1}$ is made to flow from the upper electrode 11 to the lower electrode 5 through the magnetization reference layer 1 and the magnetization free layer 3. At this time, as described in the sixth embodiment (this figure shows the first example), when the writing current $I_{WC1}$ is made to flow in the −x direction in the plane of the magnetization free layer 3, due to the spin orbit interaction, a magnetic field $H_{IWC1}$ (the Rashba magnetic field) is applied to localized electrons in the −y direction. The localized electrons are electrons assuming magnetization of the magnetization free layer 3. The magnetic field $H_{IWC1}$ acts on the magnetization M2 of the magnetization free layer 3 in the −x direction so as to turn the magnetization M2 to the −y direction. In addition, when the writing current $I_{WC1}$ flows from the magnetization reference layer 1 to the magnetization free layer 3, conduction electrons flow from the magnetization free layer 3 to the magnetization reference layer 1. As a result, due to the spin torque, the magnetization M2 of the magnetization free layer 3 is transferred from parallel to anti-parallel with respect to the magnetization M0 of the magnetization reference layer 1. That is, the transition from the −x direction to the +x direction arises. At this time, since the Rashba magnetic field $H_{IWC1}$ assists the transition, the writing current $I_{WC1}$ lower than the conventional writing current makes the magnetization M2 of the magnetization free layer 3 in the −x direction inverted to the +x direction. That is, the data writing is performed from the state of the data "0" shown in FIG. 28 to the state of the data "1" shown in FIG. 29 as described later.

Figure 29:
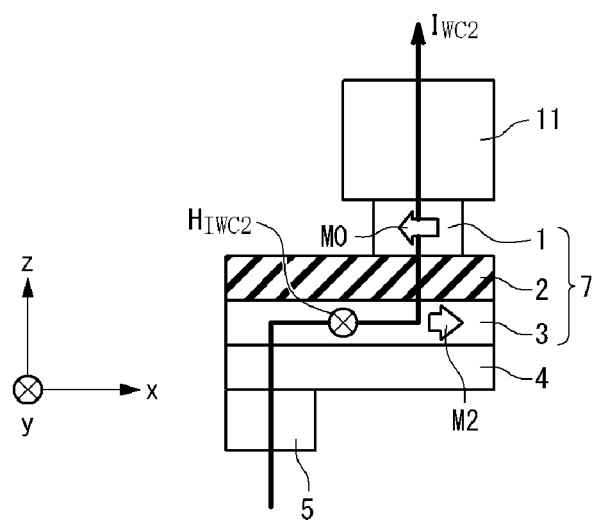
FIG. 29 is an elevation view showing the data writing method of the magnetic memory element according to the seventh embodiment of the present invention.

Next, the case that the data "0" is going to be written when the data "1" is stored in the magnetic memory element 9a will be described. FIG. 29 is an elevation view showing a data writing method of the magnetic memory element according to the seventh embodiment of the present invention. FIG. 29 show a situation that the operation of writing the data "0" is being performed when the data "1" is stored in the magnetic memory element 9a.

For writing the data "0" to the magnetic memory element 9a, first, the writing current $I_{WC2}$ is made to flow from the lower electrode 5 to the upper electrode 11 through the magnetization free layer 3 and the magnetization reference layer 1. At this time, as described in the sixth embodiment (this figure shows the first example), when the writing current $I_{WC2}$ is made to flow in the +x direction in the plane of the magnetization free layer 3, due to the spin orbit interaction, the magnetic field $H_{IWC2}$ (the Rashba magnetic field) is applied to localized electrons in the +y direction. The localized electrons are electrons assuming magnetization of the magnetization free layer 3. The magnetic field $H_{IWC2}$ acts on the magnetization M2 of the magnetization free layer 3 in the +x direction so as to turn the magnetization M2 to the +y direction. In addition, when the writing current $I_{WC2}$ flows from the magnetization free layer 3 to the magnetization reference layer 1, conduction electrons flow from the magnetization reference layer 1 to the magnetization free layer 3. As a result, due to the spin torque, the magnetization M2 of the magnetization free layer 3 is transferred from anti-parallel to parallel with respect to the magnetization M0 of the magnetization reference layer 1. That is, the transition from the +x direction to the −x direction arises. At this time, since the Rashba magnetic field $H_{IWC2}$ assists the transition, the writing current $I_{WC2}$ lower than the conventional writing current makes the magnetization M2 of the magnetization free layer 3 in the +x direction inverted to the −x direction. That is, the data writing is performed from the state of the data "1" shown in FIG. 29 to the state of the data "0" shown in FIG. 28.

Incidentally, as easily understood from the above-mentioned data writing method, an overwriting operation can be performed, the overwriting operation being that the data "0" is going to be written when the data "0" is stored in the magnetic memory element 9a and the data "1" is going to be written when the data "1" is stored in the magnetic memory element 9a.

The data reading from the magnetic memory element 9a is the same as the sixth embodiment. In addition, the configuration of the magnetic memory (FIG. 26), the operations of writing and reading the magnetic memory, and their effects are the same as the sixth embodiment.

In the present embodiment, the effects same as the sixth embodiment can be obtained.

(Eighth Embodiment)

The magnetic memory cell according to the eighth embodiment of the present invention will be described referring to the attached drawings.

The present embodiment is different from the sixth embodiment in the point that the base layer 4, the magnetization free layer 3 and the barrier layer 2 have a shape extended to both side of the magnetization reference layer 1 in the x axis direction in the present invention while they have the shape extended to only one side of the magnetization reference layer 1 in the sixth embodiment. The different point from the sixth embodiment will be mainly described below.

Figure 30:
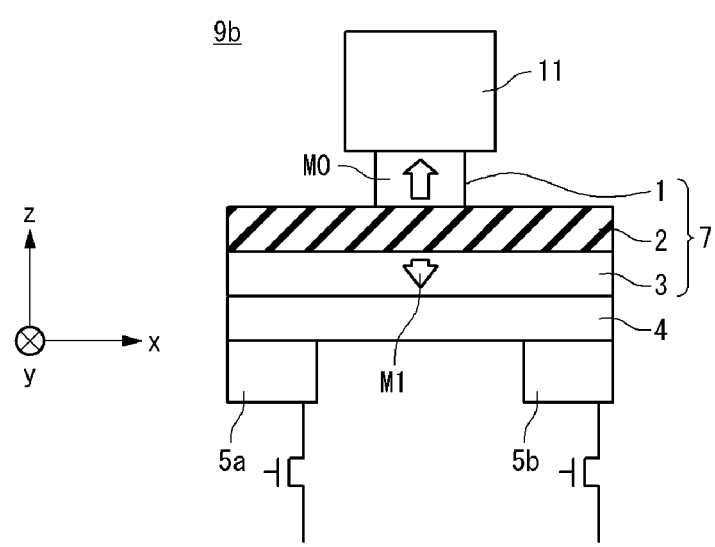
FIG. 30 is an elevation view showing a configuration of the magnetic memory element according to an eighth embodiment of the present invention.

First, a configuration of the magnetic memory element of the magnetic memory according to the eighth embodiment of the present invention will be described. FIG. 30 is an elevation view showing the configuration of the magnetic memory element according to the eighth embodiment of the present invention. The magnetic memory element 9b includes a base layer 4, a magnetization free layer 3, a barrier layer 2, a magnetization reference layer 1, an upper electrode 11 and lower electrodes 5a and 5b.

As described above, differently from the sixth embodiment, the base layer 4, the magnetization free layer 3 and the barrier layer 2 have the shape extended to the both side (the +x side and the −x side) of the magnetization reference layer 1 in the x axis direction. Accordingly, the lower electrodes 5a and 5b are connected to both of the extended end portions. That is, the lower electrode 5a is connected to the extended portion of the −x side. The lower electrode 5b is connected to the extended portion of the +x side. Each of the lower electrodes 5a and 5b is connected to a selection transistor Tr. In the present embodiment, still another writing current will be made to flow from one of the lower electrodes 5a and 5b to the other.

According to this shape, the effective magnetic field (the Rashba magnetic field) can be controlled by using the writing current flowing from one of the lower electrodes 5a and 5b to the other through the selection transistors Tr, while the spin torque can be controlled by using the wiring current flowing from one of the upper electrode 11 and any or both of the lower electrodes 5a and 5b to the other. That is, in the present invention, the effective magnetic field can be controlled separately from the spin torque.

Other constitutive parts of the base layer 4, the magnetization free layer 3, the barrier layer 2, the magnetization reference layer 1 and the lower electrodes 5a and 5b, configurations other than the above, and effects of them are similar to the sixth embodiment.

Data reading and data writing of the magnetic memory element of the magnetic memory according to the present embodiment will be described below. Here, for descriptive purposes, it is supposed that the magnetization M0 of the magnetization reference layer 1 is fixed in the +z direction. In addition, it is supposed that when the magnetization M1 of the magnetization free layer 3 of the MTJ 7 is in the +z direction, that is the magnetization M0 of the magnetization reference layer 1 and the magnetization M1 of the magnetization free layer 3 are parallel (low resistance), the data "0" is stored. Furthermore, it is supposed that when the magnetization M1 of the magnetization free layer 3 of the MTJ 7 is in the −z direction, that is the magnetization M0 of the magnetization reference layer 1 and the magnetization M1 of the magnetization free layer 3 are anti-parallel (high resistance), the data "1" is stored.

The data writing to the magnetic memory element 9b will be described.

Figure 31:
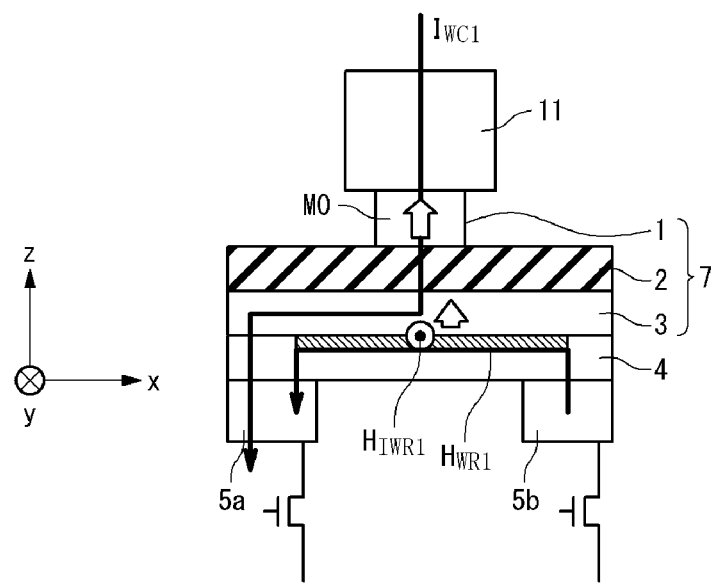
FIG. 31 is an elevation view showing a data writing method of the magnetic memory element according to the eighth embodiment of the present invention.

First, the case that the data "1" is going to be written when the data "0" is stored in the magnetic memory element 9b will be described. FIG. 31 is an elevation view showing a data writing method of the magnetic memory element according to the eighth embodiment of the present invention. FIG. 31 shows a situation that the operation of writing the data "1" is being performed when the data "0" is stored in the magnetic memory element 9b.

For writing the data "1" to the magnetic memory element 9b, first, a writing current $I_{WC1}$ is made to flow from the upper electrode 11 to the lower electrode 5a through the magnetization reference layer 1 and the magnetization free layer 3. Concurrently, a writing current $I_{WR1}$ is made to flow from the lower electrode 5b to the lower electrode 5a through the magnetization free layer 3. At this time, as described in the sixth embodiment (this figure shows the first example), when the writing current $I_{WR1}$ is made to flow in the −x direction in the plane of the magnetization free layer 3, due to the spin orbit interaction, a magnetic field $H_{IWR1}$ (the Rashba magnetic field) is applied to localized electrons in the −y direction. The localized electrons are electrons assuming magnetization of the magnetization free layer 3. The magnetic field $H_{IWR1}$ acts on the magnetization M1 of the magnetization free layer 3 in the +z direction so as to turn the magnetization M1 to the −y direction. In addition, when the writing current $I_{WC1}$ flows from the magnetization reference layer 1 to the magnetization free layer 3, conduction electrons flow from the magnetization free layer 3 to the magnetization reference layer 1. As a result, due to the spin torque, the magnetization M1 of the magnetization free layer 3 is transferred from parallel to anti-parallel with respect to the magnetization M0 of the magnetization reference layer 1. That is, the transition from the +z direction to the −z direction arises. At this time, since the Rashba magnetic field $H_{IWR1}$ assists the transition, the writing current $I_{WC1}$ lower than the conventional writing current makes the magnetization M1 of the magnetization free layer 3 in the +z direction inverted to the −z direction. That is, the data writing is performed from the state of the data "0" shown in FIG. 31 to the state of the data "1" shown in FIG. 32 as described later.

Figure 32:
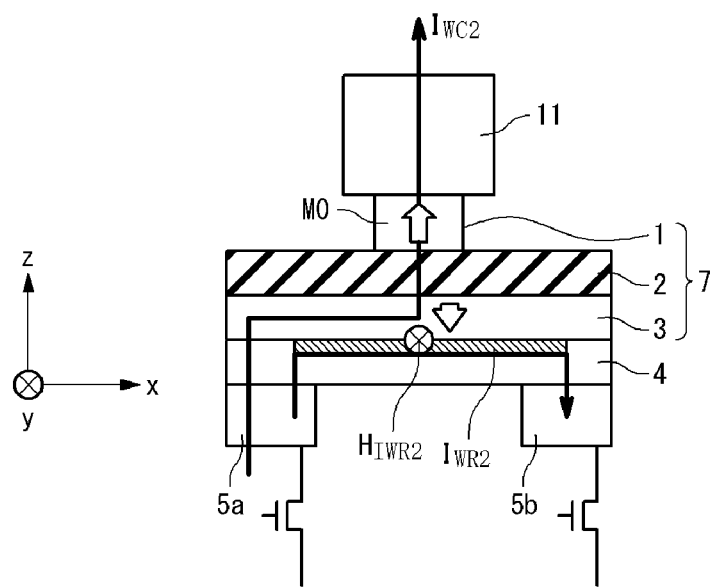
FIG. 32 is an elevation view showing the data writing method of the magnetic memory element according to the eighth embodiment of the present invention.

Next, the case that the data "0" is going to be written when the data "1" is stored in the magnetic memory element 9b will be described. FIG. 32 is an elevation view showing a data writing method of the magnetic memory element according to the eighth embodiment of the present invention. FIG. 32 show a situation that the operation of writing the data "0" is being performed when the data "1" is stored in the magnetic memory element 9b.

For writing the data "0" to the magnetic memory element 9b, first, a writing current $I_{WC2}$ is made to flow from the lower electrode 5a to the upper electrode 11 through the magnetization free layer 3 and the magnetization reference layer 1. Concurrently, a writing current $I_{WR2}$ is made to flow from the lower electrode 5a to the lower electrode 5b through the magnetization free layer 3. At this time, as described in the sixth embodiment (this figure shows the first example), when the writing current $I_{WR2}$ is made to flow in the −x direction in the plane of the magnetization free layer 3, due to the spin orbit interaction, the magnetic field $H_{IWR2}$ (the Rashba magnetic field) is applied to localized electrons in the +y direction. The localized electrons are electrons assuming magnetization of the magnetization free layer 3. The magnetic field $H_{IWR2}$ acts on the magnetization M1 of the magnetization free layer 3 in the −z direction so as to turn the magnetization M1 to the +y direction. In addition, when the writing current $I_{WC2}$ flows from the magnetization free layer 3 to the magnetization reference layer 1, conduction electrons flow from the magnetization reference layer 1 to the magnetization free layer 3. As a result, due to the spin torque, the magnetization M1 of the magnetization free layer 3 is transferred from anti-parallel to parallel with respect to the magnetization M0 of the magnetization reference layer 1. That is, the transition from the −z direction to the +z direction arises. At this time, since the Rashba magnetic field $H_{IWR2}$ assists the transition, the writing current $I_{WC2}$ lower than the conventional writing current makes the magnetization M1 of the magnetization free layer 3 in the −z direction inverted to the +z direction. That is, the data writing is performed from the state of the data "1" shown in FIG. 32 to the state of the data "0" shown in FIG. 31.

Incidentally, as easily understood from the above-mentioned data writing method, an overwriting operation can be performed, the overwriting operation being that the data "0" is going to be written when the data "0" is stored in the magnetic memory element 9b and the data "1" is going to be written when the data "1" is stored in the magnetic memory element 9b.

The data reading from the magnetic memory element 9b is the same as the sixth embodiment.

Figure 33:
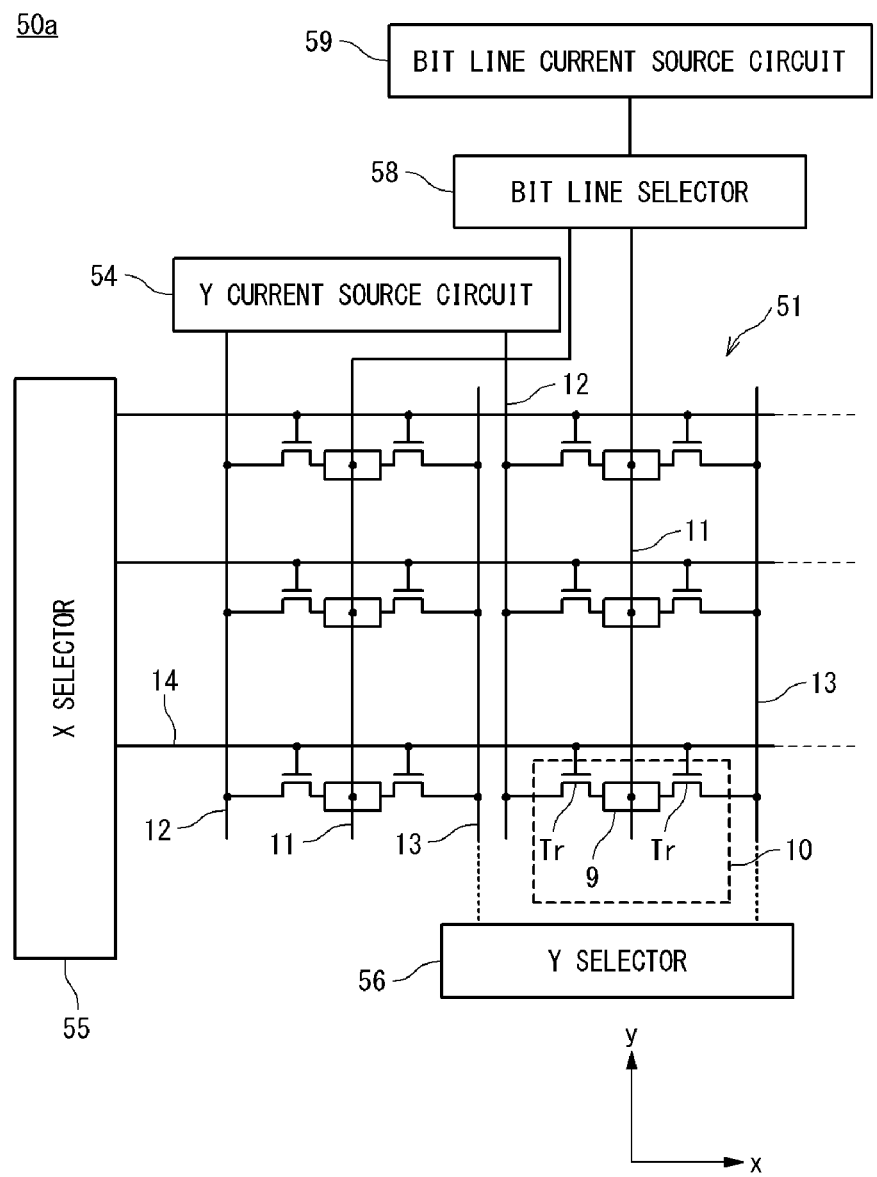
FIG. 33 is a block diagram showing an example of a configuration of a magnetic memory according to the eighth embodiment of the present invention.

FIG. 33 is a block diagram showing an example of a configuration of a magnetic memory according to the eighth embodiment of the present invention. The magnetic memory 50a includes a memory cell array 51, a X selector 55, a Y selector 56, a Y current source circuit 57, a bit line selector 58, and a bit line current source circuit 59. These elements are not limited to the above elements if these elements have functions similar to functions described later. Incidentally, the x and y directions of this figure may be opposite to those of FIGS. 30 to 32.

The memory cell array 51 includes a plurality of memory cells 10, a plurality of bit lines 11, a plurality of first writing lines 12, a plurality of second writing lines 13 and a plurality of word lines 14. The word line 14 is connected to the X selector 55 at one end, and is extended to the x direction. The bit line 11 is connected to the bit line selector 58 at one end, and is extended to the y direction. The first writing line 12 is connected to the Y current source circuit 57 at one end, and is extended to the y direction. The second writing line 13 is connected to the Y selector 56 at one end, and is extended to the y direction. The memory cell 10 includes a pair of selection transistors Tr and the magnetic memory element 9b. One of the selection transistors Tr is connected to the first writing line 12 at one of the source and drain, is connected to the lower electrode 5b of the magnetic memory element 9b at the other of the source and drain, and is connected to the word line 14 at the gate. The other of the selection transistors Tr is connected to the second writing line 13 at one of the source and drain, is connected to the lower electrode 5a of the magnetic memory element 9 at the other of the source and drain, and is connected to the word line 14 at the gate. The magnetization reference layer 1 of the magnetic memory element 9b is connected to the bit line 11 as the upper electrode.

The X selector 55 selects a selection word line 14 from the plurality of word lines 14 when the writing operation and reading operation are performed. The Y selector 56 selects a selection second writing line 13 from the plurality of second writing lines 13 when the writing operation and reading operation are performed. The Y current source circuit 57 supplies or draws the writing current $I_{WR}$ when the writing operation is performed. The bit line selector 58 selects a selection bit line 11 from the plurality of bit lines 11 when the writing operation and reading operation are performed. The bit line current source circuit 59 supplies or draws the writing current $I_{WC}$ when the writing operation is performed and supplies or draws the reading current $I_R$ when the reading operation is performed, through the bit line selector 58. The X selector 55, the Y selector 56, the Y current source circuit 57, the bit line selector 58 and the bit line current source circuit 59 are supposed to be a writing current control circuit which applies the writing current to the writing target memory cell 10.

This magnetic memory may be used for a single memory (a MRAM), or may be used for a memory section in a memory embedded microcomputer (a semiconductor device including the memory section and a logic section (not shown)).

Next, an operation of the magnetic memory according to the eighth embodiment of the present invention will be described. In the writing operation, first, the X selector 55 selects a selection word line 14. Accordingly, selection transistors Tr connected to the selection word line 14 at the gate are turned on. Next, the Y selector 56 selects a selection second writing line 13. Further, the bit line selector 58 selects a selection bit line 11. As a result, a writing cell 10 as a target memory cell 10 to which data is written is selected. Next, the Y current source circuit 57 selects a selection first writing line 12 corresponding to the writing cell 10, and performs supplying or drawing a writing current $I_{WR1}$ or $I_{WR2}$ on the writing cell 10. At this time, a current path is (the Y current source circuit 57—) the selection first writing line 12—the writing cell 10—the selection second writing line 13—the Y selector 56. Concurrently, the bit line current source circuit 59 performs supplying or drawing a writing current $I_{WC1}$ or $I_{WC2}$ through the bit line selector 58. At this time, a current path is (the bit line current source circuit 59—the bit line selector 58—) the selection bit line 11—the writing cell 10—the selection second writing line 13—the Y selector 56. Accordingly, by the action of the magnetization inversion due to the spin torque of the magnetization reference layer 1 of the writing cell 10 and the action of the effective magnetic field $H_{IWR1}$ or $H_{IWR2}$ due to applying the writing current $I_{WC1}$ or $I_{WC2}$ to the magnetization free layer 3, the magnetization of the magnetization free layer 3 of the selected writing cell 10 can be inverted.

In the present embodiment, the writing current $I_{WC1}$ or $I_{WC2}$ which assumes the magnetization inversion action based on the spin torque and the writing current $I_{WR1}$ or $I_{WR2}$ which assumes the spin orbit interaction action can be controlled separately. Therefore, by controlling the writing current $I_{WR1}$ or $I_{WR2}$ to be an appropriate value, the writing current $I_{WC1}$ or $I_{WC2}$ can be decreased further.

Next, a reading operation of the magnetic memory cell will be described. In the reading operation, the X selector 55 selects a selection word line 14. Accordingly, selection transistors Tr connected to the selection word line 14 at the gate are turned on. Next, the Y selector 56 selects a selection second writing line 13. Further, the bit line selector 58 selects a selection bit line 11. According to the above, a reading cell 10 as a target memory cell 10 from which data is read is selected. Next, the bit line current source circuit 59 performs supplying or drawing a reading current $I_R$ through the bit line selector 58. At this time, the current path is (the bit line current source circuit 59—the bit line selector 58—) the selection bit line 11—the reading cell 10—the selection second writing line 13—the Y selector 56. Accordingly, the reading current flows in the MTJ 7 of the reading cell 10. Consequently, for example, by using a sense amplifier (not shown here) connected to the Y selector 56 or the like, the resistance of the MTJ 7 is detected and the data is read.

In the present embodiment, the effects same as the sixth embodiment can be obtained. In addition, in the present embodiment, by separately controlling the writing current which assumes the magnetization inversion action based on the spin torque and the writing current which assumes the spin orbit interaction action, the total amount of the writing current can be decreased further.

(Ninth Embodiment)

The magnetic memory cell according to the ninth embodiment of the present invention will be described referring to the attached drawings.

The present embodiment is different from the eighth embodiment in the point that the magnetization reference layer 1 and the magnetization free layer 3 have in-plane magnetic anisotropy in the present invention while they have perpendicular magnetic anisotropy in the eighth embodiment. The different point from the eighth embodiment will be mainly described below.

Figure 34:
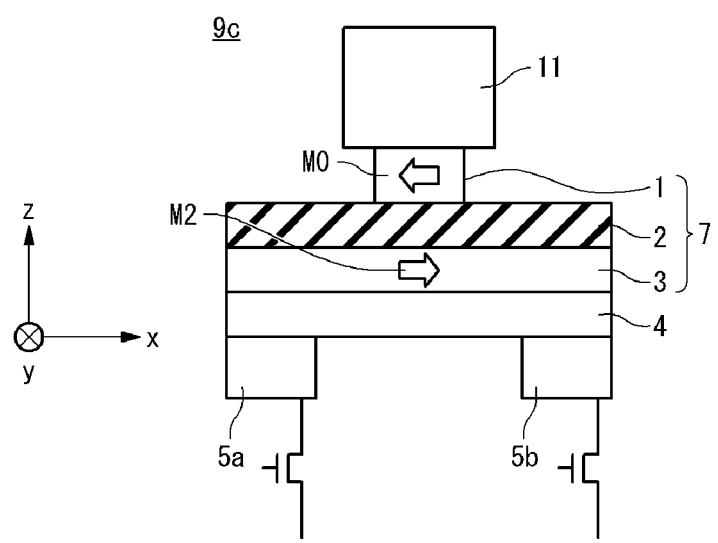
FIG. 34 is an elevation view showing a configuration of the magnetic memory element according to a ninth embodiment of the present invention.

First, a configuration of the magnetic memory element of the magnetic memory according to the ninth embodiment of the present invention will be described. FIG. 34 is an elevation view showing the configuration of the magnetic memory element according to the ninth embodiment of the present invention. The magnetic memory element 9c includes a base layer 4, a magnetization free layer 3, a barrier layer 2, a magnetization reference layer 1, an upper electrode 11 and lower electrodes 5a and 5b.

As described above, differently from the sixth embodiment, the magnetization reference layer 1 and the magnetization free layer 3 have in-plane magnetic anisotropy. That is, the magnetization free layer 3 is a ferromagnetic film with in-plane magnetic anisotropy. The magnetization free layer 3 has invertible magnetization M2. In the example of this figure, the magnetization free layer 3 can take the magnetization state of a −x direction and the magnetization state of a +x direction. The magnetization free layer 3 is exemplified by a NiFe film, a CoFe film, a CoFeB film and a lamination film thereof. On the other hand, the magnetization reference layer 1 is a ferromagnetic film with in-plane magnetic anisotropy. In the magnetization reference layer 1, magnetization M0 is fixed. In the example of this figure, the magnetization M0 is fixed in the −x direction. The magnetization reference layer 1 is exemplified by a NiFe film, a CoFe film, a CoFeB film and a lamination film thereof.

Other constitutive parts of the magnetization reference layer 1 and the magnetization free layer 3, configurations other than the above, and effects of them are similar to the sixth embodiment.

Other constitutive parts of the magnetization reference layer 1 and the magnetization free layer 3, configurations other than the above, and effects of them are similar to sixth embodiment.

In addition, the data reading from and data writing to the magnetic memory element of the magnetic memory, the configuration of the magnetic memory (FIG. 33), the operations of writing and reading the magnetic memory, and their effects are the same as the eighth embodiment.

In the present embodiment, the effects same as the eighth embodiment can be obtained.

According to the present invention, the magnetic memory can be provided, in which the introduction of the domain wall is not required and the writing current is small.

(Tenth Embodiment)

In the present embodiment, inversion of magnetization of a magnetization free layer of a magnetic tunnel junction (a MTJ) is performed by using a leakage magnetic field from a magnetic writing section, and the leakage magnetic field of the magnetic writing section is generated by using an effective magnetic field (the Rashba magnetic field: described later) based on the spin orbit interaction. Consequently, a writing current can be decreased.

Figure 35A:
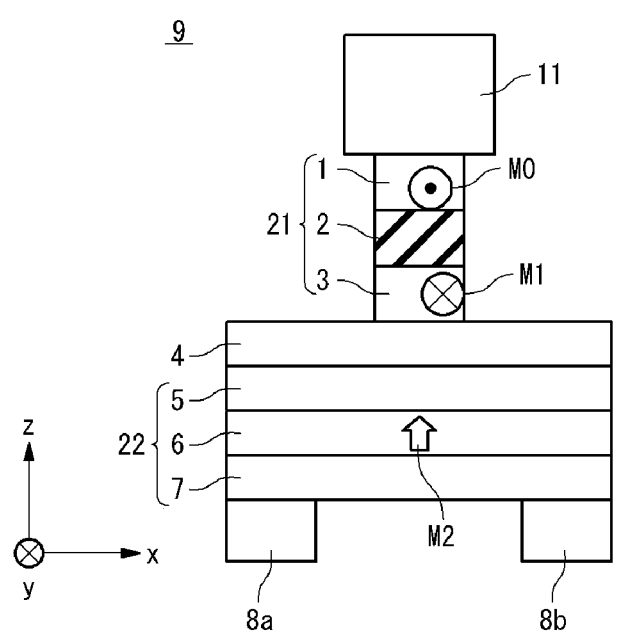
FIG. 35A is an elevation view showing a configuration of the magnetic memory element according to a tenth embodiment of the present invention.
Figure 35B:
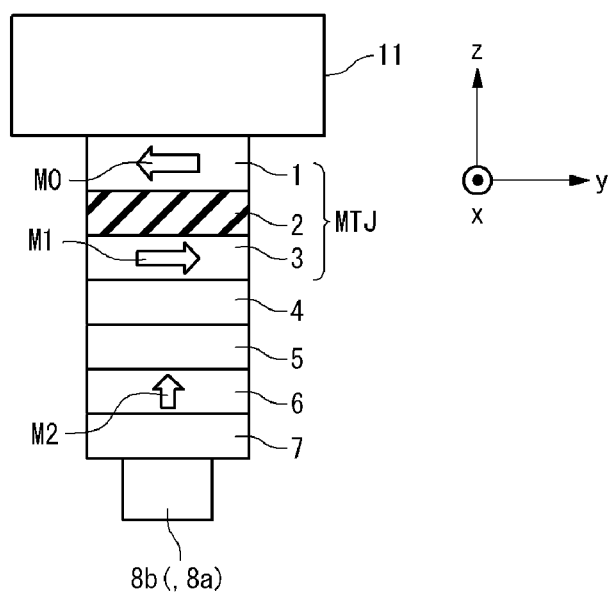
FIG. 35B is a side view showing the configuration of the magnetic memory element according to the tenth embodiment of the present invention.

First, a configuration of the magnetic memory element of the magnetic memory according to the tenth embodiment of the present invention will be described. FIGS. 35A to 35B are an elevation view and a side view showing the configuration of the magnetic memory element according to the tenth embodiment of the present invention. The magnetic memory element 9 includes a magnetic tunnel junction section 21, a magnetic writing section 22, an upper electrode 11 and lower electrodes 8a and 8b.

The magnetic tunnel junction section 21 stores data by using a magnetization direction. The magnetic tunnel junction section 21 includes a magnetization free layer 3, a barrier layer 2 and a magnetization reference layer 1. The magnetization free layer 3 has invertible magnetization M1. The barrier layer 2 is arranged on the magnetization free layer 3. The magnetization reference layer 1 is arranged on the barrier layer 2 and has a fixed magnetization M0. The magnetization free layer 3, the barrier layer 2 and the magnetization reference layer 1 constitute the MTJ (magnetic tunnel junction) 21. The magnetic tunnel junction section 21 stores data by using the relative relationship between a direction of the magnetization M1 of the magnetization free layer 3 and a direction of the magnetization M0 of the magnetization reference layer 1. The magnetization M1 of the magnetization free layer 3 is changed by the leakage magnetic field of the magnetic writing section 22. The detail will be described later.

The magnetic writing section 22 is arranged near the magnetic tunnel junction section 21. The magnetic writing section 22 generates the leakage magnetic field assuming the magnetization inversion of the magnetization free layer 3. The magnetic writing section 22 includes a seed layer 7, a magnetization writing layer 6 and a cap layer 5. The seed layer 7 is arranged in parallel with the surface (the xy plane) of the substrate (not shown). The magnetization writing layer 6 is arranged on the upper side (the +z side) of the seed layer 7 such that the seed layer 7 is covered with the magnetization writing layer 6. The cap layer 5 is arranged on the upper side (the +z side) of the magnetization writing layer 6 such that the magnetization writing layer 6 is covered with the cap layer 5. Here, the magnetic writing section 22 may include a base layer 4 as the base of the magnetic tunnel junction section 21 which is arranged on the upper side (the +z side) of the magnetic writing section 22. The base layer 4 is arranged on the upper side (the +z side) of the cap layer 5 such that the cap layer 5 is covered with the base layer 4.

Incidentally, in the magnetic tunnel junction section 21, the arrangement relationship of the upper side and lower side between the magnetization free layer 3 and the magnetization reference layer 1 may be opposite. In addition, the arrangement relationship of the upper side and lower side between the magnetic writing section 22 and the magnetic tunnel junction section 21 may be opposite.

The upper electrode 11 is connected to the magnetization reference layer 1. The upper electrode 11 is exemplified by a bit line. The lower electrode 8a is connected to the lower side (the −z side) of one side (the −x side) end of the seed layer 7, and the lower electrode 8b is connected to the lower side (the −z side) of the other side (the +x side) end of the seed layer 7. The lower electrodes 8a and 8b are connected to selection transistors Tr (not shown), respectively, and can apply a current to the magnetization writing layer 6 through the seed layer 7 from one of the lower electrodes 8a and 8b to the other.

The seed layer 7 is composed of material different from material of the cap layer 5 (or has a thickness different from a thickness of the cap layer 5) such that the Rashba magnetic field (described later) is made to be generated in the magnetization writing layer 6. In addition, since the seed layer 7 is arranged between the magnetization writing layer 6 and the lower electrodes 8a and 8b, the seed layer 7 is composed of a conductive film (e.g. a metallic film) such that a current can easily pass through. However, the seed layer 7 is preferably composed of material which can avoid a writing current from flowing not through the magnetization writing layer 6 but selectively through the seed layer 7. The seed layer 7 is exemplified by a Ta film, a Pt film, a Cr film, a Ti film and a lamination film thereof. If the seed layer 7 is thin enough, the seed layer 7 may be anon-conductive film (e.g. an insulating film) because the current can flow without any trouble.

The magnetization writing layer 6 is a ferromagnetic film with perpendicular magnetic anisotropy. The magnetization writing layer 6 has approximately uniform magnetization M2 whose direction is variable by the Rashba magnetic field. In the example of this figure, the magnetization writing layer 6 has the magnetization direction of approximately the +z direction, and the magnetization direction can be varied so as to have a component of the ±y direction. The magnetization writing layer 6 is magnetized approximately uniformly. That is, there is substantially no domain wall in the magnetization writing layer 6. The magnetization writing layer 6 is exemplified by a Co film, a Co/Ni lamination film, a Co/Pt lamination film, a CoFeB film, a FePt film, a CoPt system alloy film. The magnetization writing layer 6 is preferably very thin such that the Rashba magnetic field is made to be generated. For example, the magnetization writing layer 6 has preferably the film thickness from about 0.5 nm to about 1.5 nm. In the film thickness of less than 0.5 nm, it is hard to control a film formation. This film thickness is, as compared with a several nm (e.g. about 5 nm) of a magnetization free layer (or a free layer) in a usual MTJ, thin and a fraction of the several nm. Or, this film thickness is similar to a barrier layer in a usual MTJ.

The cap layer 5 is composed of material different from material of the seed layer 7 (or has a thickness different from a thickness of the seed layer 7) such that the Rashba magnetic field (described later) is made to be generated in the magnetization writing layer 6. When the seed layer 7 is a conductive film (e.g. a metallic film), the cap layer 5 is preferably a non-conductive film (e.g. an insulating film). The cap layer 5 is exemplified by an $Al_2O_3$ film, an MgO film and other oxides. When the seed layer 7 is a non-conductive film, the cap layer 5 is preferably a conductive film.

The magnetization free layer 3 is a ferromagnetic film with in-plane magnetic anisotropy. The magnetization free layer 3 has invertible magnetization M1. In the example of this figure, the magnetization free layer 3 takes the magnetization state of a +y direction and the magnetization state of a −y direction. The magnetization free layer 3 is exemplified by a NiFe film, a CoFe film, a CoFeB film, a NiFeCo film and a lamination film thereof. Methods that the magnetization easy axis of the magnetization free layer 3 is made to be in the y direction are a method using shape anisotropy, which is a method that a longitudinal axis of the magnetization free layer 3 is made to be in the y direction, a method using a crystal magnetic anisotropy, and a method using strain induced magnetic anisotropy. Here, it is not necessary that the direction of the magnetization easy axis is correctly the y direction. For example, the direction of the magnetization easy axis may have an angle of 45 degree with respect to the y axis in the in-plane direction.

The magnetization reference layer 1 is composed of a ferromagnetic film with in-plane magnetic anisotropy. In the magnetization reference layer 1, the magnetization M0 is fixed. In the example of this figure, the magnetization M0 is fixed in the −y direction. For material of the magnetization reference layer 1, material similar to that of the magnetization free layer 3 is used. In addition, by using anti-ferromagnetic material such as a PtMn film, an IrMn film, a FeMn film, a NiO film, the magnetization is made to be fixed. Furthermore, as the magnetization reference layer 1, a synthetic ferrimagnetic structure, in which magnetic layers such as CoFe films are laminated through a Ru film and so on, can be used. This synthetic ferrimagnetic structure is useful for reducing a leakage magnetic field from the magnetization reference layer 1. The magnetization reference layer 1 is exemplified by a NiFe film, a CoFe film, a CoFeB film, a NiFeCo film and a lamination film thereof.

The base layer 4 of the magnetization free layer 3 is exemplified by a Ta film. However, it is not necessary to provide the base layer 4. In addition, a metallic film may be provided between the upper electrode 11 and the magnetic tunnel junction section 21 if it's necessary.

The magnetic memory element 9 has a configuration that the upper side boundary and the lower side boundary of the magnetization writing layer 6 are different from each other. In the example of this figure, the seed layer 7 is joined to the boundary of the lower side (the −z side) of the magnetization writing layer 6, and the cap layer 5 composed of material different from material of the seed layer 7 is joined to the boundary of the upper side (the +z side) of the magnetization writing layer 6. That is, in the magnetization writing layer 6, the space symmetry is broken with respect to the z direction. In this case, when a current is made to flow in the in-plane direction (e.g. the x direction) in the magnetization writing layer 6, based on the spin orbit interaction, an effective magnetic field is applied to localized electrons in the direction, the y direction, of a cross product of the direction (the x direction) of the current and the direction (the z direction) where the space symmetry is broken. The localized electrons are electrons assuming magnetization of the magnetization writing layer 6. This effective magnetic field is called the Rashba magnetic field.

In the present embodiment, by using this Rashba magnetic field, the magnetization direction of the magnetization writing layer 6 is made to be varied and the magnetization of the magnetization free layer 3 is made to be inverted. That is, the data writing is performed on the magnetic tunnel junction section 21. Therefore, the current flowing in the magnetization writing layer 6 is the writing current. This effect generating the effective magnetic field can be improved by using an oxide for one of the seed layer 7 and the cap layer 5. For example, it is known that, in the configuration of the seed layer 7, the magnetization writing layer 6 and the cap layer 5=a Pt film, a Co film and an AlOx film, the effective magnetic field based on the spin orbit interaction is as large as kOe order per the writing current $10^8$ A/cm$^2$. Therefore, the writing current can be reduced.

Data reading and data writing of the magnetic memory element of the magnetic memory according to the present embodiment will be described below. Here, for descriptive purposes, it is supposed that the magnetization M0 of the magnetization reference layer 1 is fixed in the −y direction. In addition, it is supposed that when the magnetization M1 of the magnetization free layer 3 of the magnetic tunnel junction section 21 is in the −y direction, that is the magnetization M0 of the magnetization reference layer 1 and the magnetization M1 of the magnetization free layer 3 are parallel (low resistance), the data "0" is stored. Furthermore, it is supposed that when the magnetization M1 of the magnetization free layer 3 is in the +y direction, that is the magnetization M0 of the magnetization reference layer 1 and the magnetization M1 of the magnetization free layer 3 are anti-parallel (high resistance), the data "1" is stored.

The data writing to the magnetic memory element 9 will be described.

Figure 36A:
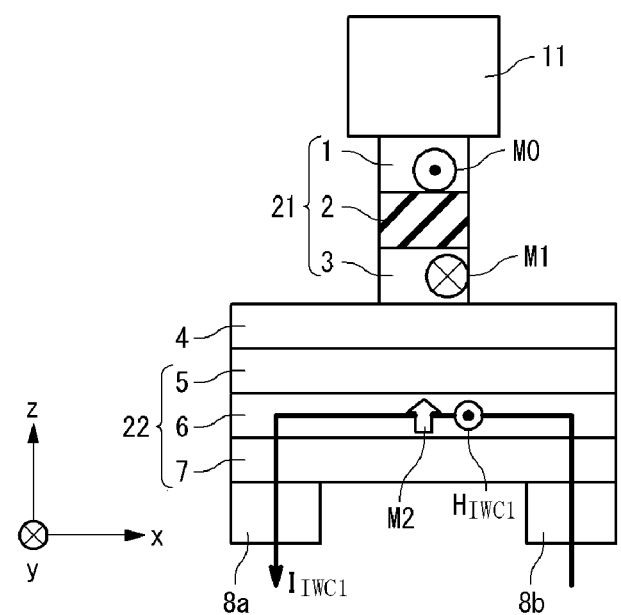
FIG. 36A is an elevation view showing a data writing method of the magnetic memory element according to the tenth embodiment of the present invention.
Figure 36B:
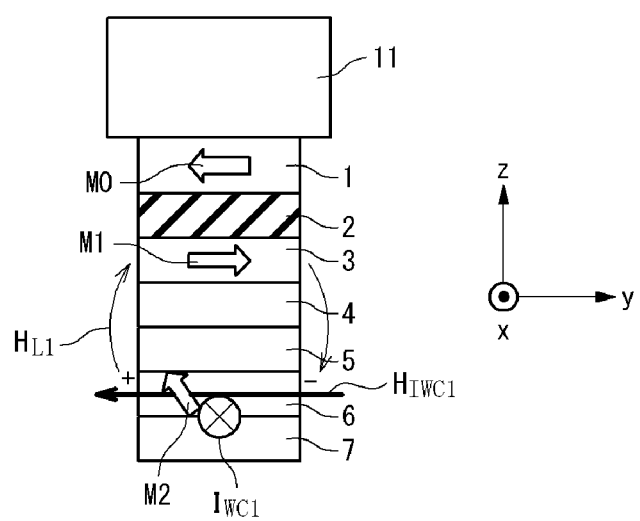
FIG. 36B is a side view showing the data writing method of the magnetic memory element according to the tenth embodiment of the present invention.

First, the case that the data "1" is going to be written in the magnetic memory element 9 will be described. FIGS. 36A and 36B are an elevation view and a side view showing a data writing method of the magnetic memory element according to the tenth embodiment of the present invention. FIGS. 36A and 36B show a situation after the operation of writing the data "1" is being performed.

For writing the data "1" to the magnetic memory element 9, first, a writing current $I_{WC1}$ is made to flow from the lower electrode 8b to the lower electrode 8a through the magnetization writing layer 6 in the −x direction. At this time, as described above, the boundary at the lower side (the −z side) of the magnetization writing layer 6 is joined to the seed layer 7 and the boundary at the upper side (the +z direction) is joined to the cap layer 5. Therefore, the boundaries at the both sides of the magnetization writing layer 6 have the different structures. That is, in the magnetization writing layer 6, the space symmetry is broken with respect to the z direction. Accordingly, when the writing current $I_{WC1}$ is made to flow in the −x direction in the plane of the magnetization writing layer 6, due to the spin orbit interaction, a magnetic field $H_{IWC1}$ (the Rashba magnetic field) is applied to localized electrons in the direction (the y direction) of a cross product of the direction (the x direction) of the writing current $I_{WC1}$ and the direction (the z direction) where the space symmetry is broken. The localized electrons are electrons assuming magnetization of the magnetization writing layer 6. For example, in the case that the seed layer 7, the magnetization writing layer 6 and the cap layer 5 are Pt, Co and AlOx and the writing current $I_{WC1}$ is made to flow in the −x direction, the magnetic field $H_{IWC1}$ (the Rashba magnetic field) is generated in the +y direction. However, whether the direction is the −y direction or the +y direction depends on material. The example of this figure shows that the magnetic field $H_{IWC1}$ (the Rashba magnetic field) is generated in the −y direction. The magnetic field $H_{IWC1}$ acts on the magnetization M2 of the magnetization writing layer 6 in the +z direction so as to turn the magnetization M2 to the −y direction. As a result, the magnetization M2 of the magnetization writing layer 6 in the +z direction is inclined to the −y direction (has a component of the −y direction). Accordingly, a magnetic pole (+) in generated at the side in the −y direction of the magnetization writing layer 6. By a leakage magnetic field $H_{L1}$ based on this magnetic pole, that is, a static magnetic coupling between this magnetic pole and the magnetization M1 of the magnetization free layer 3, the magnetization M1 of the magnetization free layer 3 having the magnetization easy axis in the y direction can be inverted. In this way, the data writing is performed as the state of the data "1" shown in FIGS. 36A and 36B.

Figure 37A:
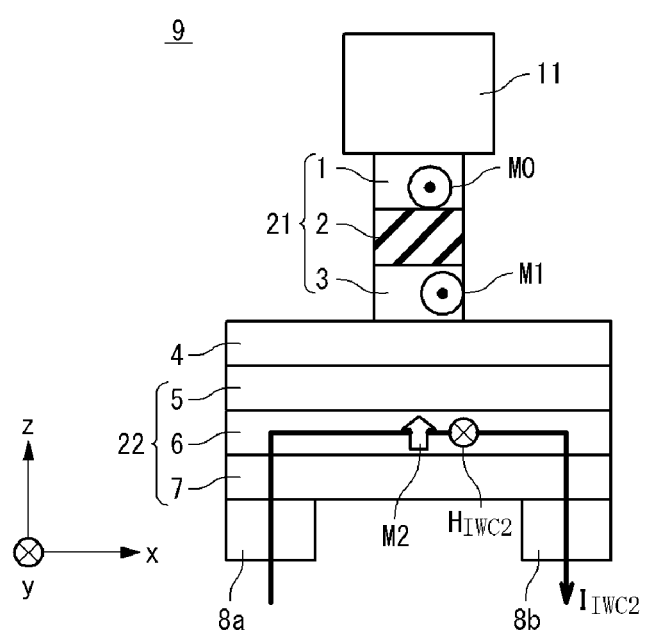
FIG. 37A is an elevation view showing the data writing method of the magnetic memory element according to the tenth embodiment of the present invention.
Figure 37B:
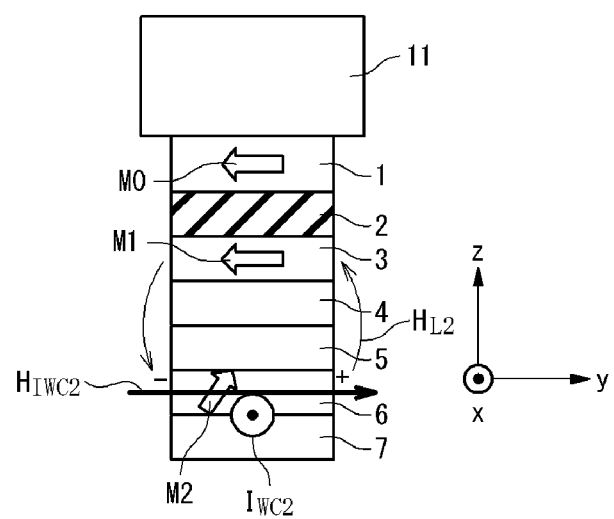
FIG. 37B is a side view showing the data writing method of the magnetic memory element according to the tenth embodiment of the present invention.

Next, the case that the data "0" is going to be written in the magnetic memory element 9 will be described. FIGS. 37A and 37B are an elevation view and a side view showing a data writing method of the magnetic memory element according to the tenth embodiment of the present invention. FIGS. 37A and 37B show a situation after the operation of writing the data "0" is being performed in the magnetic memory element 9.

For writing the data "0" to the magnetic memory element 9, first, the writing current $I_{WC2}$ is made to flow from the lower electrode 8b to the lower electrode 8a through the magnetization writing layer 6 in the +x direction. At this time, as described above (this figure shows the example that the magnetic field $H_{IWC1}$ is generated in the −y direction), due to the spin orbit interaction, the magnetic field $H_{IWC2}$ (the Rashba magnetic field) is applied to localized electrons in the +y direction. The localized electrons are electrons assuming magnetization of the magnetization writing layer 6. The magnetic field $H_{IWC2}$ acts on the magnetization M2 of the magnetization writing layer 6 in the +z direction so as to turn the magnetization M2 to the +y direction. As a result, the magnetization M2 of the magnetization writing layer 6 in the +z direction is inclined to the +y direction (has a component of the +y direction). Accordingly, a magnetic pole (+) in generated at the side in the +y direction of the magnetization writing layer 6. By a leakage magnetic field $H_{L2}$ based on this magnetic pole, that is, a static magnetic coupling between this magnetic pole and the magnetization M1 of the magnetization free layer 3, the magnetization M1 of the magnetization free layer 3 having the magnetization easy axis in the y direction can be inverted. In this way, the data writing is performed as the state of the data "0" shown in FIGS. 37A and 37B.

Incidentally, as easily understood from the above-mentioned data writing method, an overwriting operation can be performed, the overwriting operation being that the data "0" is going to be written when the data "0" is stored in the magnetic memory element 9 and the data "1" is going to be written when the data "1" is stored in the magnetic memory element 9. In addition, the relationship between the direction of the current $I_{WC}$ and the inclined direction of the magnetization M2 depends on the selection of material of the seed layer 7 and material of the cap layer 5.

Next, the data reading from the magnetic memory element 9 will be described. The data reading method is the same as the usual reading method for the magnetic tunnel junction section 21 (MTJ) including the magnetization free layer 3, the barrier layer 2 and the magnetization reference layer 1. For example, a reading current with a constant current value is made to flow between the upper electrode 11 and the lower electrode 8a, that is, in the magnetic tunnel junction section 21. Then, by comparing a reference voltage with a voltage between the upper electrode 11 and the lower electrode 8a generated by the reading current, the magnetoresistance value of the magnetic tunnel junction section 21, that is, the data as the direction of the magnetization of the magnetization free layer 3 is read.

Incidentally, a plane shape of the magnetization writing layer 6 may be not only a rectangle, but also an ellipse, an oval and a shape that a part of each of the rectangle, the ellipse and the oval in their longitudinal direction is concaved. In this regard, the magnetization direction of the magnetization writing layer 6 does not completely point to one direction homogeneously. However, since there is no clear domain wall in the magnetization writing layer 6, the present embodiment is described that the magnetization writing layer 6 is homogeneously magnetized.

Figure 38:
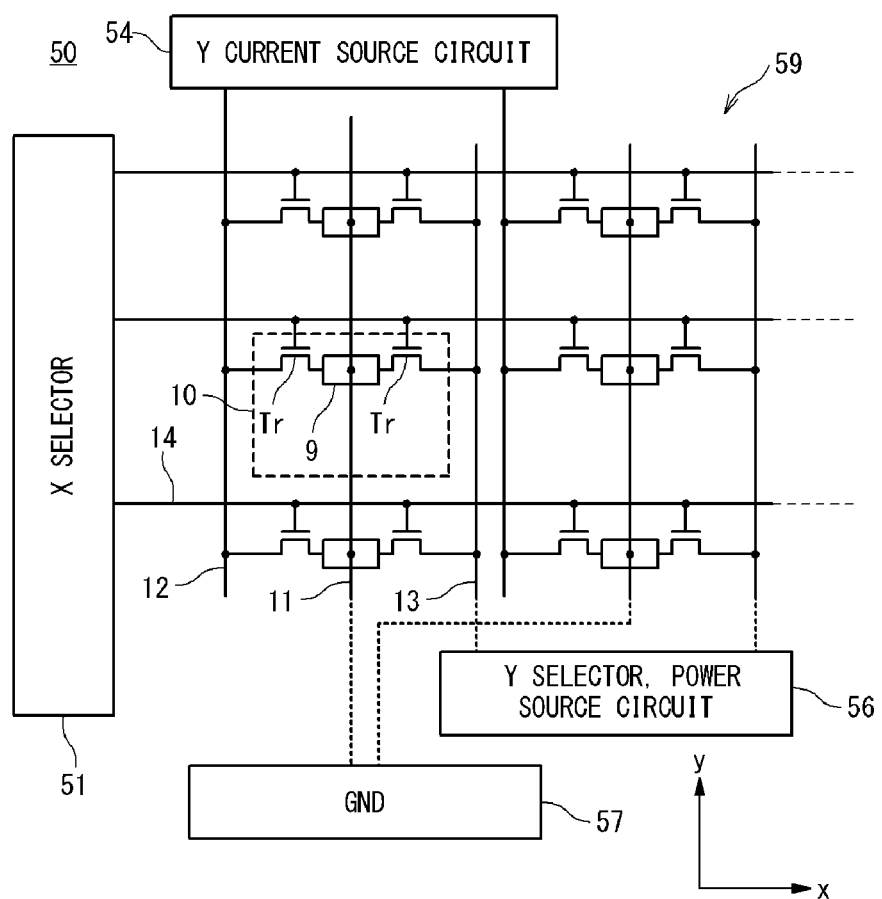
FIG. 38 is a block diagram showing an example of a configuration of a magnetic memory according to the tenth embodiment of the present invention.

FIG. 38 is a block diagram showing an example of a configuration of a magnetic memory according to the tenth embodiment of the present invention. The magnetic memory 50 includes a memory cell array 59, a X selector 51, a Y current source circuit 54, a Y selector and power source circuit 56 and a GND (ground) 57. These elements are not limited to the above elements if these elements have functions similar to functions described later.

The memory cell array 59 includes a plurality of memory cells 10, a plurality of bit lines 11, a plurality of first writing lines 12, a plurality of second writing lines 13 and a plurality of word lines 14. The word line 14 is connected to the X selector 51 at one end, and is extended to the x direction. The bit line 11 is connected to the GND (ground) 57 at one end, and is extended to the y direction. The first writing line 12 is connected to the Y current source circuit 54 at one end, and is extended to the y direction. The second writing line 13 is connected to the Y selector and power source circuit 56 at one end, and is extended to the y direction. The plurality of memory cells 10 is arranged in a matrix shape correspondingly to intersections between the plurality of word lines 14 and the plurality of bit lines 11. The memory cell 10 includes two selection transistors Tr and the magnetic memory element 9. One of the selection transistors Tr is connected to the first writing line 12 at one of the source and drain, is connected to the lower electrode 8a of the magnetic memory element 9 at the other of the source and drain, and is connected to the word line 14 at the gate. The other of the selection transistors Tr is connected to the second writing line 13 at one of the source and drain, is connected to the lower electrode 8b of the magnetic memory element 9 at the other of the source and drain, and is connected to the word line 14 at the gate. The magnetization reference layer 1 of the magnetic memory element 9 is connected to the bit line 11 as the upper electrode.

The X selector 51 selects a selection word line 14 from the plurality of word lines 14 when the writing operation and reading operation are performed. The Y selector and power source circuit 56 selects a selection second writing line 13 from the plurality of second writing lines 13, performs supplying the writing current $I_{WC1}$ when the writing operation is performed, and performs supplying or drawing the reading current $I_R$ when the reading operation is performed. The Y current source circuit 54 selects a selection first writing line 12 from the plurality of first writing lines 12 and supplies the writing current $I_{WC2}$ when the writing operation is performed. The X selector 51, the Y current source circuit 54, the Y selector and power source circuit 56 (, and the GND (ground) 57) are supposed to be a writing current control circuit which applies the writing current to the writing target memory cell 10.

This magnetic memory may be used for a single memory (a MRAM), or may be used for a memory section in a memory embedded microcomputer (a semiconductor device including the memory section and a logic section (not shown)).

Next, an operation of the magnetic memory according to the tenth embodiment of the present invention will be described. In the writing operation, first, the X selector 51 selects a selection word line 14. Accordingly, selection transistors Tr connected to the selection word line 14 at the gate are turned on. Next, the Y selector and power source circuit 56 selects a selection second writing line 13. Further, the Y current source circuit 54 selects a selection first writing line 11. As a result, a writing cell 10 as a target memory cell 10 to which data is written is selected. Next, the Y selector and power source circuit 56 performs supplying a writing current $I_{WC1}$ to the writing cell 10. Or, the Y current source circuit 54 performs supplying a writing current $I_{WC2}$ to the writing cell 10. At this time, a current path is the Y selector and power source circuit 56—the selection second writing line 13—the writing cell 10—the selection first writing line 12—the Y current source circuit 54. Accordingly, the writing current $I_{WC1}$ or the writing current $I_{WC2}$ is applied to a magnetization writing layer 6 of the writing cell 10 and the effective magnetic field $H_{IWC1}$ or the effective magnetic field $H_{IWC2}$ is applied to the magnetization writing layer 6. Then, the magnetization of the magnetization free layer 3 of the selected writing cell 10 can be inverted by the leakage magnetic field $H_{L1}$ or $H_{L2}$ of the magnetization writing layer 6 based on these. In the present circuit configuration, there is no half selection problem.

Next, a reading operation of the magnetic memory cell will be described. In the reading operation, the X selector 51 selects a selection word line 14. Accordingly, a selection transistor Tr connected to the selection word line 14 at the gate is turned on. Next, the Y selector and power source circuit 56 selects a selection second writing line 13. According to the above, a reading cell 10 as a target memory cell 10 from which data is read is selected. The Y selector and power source circuit 56 performs supplying or drawing a reading current $I_R$. At this time, the current path is the Y selector and power source circuit 56—the selection second writing line 13—the reading cell 10—the selection bit line 11—the GND (ground). Accordingly, the reading current flows in the magnetic tunnel junction section 21 of the reading cell 10. Consequently, for example, by using a sense amplifier (not shown here) connected to the Y selector and power source circuit 56 or the like, the resistance of the magnetic tunnel junction 21 is detected and the data is read.

Figure 39:
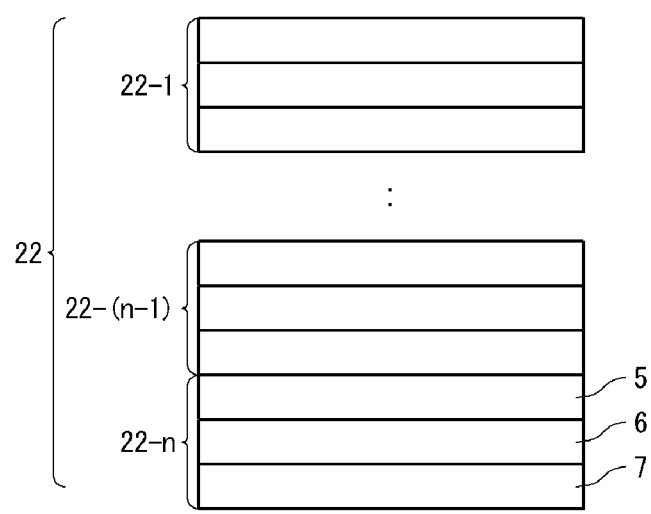
FIG. 39 is a partial side view showing a modification example of the configuration of the magnetic memory element according to the tenth embodiment of the present invention.

An modification example of the magnetic memory element according to the present embodiment will be described. FIG. 39 is a partial side view showing a modification example of the configuration of the magnetic memory element according to the tenth embodiment of the present invention. This figure shows only the magnetic writing section 22 in the magnetic memory element 9. The magnetic writing section 22 includes a plurality of magnetic writing sections 22-1, ..., 22-(n−1), 22-n (n is a natural number). Each magnetic writing section 22-i (i=1 to n) includes a seed layer 7, a magnetization writing layer 6 and a cap layer 5. In this way, since the magnetic writing section 22 has a configuration in which the seed layer, the magnetization writing layer and the cap layer are laminated plural times, the magnetic moment of the magnetic writing section 22 is increased. Therefore, the total amount of the leakage magnetic field when the Rashba magnetic field works is increased. As a result, the magnetization free layer 3 can be easily inverted.

The principle of the present invention, that is, the magnetization variation of the magnetization writing layer 6 based on the spin orbit interaction is used for magnetization inversion of the magnetization free layer 3, is applied to not only the one-axis writing method mentioned above but also the two-axis writing method and the spin injection writing method as the auxiliary magnetic field. For example, by providing two magnetic writing section 22 above and below the MTJ, the two-axis writing method with a low current can be realized. In addition, the coupling between the magnetization writing layer 6 and the magnetization free layer 3 is not limited to the static magnetic described above, for example, also, a ferromagnetic coupling can be used.

According to the present invention, the magnetic memory in which the introduction of the domain wall is not required and the writing current is small can be provided.

The configuration of the sixth to ninth embodiments can be described as the followings. However, the sixth to ninth embodiments are not limited to the following examples.
(1) A magnetic memory including:
  a base layer;
  a magnetization free layer, with which the base layer is covered, configured to have invertible magnetization and be magnetized approximately uniformly;
  a barrier layer, with which the magnetization free layer is covered, configured to be composed of material different from material of the base layer; and
  a magnetization reference layer configured to be arranged on an end of the barrier layer corresponding to one end of the magnetization fee layer and have fixed magnetization,
  wherein when the magnetization of the magnetization free layer is inverted, a first writing current is made to flow from the one end to the other end of the magnetization free layer in an in-plane direction through the magnetization reference layer.
(2) The magnetic memory according to the above (1), further including:
  a first electrode configured to be arranged at an end of the base layer corresponding to the other end of the magnetization free layer,
  wherein the first writing current flows through the magnetization free layer in in-plane direction from one of the magnetization reference layer and the first electrode to the other.
(3) The magnetic memory according to the above (2), wherein the magnetization reference layer and the magnetization free layer have perpendicular magnetic anisotropy.
(4) The magnetic memory according to the above (2), wherein the magnetization reference layer and the magnetization free layer have in-plane magnetic anisotropy,
  wherein a cross product of a vector in a film thickness direction of the magnetization free layer and a vector in a direction of the first writing current has a component parallel with a magnetization direction of the magnetization free layer.
(5) The magnetic memory according to the above (1), further including:
  a first and second electrodes configured to be arranged at one end and the other end of the base layer corresponding to the one end and the other end of the magnetization free layer,
  wherein when the magnetization of the magnetization free layer is inverted, in addition to the first writing current, a second writing current is made to flow from one of the first and second electrodes to the other.
(6) The magnetic memory according to the above (5), wherein the magnetization reference layer and the magnetization free layer have perpendicular magnetic anisotropy.
(7) The magnetic memory according to the above (5), wherein the magnetization reference layer and the magnetization free layer have in-plane magnetic anisotropy,
  wherein a cross product of a vector in a film thickness direction of the magnetization free layer and a vector in a direction of the first writing current has a component parallel with a magnetization direction of the magnetization free layer.

The configuration of the tenth embodiment can be described as the followings. However, the tenth embodiment is not limited to the following examples.
(1) A magnetic memory including:
  a magnetic tunnel junction section; and
  a magnetic writing section configured to be arranged near the magnetic tunnel junction section,
  wherein the magnetic tunnel junction section includes:
  a magnetization free layer configured to have invertible magnetization,
  a barrier layer configured to be arranged on the magnetization free layer, and
  a magnetization reference layer configured to be arranged on the barrier layer and have fixed magnetization,
  wherein the magnetic writing section includes:
  a seed layer,
  a magnetization writing layer, with which the seed layer is covered, configured to be magnetized approximately uniformly, and
  a cap layer, with which the magnetization writing layer is covered, configured to be composed of material different from material of the seed layer,
  wherein when the magnetization of the magnetization free layer is inverted, a writing current is made to flow from one end to the other end of the magnetization writing layer in an in-plane direction.
(2) The magnetic memory according to the above (1), further including:
  a first and second electrodes configured to be arranged at both end of the seed layer,
  wherein the writing current flows from one of the first and second electrodes to the other.
(3) The magnetic memory according to the above (1) or (2), wherein the magnetization free layer and the magnetization reference layer have in-plane magnetic anisotropy, and
  wherein the magnetization writing layer has perpendicular magnetic anisotropy.
(4) The magnetic memory according to the above (3), wherein the magnetization free layer and the magnetization writing layer are magnetically coupled, and
  wherein the magnetization of the magnetization free layer is invertible by a leakage magnetic field from the magnetization writing layer.
(5) The magnetic memory according to the one of above (1) to (4), wherein one of the seed layer and the cap layer includes metallic material and the other includes oxide.

(6) The magnetic memory according to the one of above (1) to (5), wherein in the magnetic writing section, the seed layer, the magnetization writing layer and the cap layer are laminated plural times.

This magnetic memory is exemplified by a magnetic random access memory (a MRAM), and may be used for not only a single memory (a MRAM) but also a memory embedded microcomputer (a semiconductor device including the memory section and a logic section (not shown)) and so on.

Although the present invention has been described above in connection with several embodiments thereof, it would be apparent to those skilled in the art that those embodiments are provided solely for illustrating the present invention, and should not be relied upon to construe the appended claims in a limiting sense.

The present invention is not limited to the above-mentioned respective embodiments. It would be apparent that the respective embodiments may be modified and changed without departing from the spirit and scope of the present invention. In addition, the techniques described in the respective embodiments may be applied to the other embodiments if a technical contradiction does not occur.

This application is based upon and claims the benefit of priority from Japanese patent application No. 2011-061930 filed on Mar. 22, 2011, Japanese patent application No. 2011-061939 filed on Mar. 22, 2011 and Japanese patent application No. 2011-076361 filed on Mar. 30, 2011, the disclosure of which is incorporated herein in its entirety by reference.

The invention claimed is:

1. A magnetic memory comprising:
   a base layer;
   a magnetization free layer, with which the base layer is covered, configured to have invertible magnetization and be magnetized approximately uniformly;
   a barrier layer, with which the magnetization free layer is covered, configured to be composed of material different from material of the base layer; and
   a magnetization reference layer configured to be arranged on the barrier layer and have fixed magnetization,
   wherein when the magnetization of the magnetization free layer is inverted, a first writing current is made to flow from one end to the other end of the magnetization free layer in an in-plane direction without flowing through the magnetization reference layer.

2. The magnetic memory according to claim 1, further comprising:
   a first and second electrodes configured to be arranged at both ends of the base layer,
   wherein the first writing current flows from one of the first and second electrodes to the other of the first and second electrodes.

3. The magnetic memory according to claim 1, further comprising:
   a wiring line configured to be arranged near the magnetization free layer,
   wherein when the magnetization of the magnetization free layer is inverted, further, a current induced magnetic field is made to be generated near the magnetization free layer by using a second writing current flowing in the wiring line.

4. The magnetic memory according to claim 3, wherein the magnetization free layer has perpendicular magnetic anisotropy, and
   wherein the wiring line is arranged at a position shifted from a position above the magnetization free layer.

5. The magnetic memory according to claim 3, wherein the magnetization free layer has in-plane magnetic anisotropy, and
   wherein the wiring line is arranged at a position above the magnetization free layer.

6. The magnetic memory according to claim 1, wherein the magnetization free layer has in-plane magnetic anisotropy, and
   wherein a cross product of a vector in a film thickness direction of the magnetization free layer and a vector in a flow direction of the first writing current has a component parallel to a direction of the magnetization of the magnetization free layer.

7. The magnetic memory according to claim 1, wherein the magnetization free layer has perpendicular magnetic anisotropy, and
   wherein the magnetization free layer has a shape such that the first writing current is inhomogeneously-distributed in the magnetization free layer.

8. The magnetic memory according to claim 1, wherein the magnetization free layer has perpendicular magnetic anisotropy, and
   wherein the magnetization free layer has an region where inversion nucleation easily arises in a part of the magnetization free layer.

9. The magnetic memory according to claim 2, wherein the first and second electrodes are asymmetric with respect to the magnetization free layer.

10. The magnetic memory according to claim 1, wherein, in the magnetization free layer, a magnetization easy axis is pointed toward an intermediate between perpendicular and in-plane with respect to a film surface of the magnetization free layer.

11. The magnetic memory according to claim 10, wherein the magnetization free layer is a lamination layer film in which a perpendicular anisotropy material film and an in-plane anisotropy material film are laminated.

12. The magnetic memory according to claim 1, wherein the magnetization free layer is formed adjacent to the base layer.

13. The magnetic memory according to claim 1, wherein the magnetization free layer is formed directly between the base layer and the barrier layer.

14. The magnetic memory according to claim 1, wherein the magnetization free layer is formed directly on the base layer, the barrier layer is formed directly on the barrier layer.

* * * * *